(12) United States Patent
Sun et al.

(10) Patent No.: US 11,876,528 B2
(45) Date of Patent: Jan. 16, 2024

(54) ANALOG-TO-DIGITAL CONVERSION CIRCUIT

(71) Applicant: Tsinghua University, Beijing (CN)

(72) Inventors: Nan Sun, Beijing (CN); Yi Zhong, Beijing (CN); Jiaxin Liu, Beijing (CN)

(73) Assignee: Tsinghua University, Beijing (CN)

( * ) Notice: Subject to any disclaimer, the term of this patent is extended or adjusted under 35 U.S.C. 154(b) by 64 days.

(21) Appl. No.: 17/513,016

(22) Filed: Oct. 28, 2021

(65) Prior Publication Data

US 2022/0149862 A1 May 12, 2022

(30) Foreign Application Priority Data

Nov. 6, 2020 (CN) .......................... 202011233397.0

(51) Int. Cl.
*H03M 1/00* (2006.01)
*H03M 1/46* (2006.01)
*H03M 1/12* (2006.01)

(52) U.S. Cl.
CPC ......... *H03M 1/466* (2013.01); *H03M 1/1245* (2013.01)

(58) Field of Classification Search
CPC .............................. H03M 1/466; H03M 1/1245
USPC .................................. 341/155, 159, 161, 122
See application file for complete search history.

(56) References Cited

U.S. PATENT DOCUMENTS

| 6,304,208 | B1* | 10/2001 | Nagashima | H03M 1/0607 341/172 |
| 6,433,727 | B1* | 8/2002 | Yoshinaga | H03M 1/002 341/172 |
| 7,830,159 | B1* | 11/2010 | Lee | G01R 27/2605 341/120 |
| 2010/0103009 | A1* | 4/2010 | Imai | H03M 1/0658 341/122 |
| 2015/0229321 | A1* | 8/2015 | Lin | H03M 1/129 341/158 |

* cited by examiner

*Primary Examiner* — Peguy Jean Pierre
(74) *Attorney, Agent, or Firm* — Artegis Law Group, LLP

(57) ABSTRACT

The present disclosure relates to an analog-to-digital conversion circuit comprising: N sampling and conversion modules connected in parallel, configured to simultaneously sample and sequentially convert first analog signals of N channels to output second analog signals, wherein each of the sampling and conversion modules includes a plurality of sampling capacitors connected in parallel, wherein N is an integer greater than 1; a comparator connected to the N sampling and conversion modules, configured to comparing the second analog signals respectively to obtain comparison signals; and a control module connected to the N sampling and conversion modules and the comparator, configured to control the N sampling and conversion modules to output converted digital signals based on the comparison signals.

28 Claims, 15 Drawing Sheets

ANALOG-TO-DIGITAL CONVERSION CIRCUIT

CROSS-REFERENCE TO RELATED APPLICATION

This application claims priority to Chinese Application No. 202011233397.0, filed on Nov. 6, 2020, the contents of which is incorporated herein by reference in its entirety.

TECHNICAL FIELD

The present disclosure relates to the technical field of integrated circuits, and in particular to an analog-to-digital conversion circuit.

BACKGROUND

An analog-to-digital converter (ADC) is a key component interfacing an analog system with a digital system, which can achieve conversion from analog signals to digital signals. A successive approximation register (SAR) analog-to-digital converter is a high-speed and high-precision ADC structure, which is widely used in the fields of Internet of Things, wearable devices, implantable medical electronics, and the like.

A successive approximation register analog-to-digital converter (SAR ADC) includes a sample-and-hold circuit, a digital-to-analog converter (DAC), a comparator (COMP), a successive approximation logic circuit, and the like. The SAR ADC employs a binary search algorithm to obtain a final conversion result after a plurality of conversion cycles. The SAR ADC determines a digital output code for each of the conversion cycles by comparing an analog input collected by the sample-and-hold circuit with a feedback value on the digital-to-analog converter to adjust and change the feedback value on the DAC using the output code so as to make the feedback value approximate the analog input value.

As shown in FIG. 1, in certain application scenarios, the SAR ADC includes N sampling channels. In order to obtain information of signals of N channels at the same instant of time, it is necessary to acquire and convert values of N analog inputs $Vin_1$-$Vin_N$ at the same instant of time to finally obtain the corresponding N digital outputs $Dout_1$-$Dout_N$. The existing technical solutions are either complex in structure and high in cost, or simple in structure but lack of energy efficiency, which affects the effect of analog-to-digital conversion. Therefore, there is a need for a new analog-to-digital conversion circuit to improve energy efficiency of the successive approximation register analog-to-digital converter.

SUMMARY

In view of this, the present disclosure provides an analog-to-digital conversion circuit capable of improving energy efficiency of the analog-to digital conversion circuit at a smaller circuit cost.

According to an aspect of the present disclosure, there is provided an analog-to-digital conversion circuit, including: N sampling and conversion modules connected in parallel, configured to simultaneously sample and sequentially convert first analog signals of N channels to output second analog signals, where each of the sampling and conversion modules includes a plurality of sampling capacitors connected in parallel, where N is an integer greater than 1; a comparator connected to the N sampling and conversion modules, configured to compare the second analog signals respectively to obtain comparison signals; and a control module connected to the N sampling and conversion modules and the comparator, configured to control the N sampling and conversion modules to output converted digital signals based on the comparison signals.

In a possible implementation, each of the sampling and conversion modules further includes a conversion switch, one terminal of the switch is connected to the plurality of sampling capacitors, and the other terminal thereof is connected to the comparator, where the control module is configured to: in a sample-and-hold phase, control the N sampling and conversion modules to simultaneously sample and hold the input first analog signals of N channels; and in an analog-to-digital conversion phase, control the conversion switches of the N sampling and conversion modules to close in turn so that the analog-to-digital conversion circuit performs analog-to-digital conversion on the first analog signals of N channels sequentially.

In a possible implementation, the analog-to-digital conversion phase includes N conversion cycles, where in an i-th conversion cycle of the analog-to-digital conversion phase, the control module controls the conversion switch of an i-th sampling and conversion module to close, and the analog-to-digital conversion circuit performs a plurality of analog-to-digital conversions on a first analog signal of an i-th channel in a successive approximation manner, to obtain a digital signal corresponding to the first analog signal of the i-th channel, where $1 \leq i \leq N$ and i is an integer.

In a possible implementation, the analog-to-digital conversion circuit further includes a shared conversion module including a plurality of shared capacitors connected in parallel, the module being configured to convert quantized margin signals of the first analog signals of the N channels.

In a possible implementation, the first analog signals of N channels include single-ended signals or differential signals.

In a possible implementation, a first analog signal of a channel corresponding to each sampling and conversion module is input at a first input terminal of the sampling and conversion module, a first control signal is input at a second input terminal of the module, and a second analog signal is output in response to the first conversion switch being closed, each sampling and conversion module includes U first sampling capacitors, U sets of first hold switches, and a first conversion switch, U being an integer greater than or equal to 1, one terminal of each of the first sampling capacitors is connected to the first conversion switch, the other terminal of the capacitors is connected to one terminal of a set of first hold switches, and the other terminal of the set of first hold switches is respectively connected to one of the first analog signal, a device voltage VDD, a ground GND, or a preset direct current voltage, the second analog signal is input at a first input terminal of the comparator, a reference signal is input at a second input terminal of the comparison module, and a first comparison signal is input at an output terminal of the comparison module, and the first comparison signal is input at an input terminal of the control module, a converted first digital signal is output at a first output terminal of the control module, and the first control signal is output at a second output terminal of the control module.

In a possible implementation, said controlling the N sampling and conversion modules to simultaneously sample and hold the input first analog signals of N channels in the sample-and-hold phase includes: controlling the first conversion switches of the N sampling and conversion modules to open; and controlling opened/closed states of the U sets of first hold switches of each of the sampling and conversion modules, so that the other terminal of the U first sampling capacitors of the sampling and conversion module is connected to a first analog signal corresponding to the sampling and conversion module.

In a possible implementation, in the i-th conversion cycle of the analog-to-digital conversion phase, the first conversion switch of the i-th sampling and conversion module is closed, and the analog-to-digital conversion circuit performs U analog-to-digital conversions on the first analog signal of the i-th channel in a successive approximation manner, for a u-th analog-to-digital conversion of the i-th conversion cycle, the i-th sampling and conversion module outputs a u-th second analog signal based on the first analog signal of the i-th channel and a u-th first control signal, where $1 \leq u \leq U$ and u is an integer, the comparator compares the u-th second analog signal with the reference signal to output the first comparison signal of a u-th comparison, based on u<U, the control module outputs the (u+1)-th first control signal based on the first comparison signal of the u-th comparison, and based on u=U, the control module outputs a first digital signal corresponding to the first analog signal of the i-th channel based on the first comparison signal of the U-th comparison.

In a possible implementation, at a beginning of the i-th conversion cycle, the i-th sampling and conversion module outputs an initial second analog signal based on the first analog signal of the i-th channel, the comparator compares the initial second analog signal with the reference signal to output an initial first comparison signal, and the control module outputs a $1^{st}$ first control signal based on the initial first comparison signal, the $1^{st}$ first control signal being the first control signal output for the first time.

In a possible implementation, the i-th sampling and conversion module outputting the u-th second analog signal based on the first analog signal of the i-th channel and the u-th first control signal includes: based on u>1, controlling opened/closed states of a set of first hold switches connected to the u-th first sampling capacitor based on the u-th first control signal, so that the other terminal of the u-th first sampling capacitor is connected to the device voltage VDD or the ground GND, and the one terminal of the u-th first sampling capacitor outputs the u-th second analog signal.

In a possible implementation, the control module outputting the (u+1)-th first control signal based on the first comparison signal of the u-th comparison includes: in response to the first comparison signal of the u-th comparison being 1, outputting the (u+1)-th first control signal to connect the other terminal of the (u+1)-th first sampling capacitor in the i-th sampling and conversion module to the ground GND in the (u+1)-th analog-to-digital conversion; and in response to the first comparison signal of the u-th comparison being 0, outputting the (u+1)-th first control signal to connect the other terminal of the (u+1)-th first sampling capacitor in the i-th sampling and conversion module to the device voltage VDD in the (u+1)-th analog-to-digital conversion.

In a possible implementation, the control module outputting the first digital signal corresponding to the first analog signal of the i-th channel based on the first comparison signal of the U-th comparison includes: calculating a weighted sum of the first comparison signals of the U comparisons based on weighted values of the U first sampling capacitors in the i-th sampling and conversion module, to obtain the first digital signal corresponding to the first analog signal of the i-th channel.

In a possible implementation, the control module is further configured to: at an end of the i-th conversion cycle of the analog-to-digital conversion phase, control opened/closed states of the U sets of first hold switches and the first conversion switch of the i-th sampling and conversion module, to clear charge values on the U first sampling capacitors of the i-th sampling and conversion module.

In a possible implementation, the analog-to-digital conversion circuit further includes a shared conversion module configured to convert quantized margin signals of the first analog signals of N channels, the shared conversion module includes V first shared capacitors connected in parallel, V sets of first shared switches, and a second conversion switch, and the shared conversion module is connected respectively to the N sampling and conversion modules and the comparator through the second conversion switch, where V is an integer greater than or equal to 1, where the control module is further configured to control the second conversion switch to open during the first U times of analog-to-digital conversions in the i-th conversion cycle of the analog-to-digital conversion phase, and control the second conversion switch to close after the U-th analog-to-digital conversion is completed, and the control module outputs the $1^{st}$ second control signal based on the first comparison signal of the U-th comparison, taking the U-th second analog signal as a quantized margin signal, the analog-to-digital conversion circuit performs V analog-to-digital conversions on the quantized margin signal in a successive approximation manner.

In a possible implementation, a second control signal is output at a third output terminal of the control module, for the (U+v)-th analog-to-digital conversion of the i-th conversion cycle, the shared conversion module outputs the (U+v)-th second analog signal based on the quantized margin signal and the v-th second control signal, where $1 \leq v \leq V$ and v is an integer, the comparator compares the (U+v)-th second analog signal with the reference signal to output a first comparison signal of the (U+v)-th comparison, based on v<V, the control module outputs the (v+1)-th second control signal based on the first comparison signal of the (U+v)-th comparison, and based on v=V, the control module outputs the first digital signal corresponding to the first analog signal of the i-th channel based on the first comparison signal of the (U+V)-th comparison.

In a possible implementation, one terminal of each of the first shared capacitors of the shared conversion module is connected to the second conversion switch, the other terminal of the each of the capacitors is connected to one terminal of a set of first shared switches, and the other terminal of the set of first shared switches is respectively connected to one of the device voltage VDD, the ground GND, or the preset DC voltage, where the shared conversion module outputting the (U+v)-th second analog signal based on the quantized margin signal and the v-th second control signal includes: controlling opened/closed states of a set of first shared switches connected to a v-th first shared capacitor based on the v-th second control signal, so that the other terminal of the v-th first shared capacitor is connected to the device voltage VDD or the ground GND, and the (U+v)-th second analog signal is output at one terminal of a v-th first shared capacitor.

In a possible implementation, the control module outputting the (v+1)-th second control signal based on the first comparison signal of the (U+v)-th comparison includes: in response to the first comparison signal of the (U+v)-th comparison being 1, outputting the (v+1)-th second control signal, so that the other terminal of the (v+1)-th first shared capacitor in the shared conversion module is connected to the ground GND in the (U+v+1)-th analog-to-digital conversion; and in response to the first comparison signal of the (U+v)-th comparison being 0, outputting the (v+1)-th second control signal, so that the other terminal of the (v+1)-th first shared capacitor in the shared conversion module is connected to the device voltage VDD in the (U+v+1)-th analog-to-digital conversion.

In a possible implementation, the control module outputting the first digital signal corresponding to the first analog signal of the i-th channel based on the first comparison signal of the (U+V)-th comparison includes: calculating a weighted sum of the first comparison signals of the (U+V) comparisons based on weighted values of the U first sampling capacitors in the i-th sampling and conversion module and weighted values of the V first shared capacitors in the shared conversion module, to obtain the first digital signal corresponding to the first analog signal of the i-th channel.

In a possible implementation, the control module is further configured to: at an end of the i-th conversion cycle of the analog-to-digital conversion phase, control opened/closed states of the V sets of first shared switches and the second conversion switch in the shared conversion module to clear charge values on the V first shared capacitors.

In a possible implementation, the analog-to-digital conversion circuit further includes a shared conversion module configured to convert quantized margin signals of the first analog signals of N channels,
the shared conversion module includes V first shared capacitors and V sets of first shared switches, and the shared conversion module is connected to the N sampling and conversion modules and the comparator, respectively, where V is an integer greater than or equal to 1,
where the control module is further configured to:
take the U-th second analog signal as a quantized margin signal; and
during the (U+1)-th to (U+V)-th analog-to-digital conversions in the i-th conversion cycle of the analog-to-digital conversion phase, control opened/closed states of the V sets of first shared switch in the shared conversion module to perform V analog-to-digital conversions on the quantized margin signal of the i-th channel in a successive approximation manner.

In a possible implementation, a second control signal is output at a third output terminal of the control module,
at an end of the U-th analog-to-digital conversion of the i-th conversion cycle, the i-th sampling and conversion module outputs the U-th second analog signal,
the shared conversion module charges the V first shared capacitors based on the U-th second analog signal,
the comparator outputs the U-th first comparison signal, and
the control module outputs the $1^{st}$ second control signal based on the U-th first comparison signal.

In a possible implementation, for the (U+v)-th analog-to-digital conversion of the i-th conversion cycle, the shared conversion module outputs the (U+v)-th second analog signal based on the quantized margin signal and the v-th second control signal, where $1 \leq v \leq V$ and v is an integer,
the comparator compares the (U+v)-th second analog signal with the reference signal to output a first comparison signal of the (U+v)-th comparison,
based on v<V, the control module outputs the (v+1)-th second control signal based on the first comparison signal of the (U+v)-th comparison, and
based on v=V, the control module outputs the first digital signal corresponding to the first analog signal of the i-th channel based on the first comparison signal of the (U+V)-th comparison.

In a possible implementation, in response to the first analog signals of N channels including differential signals, each of the sampling and conversion modules includes a positive sampling and conversion unit and a negative sampling and conversion unit, the positive sampling and conversion unit including U second sampling capacitors connected in parallel, U sets of second hold switches, and a third conversion switch, and the negative sampling and conversion unit including U third sampling capacitors connected in parallel, U sets of third hold switches, and a fourth conversion switches, where U is an integer greater than or equal to 1,
a positive first analog signal of a channel corresponding to the positive sampling and conversion unit is input at a first input terminal of the positive sampling and conversion unit, a positive first control signal is input at a second input terminal thereof, and a positive second analog signal is output to the comparator in response to the third conversion switch being closed,
a negative first analog signal of a channel correspond to the negative sampling and conversion unit is input at a first input terminal of the negative sampling and conversion unit, a negative first control signal is input at a second input terminal thereof, and a negative second analog signal is output to the comparator in response to the fourth conversion switch being closed,
a positive second analog signal is input at a first input terminal of the comparator, a negative second analog signal is input at a second input terminal thereof, and a second comparison signal is output at an output terminal thereof,
the second comparison signal is input at an input terminal of the control module, a converted second digital signal is output at a first output terminal thereof, a positive first control signal is output at a second output terminal thereof, and a negative first control signal is output at a third output terminal thereof,
where one terminal of each of the second sampling capacitors in the positive sampling and conversion unit is connected to the third conversion switch, the other terminal thereof is connected to one terminal of a set of second hold switches, and the other terminal of the set of second hold switches is respectively connected to one of the positive first analog signal, a device voltage VDD, a ground GND, or a preset DC voltage, and
one terminal of each of the third sampling capacitors in the negative sampling and conversion unit is connected to the fourth conversion switch, the other terminal thereof is connected to one terminal of a set of third hold switches, the other terminal of the set of third hold switches is connected to one of the negative first analog signal, the device voltage VDD, the ground GND, or the preset DC voltage, respectively.

In a possible implementation, said controlling the N sampling and conversion modules to simultaneously sample and hold the input first analog signals of N channels in the sample-and-hold phase includes:
controlling the third conversion switches of the N positive sampling and conversion units and the fourth conversion switches of the N negative sampling and conversion unit to open;
controlling opened/closed states of U sets of second conversion switches in each of the positive sampling and conversion units, so that the other terminal of the U second sampling capacitors in the positive sampling and conversion unit is connected to the corresponding positive first analog signal; and
controlling opened/closed states of the U sets of third conversion switches in each of the negative sampling and conversion units, so that the other terminal of the U second sampling capacitors in the negative sampling and conversion unit is connected to the corresponding negative first analog signal.

In a possible implementation, in the i-th conversion cycle of the analog-to-digital conversion phase, the third conversion switch of the i-th positive sampling and conversion unit and the fourth conversion switch of the i-th negative sampling and conversion unit are closed, and the analog-to-digital conversion circuit performs U analog-to-digital conversions on the first analog signal of the i-th channel in a successive approximation manner,
for the u-th analog-to-digital conversion of the i-th conversion cycle, the i-th positive sampling and conversion unit outputs the u-th positive second analog signal based on the positive first analog signal of the i-th channel and the u-th positive first control signal, where $1 \leq u \leq U$ and u is an integer,
the i-th negative sampling and conversion unit outputs the u-th negative second analog signal based on the negative first analog signal of the i-th channel and the u-th negative first control signal,
the comparator compares the u-th positive second analog signal with the u-th negative second analog signal to output a second comparison signal of the u-th comparison,
based on u<U, the control module outputs the (u+1)-th positive first control signal and the (u+1)-th negative first control signal based on the second comparison signal of the u-th comparison, and based on u=U, the control module outputs a second digital signal corresponding to the first analog signal of the i-th channel based on the second comparison signals of U comparisons.

In a possible implementation, the analog-to-digital conversion circuit further includes a shared conversion module configured to convert quantized margin signals of the first analog signals of N channels,
the shared conversion module includes a positive shared conversion unit and a negative shared conversion unit,
the positive shared conversion unit including V second shared capacitors connected in parallel, V sets of second shared switches, and a fifth conversion switch, and the negative shared conversion unit including V third shared capacitors connected in parallel, V sets of third shared switches, and a sixth conversion switch, where V is an integer greater than or equal to 1,
the positive shared conversion unit is respectively connected to the N positive sampling and conversion units and the first input terminal of the comparator through the fifth conversion switch, and the negative shared conversion unit is respectively connected to the N negative sampling and conversion units and the second input terminal of the comparator through the sixth conversion switch,
where the control module is further configured to:
control the fifth conversion switch and the sixth conversion switch to open during the first U analog-to-digital conversions in the i-th conversion cycle of the analog-to-digital conversion phase; and control the fifth conversion switch and the sixth conversion switch to close after the U-th analog-to-digital conversion is completed; and the control module outputs the $1^{st}$ positive second control signal and the $1^{st}$ negative second control signal based on the second comparison signals of the U comparisons; and
take the U-th positive second analog signal as a positive quantized margin signal and take the U-th negative second analog signal as a negative quantized margin signal, the analog-to-digital conversion circuit performs V analog-to-digital conversions on the positive quantized margin signal and the negative quantized margin signal in a successive approximation manner.

In a possible implementation, for the (U+v)-th analog-to-digital conversion of the i-th conversion cycle, the positive shared conversion unit outputs the (U+v)-th positive second analog signal based on the positive quantized margin signal and the v-th positive second control signal, where $1 \leq v \leq V$ and v is an integer,
the negative shared conversion unit outputs the (U+v)-th negative second analog signal based on the negative quantized margin signal and the v-th negative second control signal,
the comparator compares the (U+v)-th positive second analog signal with the (U+v)-th negative second analog signal to output a second comparison signal of the (U+v)-th comparison,
based on v<V, the control module outputs a (v+1)-th positive second control signal and a (v+1)-th negative second control signal based on the second comparison signal of the (U+v)-th comparison, and
based on v=V, the control module outputs the second digital signal corresponding to the first analog signal of the i-th channel based on the second comparison signal of the (U+v)-th comparison In a possible implementation, the analog-to-digital conversion circuit further includes a shared conversion module configured to convert quantized margin signals of the first analog signals of N channels,
the shared conversion module includes a positive shared conversion unit and a negative shared conversion unit,
the positive shared conversion unit including V second shared capacitors connected in parallel and V sets of second shared switches, and the negative shared conversion unit including V third shared capacitors connected in parallel and V sets of third shared switches, where V is an integer greater than or equal to 1,
the positive shared conversion unit is connected to the N positive sampling and conversion units and the first input terminal of the comparator respectively, and the negative shared conversion unit is connected to the N negative sampling and conversion units and the second input terminal of the comparator respectively,
where the control module is further configured to:
output the $1^{st}$ positive second control signal and the $1^{st}$ negative second control signal based on the second comparison signals of the U comparisons after the U-th analog-to-digital conversion is completed;

the positive shared conversion unit takes the U-th positive second analog signal as a positive quantized margin signal, and the negative shared conversion unit takes the U-th negative second analog signal as a negative quantized margin signal; and during the (U+1)-th to (U+V)-th analog-to-digital conversions in the i-th conversion cycle of the analog-to-digital conversion phase, output a second control signal to control opened/closed states of the V sets of second shared switches in the positive shared conversion unit and the V sets of third shared switches in the negative shared conversion unit, to perform V analog-to-digital conversions on the positive quantized margin signal and the negative quantized margin signal in a successive approximation manner.

In a possible implementation, for the (U+v)-th analog-to-digital conversion of the i-th conversion cycle, the positive shared conversion unit outputs the (U+v)-th positive second analog signal based on the positive quantized margin signal and the v-th positive second control signal, where $1 \leq v \leq V$ and v is an integer, the negative shared conversion unit outputs the (U+v)-th negative second analog signal based on the negative quantized margin signal and the v-th negative second control signal, the comparator compares the (U+v)-th positive second analog signal with the (U+v)-th negative second analog signal to output a second comparison signal of the (U+v)-th comparison, based on v<V, the control module outputs a (v+1)-th positive second control signal and a (v+1)-th negative second control signal based on the second comparison signal of the (U+v)-th comparison, and based on v=V, the control module outputs the second digital signal corresponding to the first analog signal of the i-th channel based on the second comparison signal of the (U+v)-th comparison According to the analog-to-digital conversion circuit of the present disclosure, by providing a sampling and conversion module including a plurality of sampling capacitors, such that in addition to that the sampling capacitors realize the function of multi-channel synchronous sampling, a successive approximation conversion function can be directly accomplished on the sampling capacitors by control signals output from the receiving circuit, it is possible to reduce charge loss of the sampling and conversion module, thereby improving energy efficiency of the analog-to-digital conversion circuit at a smaller circuit cost.

Other features and aspects of the present disclosure will become apparent from the following detailed description of exemplary embodiments with reference to the accompanying drawings.

BRIEF DESCRIPTION OF THE DRAWINGS

The accompanying drawings, which are incorporated in and constitute a part of the specification, illustrate exemplary embodiments, features, and aspects of the present disclosure together with the description, and serve to explain the principles of the present disclosure.

DETAILED DESCRIPTION

Figure 1:
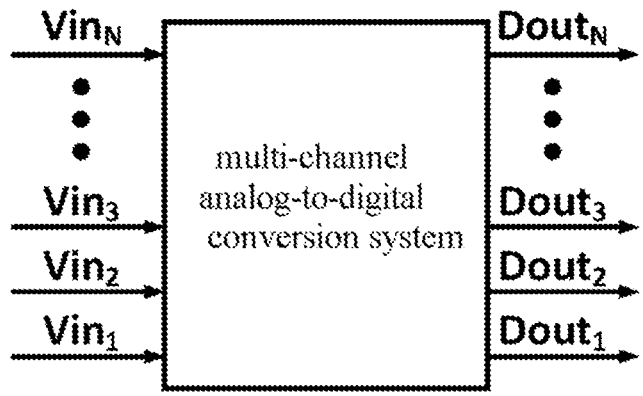
FIG. 1 shows a schematic diagram of a multi-channel analog-to-digital conversion system according to the related art.

Various exemplary embodiments, features, and aspects of the present disclosure will be described in detail hereinafter with reference to the accompanying drawings. The same reference numerals in the drawings denote elements having the same or similar functions. Although various aspects of the embodiment are shown in the drawings, the drawings are not necessarily to drawn to scale unless otherwise specified.

The special term "exemplary" here means "serving as an example, an embodiment, or an illustration". Any embodiment described herein as "exemplary" need not be construed as being superior or better than other embodiments.

In addition, in the following detailed embodiments, numerous specific details are set forth in order to better explain the present disclosure. Those skilled in the art will understand that, the present disclosure may also be practiced without certain specific details. In some instances, those methods, means, elements, and circuits well known to those skilled in the art are not described in detail in order to highlight the gist of the present disclosure.

Figure 2:
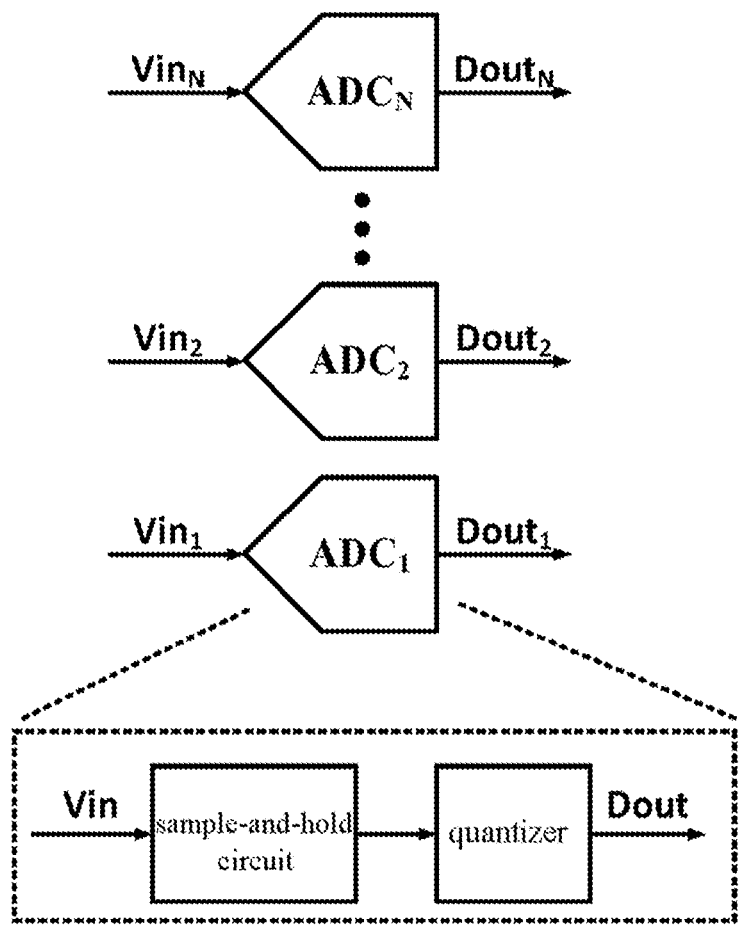
FIG. 2 shows a configuration diagram of a multi-channel synchronous analog-to-digital conversion circuit according to the related art.
Figure 3:
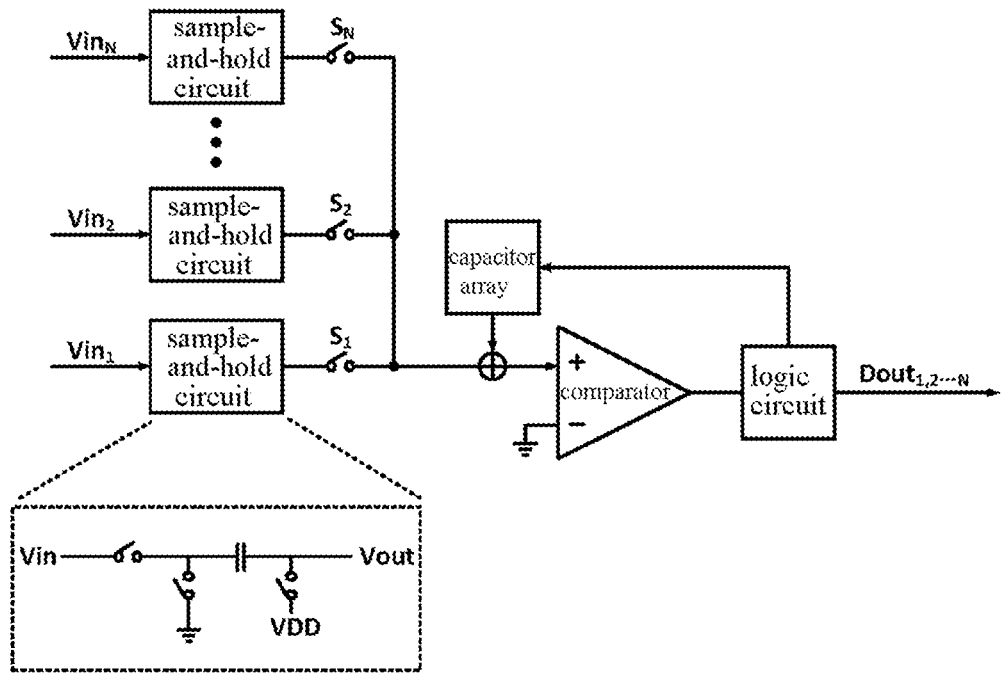
FIG. 3 shows a configuration diagram of a multi-channel synchronous analog-to-digital conversion circuit according to the related art.

FIG. 2 and FIG. 3 are configuration diagrams of a multi-channel synchronous analog-to-digital conversion circuit according to the related art.

The multi-channel synchronous analog-to-digital conversion circuit as shown in FIG. 2 can be regarded as a parallel arrangement of a plurality of single-channel successive approximation register analog-to-digital conversion circuits. Assuming that inputs to the system are signals of N channels, the system includes N ADCs (i.e., $ADC_1$, $ADC_2$, ..., $ADC_N$), each of which includes a sample-and-hold circuit. Analog input signals $Vin_i$ (where i is in a range from 1 to N) of N channels, after being sampled via different sample-and-hold circuits, are sent into a corresponding quantizer, which converts the sampled analog signal of each of the channels into a digital output signal $Dout_i$ (where i is in a range from 1 to N). The disadvantage of this circuit configuration is that the circuit uses N ADCs, and thus its implementation complexity is higher, resulting in huge circuit hardware overhead (such as area, power consumption).

The circuit as shown in FIG. 3 is a multi-channel ADC composed of a plurality of sample-and-hold circuits (i.e., sampling capacitors), a capacitor array, and a comparator. Each of the sample-and-hold circuits stores an input signal Vin (where i is in a range from 1 to N) of a channel corresponding to the sample-and-hold circuit through a capacitor. The sampling capacitors are sequentially connected to the capacitor array in an order of opening and closing of switch $S_i$ (where i is in a range from 1 to N) to perform analog-to-digital conversion, use the principle of successive approximation, and convert the corresponding sampled input signals $Vin_1$-$Vin_N$ into digital codes as digital output signals $Dout_1$-$Dout_N$ of the ADC by setting the weight of each of the capacitors in the capacitor array and feeding back through each of digital output codes.

Although the circuit of FIG. 3 is simple in configuration, it reduces energy efficiency of the system at the same time. The reason is that, in the technical solution disclosed in FIG. 3, input signals are sampled and held by the sampling capacitors and charges on the sampling capacitors are sampling values of the input signals. However, the charges obtained by sampling are shared with the capacitor array, which in turn causes the sampling values of the analog input signals to attenuate once and thus reference noises input to the comparator are amplified, and kT/C noises of the capacitors are also amplified at the same time. Assuming that the sampling capacitance value of each of the channels is the same as the capacitance value of the capacitor array in the quantizer, sampling values of the analog input signals are attenuated by two times, and thus a noise voltage of the comparator is amplified by two times. If the same signal-to-noise ratio is to be attained, the power consumption of the comparator needs to be increased by four times. At the same time, the kT/C noise of the capacitor is amplified by two times. If the same signal-to-noise ratio is to be attained, the capacitance values of the sampling capacitors and the capacitor array need to be increased by two times, so that energy efficiency of the system may be reduced and an area of the chip may significantly increase. Therefore, it may be not satisfactory from energy efficiency of the circuit, and hardware overhead when performing analog-to-digital conversion on multi-channel input signals using the circuit configuration composed of a single ADC and a plurality of sample-and-hold circuits.

In view of this, the present disclosure provides an analog-to-digital conversion circuit capable of improving energy efficiency of the analog-to-digital conversion circuit at a smaller circuit cost.

Figure 4:
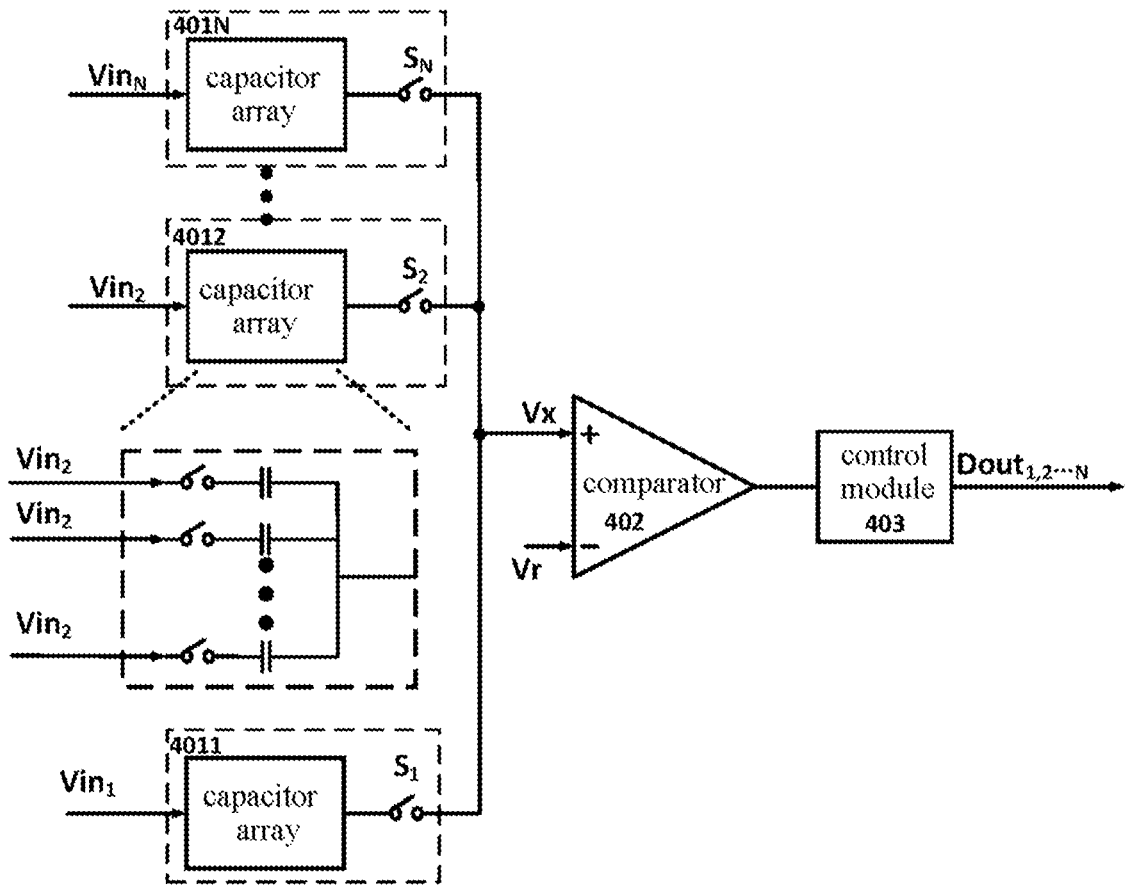
FIG. 4 shows a schematic diagram of an analog-to-digital conversion circuit according to an embodiment of the present disclosure.

FIG. 4 shows a schematic diagram of an analog-to-digital conversion circuit according to an embodiment of the present disclosure. As shown in FIG. 4, the analog-to-digital conversion circuit includes:

N sampling and conversion modules connected in parallel configured to simultaneously sample and sequentially convert first analog signals of N channels to output second analog signals, where each of the sampling and conversion modules includes a plurality of sampling capacitors connected in parallel, where N is an integer greater than 1;

a comparator, connected to the N sampling and conversion modules, configured to compare the second analog signals respectively to obtain comparison signals;

a control module, connected to the N sampling and conversion modules and the comparator, configured to control the N sampling and conversion modules to output converted digital signals based on the comparison signals.

For example, the analog-to-digital conversion circuit may be configured to perform sampling and analog-to-digital conversion on multi-channel first analog signals. Taking N channels as an example, the analog-to-digital conversion circuit may include N sampling and conversion modules 4011-401N configured to simultaneously sample and sequentially convert first analog signals $Vin_1$-$Vin_N$ of the N channels, where the first analog signals $Vin_1$-$Vin_N$ of the N channels are analog input signals input to the N sampling and conversion modules 4011-401N, and the first analog signals of different channels may be different. The N sampling and conversion modules 4011-401N are connected in parallel, and each of the sampling and conversion modules corresponds to one channel. For example, the second sampling and conversion module 4012 may correspond to the second channel. Each of the sampling and conversion modules is the same in configuration, and includes a capacitor array of a plurality of capacitors connected in parallel. For example, the sampling and conversion module 4011 may include a plurality of capacitors connected in parallel constituting a capacitor array, which can be used to store charges corresponding to voltage values of first analog signals of corresponding channels, and also used to accomplish functions of the digital-to-analog converter (DAC) in SAR ADC.

In a possible implementation, taking the second channel as an example, a connection of each of the sampling capacitors of the capacitor array in the sampling and conversion module 4012 with the first analog signal $Vin_2$ may be controlled respectively by providing a plurality sets of hold switches, such that the sampling and conversion module 4012 accomplishes the step of sampling. Both terminals of each of the sampling capacitors in the capacitor array may be connected to a plurality of DC (direct current) potentials, and the potential connection manner of both terminals of each of the sampling capacitors may be controlled such that a voltage difference of $Vin_2$ may be formed across each of the capacitors. That is, the first analog signal $Vin_2$ may be stored in the plurality of sampling capacitors in the form of charge, and thus the sampling of the first analog signal $Vin_2$ is accomplished.

In a possible implementation, the sampling and holding of the first analog signals $Vin_1$-$Vin_N$ of the N channels may be controlled to be performed synchronously. The switches connecting each of the sampling capacitors with the corresponding first analog signal in the N sampling and conversion modules 4011-401N may be controlled, such that all the sampling capacitors of the N sampling and conversion modules 4011-401N are connected to the corresponding first analog signals $Vin_1$-$Vin_N$ at the same time, so as to accomplish synchronous sampling of the multi-channel first analog signals.

In a possible implementation, the analog-to-digital conversion circuit may include a comparator 402 and a control module 403. One terminal of the comparator 402 is connected to the control module 403, and the other terminal thereof may be connected to the sampling and conversion modules 4011-401N in turn through conversion switches $S_1$-$S_N$ to perform analog-to-digital conversion of the analog input signals of N channels sequentially.

In a possible implementation, taking the second channel as an example, the control module may output a control signal to the sampling and conversion module 4012, so that the sampling and conversion module 4012 controls the DC potentials at the other terminals of the plurality of sampling capacitors to feed back the input, to output the second analog signal. The second analog signal is a signal (Vx) received by a positive input terminal of the comparator, and the second analog signal may be a signal output by the sampling and conversion module 4012 according to voltages connected to the other terminals of the plurality of sampling capacitors and charges stored on the plurality of sampling capacitors, or the second analog signal may be a signal which is output, by the sampling and conversion module 4012 after accomplishing the function of digital-to-analog conversion (DAC) in the SAR ADC and adjusting the voltages connected to the other terminals of the plurality of sampling capacitors according to the received control signal, in accordance with the adjusted voltages connected to the other terminals of the plurality of sampling capacitors and sampling charges stored on the plurality of sampling capacitors.

In a possible implementation, the comparator 402 may compare signals input to both the positive input terminal and the negative input terminal of the comparator 402 to obtain a comparison signal, and the magnitude relationship of the two signals to be compared is embodied by a numerical value 0 or 1. When the second analog signal is a single-ended signal, a reference signal Vr input at the negative input terminal may be a preset reference voltage, and when the second analog signal is a differential signal, the signal input at the negative input terminal may be a positive or negative signal in a differential form.

In a possible implementation, the control module 403 may further store a comparison signal of the comparator 402, perform a calculation based on the comparison signal to obtain a final digital signal and output it to an external circuit, the final digital signal being a digital output signal $Dout_2$ after performance of an analog-to-digital conversion on the first analog signal $Vin_2$ of the second channel. The digital signal may be a calculated numerical signal, or may be a digital form signal that can represent the result of analog-to-digital conversion resulting from other means, which is not limited by the present disclosure.

According to the analog-to-digital conversion circuit of the present disclosure, by providing a sampling and conversion module including a plurality of sampling capacitors, such that in addition to that the sampling capacitors realize the function of multi-channel synchronous sampling, a successive approximation conversion function can be directly accomplished on the sampling capacitors by control signals output from the receiving circuit, it is possible to reduce charge loss of the sampling and conversion module, thereby improving energy efficiency of the analog-to-digital conversion circuit at a smaller circuit cost.

In a possible implementation, each of the sampling and conversion modules further includes a conversion switch, one terminal of the switch is connected to the plurality of sampling capacitors, and the other terminal thereof is connected to the comparator,
where the control module is configured to:
in a sample-and-hold phase, control the N sampling and conversion modules to simultaneously sample and hold the input first analog signals of N channels; and
in an analog-to-digital conversion phase, control the conversion switches of the N sampling and conversion modules to close in turn, and the analog-to-digital conversion circuit performs analog-to-digital conversion on the first analog signals of N channels sequentially.

As shown in FIG. 4, taking the second channel as an example, the sampling and conversion module 4012 may include a conversion switch $S_2$ for controlling an order of performing an analog-to-digital conversion on the first analog signals of N channels. The conversion switch $S_2$ may be connected between one terminal of the plurality of sampling capacitors and an input terminal of the comparator 402. When the conversion switch $S_2$ is opened, the sampling and conversion module 4012 is disconnected from the other modules so that charges collected on the sampling capacitors cannot be shared with the other modules, thereby determining that the charges stored on the sampling capacitors are the voltage value of the first analog signal $Vin_2$ of the second channel. When the conversion switch $S_2$ is closed, one terminal of the sampling and conversion module 4012 may output a second analog signal to the comparator 402, and accomplish analog-to-digital conversion of the corresponding channel together with the comparator 402 and the control module 403. In this way, the sample-and-hold phase may be separated from the analog-to-digital conversion phase.

In a possible implementation, the analog-to-digital conversion of the first analog signals of N channels may be performed in two phases including a sample-and-hold phase and an analog-to-digital conversion phase by closing and opening the conversion switches of N channels. the conversion switches in the N sampling and conversion modules can be controlled to remain open, in this case, one terminal of each of the capacitors in the capacitor array may be controlled to connect to a DC potential, and the other terminal of each of the capacitors in the capacitor array can be controlled to connect to a first analog signal of a corresponding channel and a DC potential same as the DC potential connected to the one terminal of each of the capacitors of the capacitor array. For example, it is possible to connect one terminal of the sampling capacitor to GND and connect the other terminal of the sampling capacitor to the first analog signal, thereby generating a voltage difference same as the voltage value of the first analog signal across the sampling capacitor.

Those skilled in the art should understand that, there may be a variety of potential connection ways at both terminals of the sampling capacitor, as long as the voltage difference across the sampling capacitor can be made equal to the voltage value of the first analog signal. The present disclosure does not limit specific connection objects at both terminals of the sampling capacitor of each of sampling and conversion modules.

In a possible implementation, at the end of the sample-and-hold phase, voltages connected at both terminals of the sampling capacitors of the N sampling and conversion modules 4011-401N need to be disconnected so that the amount of charges on the capacitor array of each of the sampling and conversion modules does not change, thereby maintaining the sampled voltage value.

In a possible implementation, after the sample-and-hold is completed, the conversion switch between any one of the sampling and conversion modules and the comparator 402 is closed, so that the sampling and conversion module, the comparator 402 and the control module 403 together form a configuration of a successive approximation register analog-to-digital conversion circuit (SAR ADC), which can accomplish an analog-to-digital conversion of the sampled voltage value collected by the sampling and conversion module.

In a possible implementation, one comparator 402 may be connected to only one sampling and conversion module to perform an analog-to-digital conversion on the first analog signal of one channel. Therefore, each of the sampling and conversion modules needs to be connected to the comparator once to perform the analog-to-digital conversion, to obtain the digital output signal of the first analog signal of the corresponding channel. The order of the analog-to-digital conversions of the N channels can be determined by a number of the channels.

In a possible implementation, the analog-to-digital conversion on the first analog signals of N channels can be performed sequentially by closing the conversion switch of each of the sampling and conversion modules in turn.

In this way, it is possible to complete synchronous sampling of the first analog signals of N channels and holding of the sampled signals in the sample-and-hold phase, and complete the analog-to-digital conversion of the sampled signals held by each of the sampling and conversion modules in the analog-to-digital conversion phase, to implement synchronous sampling and analog-to-digital conversion of the first analog signals of N channels.

In a possible implementation, the analog-to-digital conversion phase includes N conversion cycles, where in the i-th conversion cycle of the analog-to-digital conversion phase, the control module controls the conversion switch of the i-th sampling and conversion module to close, and the analog-to-digital conversion circuit performs a plurality of analog-to-digital conversions on a first analog signal of the i-th channel in a successive approximation manner, to obtain a digital signal corresponding to the first analog signal of the i-th channel, where $1 \leq i \leq N$ and i is an integer.

For example, each of the N sampling and conversion modules 4011-401N completes sampling and holding of the first analog signal of the corresponding channel, and therefore, the second analog signal of each of the channels needs to be subjected to an analog-to-digital conversion once, and the N channels need to be subjected to N analog-to-digital conversions. The analog-to-digital conversion phase of the first analog signal $Vin_1$-$Vin_N$ of N channels may be divided into N conversion cycles so that a conversion of one channel can be completed within one cycle.

In a possible implementation, in the first conversion cycle of the analog-to-digital conversion phase, the conversion switch $S_1$ of the first channel may be controlled to close, and the conversion switches of the other channels may be controlled to open, so that the first analog signal $Vin_1$ of the first channel starts to be subjected to an analog-to-digital conversion. After the analog-to-digital conversion of the first channel is completed, the conversion switch $S_1$ of the first channel is controlled to open, and the conversion switch $S_2$ of the second channel is controlled to close, so that the first analog signal $Vin_2$ of the second channel is subjected to an analog-to-digital conversion. By analogy, after an analog-to-digital conversion of the i-th channel is completed, the first analog signal of the (i+1)-th channel may be controlled to be subjected to an analog-to-digital conversion, until analog-to-digital conversions of all the N channels are completed.

In a possible implementation, in each of the conversion cycles, the other terminal of each of the capacitors may be controlled to sequentially connect to different DC potentials by outputting control signals many times such that one terminal of the capacitor array outputs different second analog signals. Taking the second channel as an example, the sampling and conversion module 4012 may adjust a plate connection object of one sampling capacitor according to the control signal received each time, and the sampling and conversion module 4012 includes a plurality of sampling capacitors. Therefore, the second analog signal for analog-to-digital conversion may be output multiple times, which may gradually approximate the first analog signal to perform multiple times of analog-to-digital conversion on the first analog signal $Vin_2$ of the i-th channel in a successive approximation manner. At the end of a plurality of conversions in the second conversion cycle, a digital signal corresponding to the first analog signal $Vin_2$ of the i-th channel may be obtained.

In this way, after the N conversion cycles are completed, N digital signals corresponding to the first analog signals of N channels may be obtained, and thus an analog-to-digital conversion after one-time synchronous sampling of the plurality of channels is completed.

Figure 5:
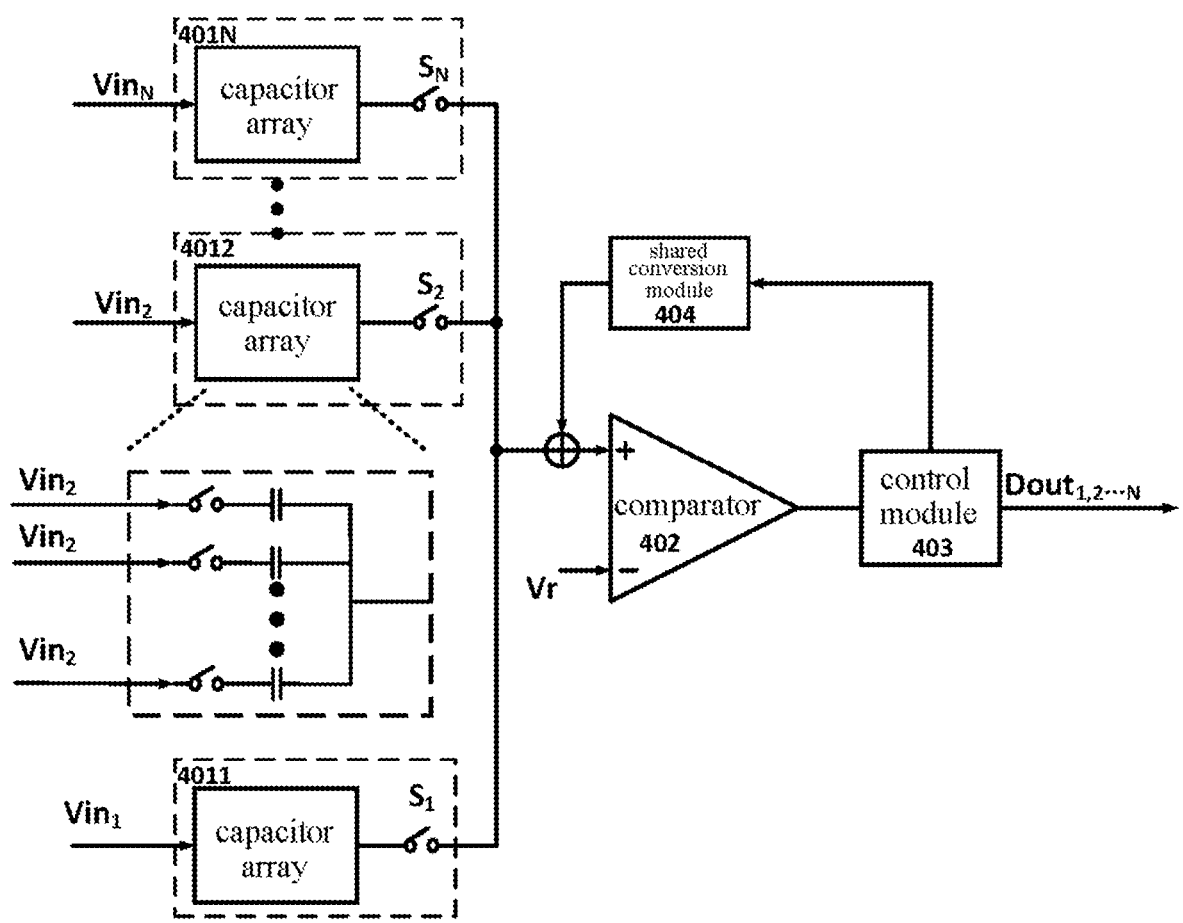
FIG. 5 shows a schematic diagram of an analog-to-digital conversion circuit according to an embodiment of the present disclosure.

FIG. 5 shows a schematic diagram of an analog-to-digital conversion circuit according to an embodiment of the present disclosure. As shown in FIG. 5, the analog-to-digital conversion circuit further includes a shared conversion module including a plurality of shared capacitors connected in parallel, the module being configured to convert quantized margin signals of the first analog signals of the N channels.

For example, taking the second channel as an example, the first analog signal is subjected to an analog-to-digital conversion by a plurality of sampling capacitors of the sampling and conversion module 4012, and the second analog signal obtained after the last conversion in the second conversion cycle, i.e., the quantized margin signal, is still necessary for further quantization. In this case, a shared conversion module 404 may be connected in the analog-to-digital conversion circuit for continuing an analog-to-digital conversion on the quantized margin signal after the analog-to-digital conversion has been performed.

In a possible implementation, taking one channel as an example, the shared conversion module may include a capacitor array of a plurality of capacitors connected in parallel, and the capacitor array, when continuing an analog-to-digital conversion on the quantized margin signal, may constitute the circuit configuration of SAR ADC together with the comparator 402, the sampling and conversion module 4012, and the control module 403.

In a possible implementation, the second analog signal input to the positive input terminal of the comparator may be a conversion result output by the sampling and conversion module, or may be a conversion result of the shared conversion module. A signal (Vr) input to the negative input terminal of the comparator may be a preset reference voltage or an analog signal in a differential form. The comparator compares the input signals at both the positive input terminal and the negative input terminal to output the comparison signal. The comparison signal of the comparator may be input to the control module so that the control module outputs the control signal based on the comparison signal, where the control signal may be output to the shared conversion module to control the shared conversion module to convert the quantized margin signal of the first analog signal of the channel.

In this way, conversion accuracy of analog-to-digital conversion on the first analog signal of each of the channels can be further improved to obtain a digital signal with higher accuracy.

In a possible implementation, the first analog signals of N channels include single-ended signals or differential signals.

For example, the analog-to-digital conversion circuit may perform an analog-to-digital conversion on single-ended signals, or may perform an analog-to-digital conversion on differential signals. Taking the second channel as an example, when the first analog signal $Vin_2$ is a single-ended signal, the second analog signal output by the second sampling and conversion module is also a single-ended signal. A reference voltage may be input at one terminal of the comparator 402, and the second analog signal may be input at the other terminal of the comparator 402 to be compared with the reference voltage, to obtain a comparison signal. If the first analog signal $Vin_2$ is a differential signal, the second analog signal is also a differential signal. Two sampling and conversion units may be provided in the second sampling and conversion module for sampling and converting respectively the first analog signal of the same channel, and the obtained two second analog signals are input respectively to two input terminals of the comparator 402 for comparison, to obtain a comparison signal.

In this way, the analog-to-digital conversion circuit can perform an analog-to-digital conversion not only on the single-ended signal, but also on the differential signal, so that the use of the analog-to-digital conversion circuit is more flexible.

In a possible implementation, a first analog signal of a channel corresponding to each sampling and conversion module is input at a first input terminal of the sampling and conversion module, a first control signal is input at a second input terminal of the module, and a second analog signal is output in response to the first conversion switch being closed; each sampling and conversion module includes U first sampling capacitors, U sets of first hold switches and a first conversion switch, U being an integer greater than or equal to 1, one terminal of each of the first sampling capacitors is connected to the first conversion switch, the other terminal of the capacitors is connected to one terminal of a set of first hold switches, and the other terminal of the set of first hold switches is connected respectively to one of the first analog signal, a device voltage VDD, a ground GND, or a preset direct current voltage; the second analog signal is input at a first input terminal of the comparator, a reference signal is input at a second input terminal of the comparison module, and a first comparison signal is input at an output terminal of the comparison module; and the first comparison signal is input at an input terminal of the control module, a converted first digital signal is output at a first output terminal of the control module, and the first control signal is output at a second output terminal of the control module.

Figure 6:
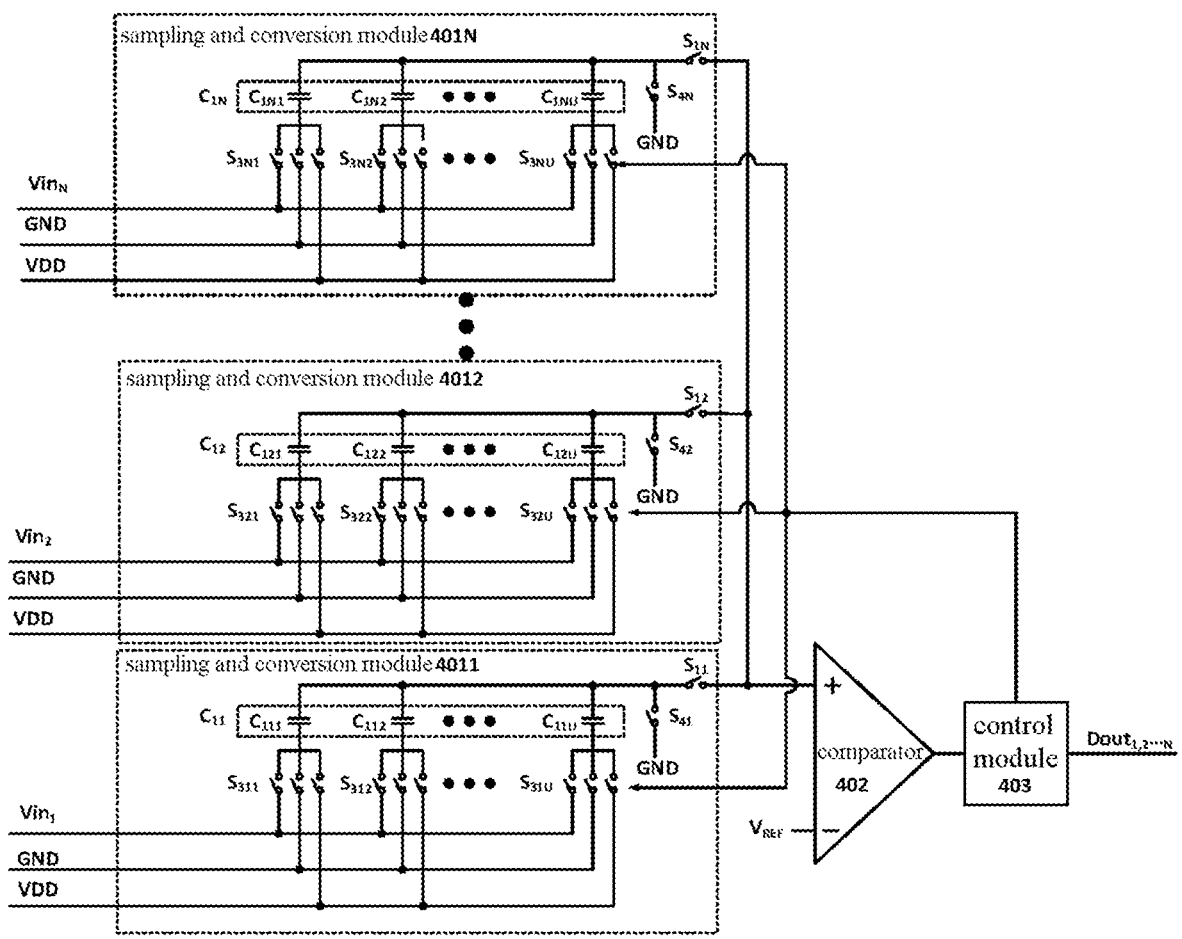
FIG. 6 shows a schematic diagram of an analog-to-digital conversion circuit according to an embodiment of the present disclosure.

FIG. 6 shows a schematic diagram of an analog-to-digital conversion circuit according to an embodiment of the present disclosure. As shown in FIG. 6, the sampling and conversion modules 4011-401N of N channels may sample N input channels, the i-th channel may correspond to a capacitor array $C_{1i}$ of the i-th sampling and conversion module, which includes U first sampling capacitors $C_{121}$-$C_{12U}$ connected in parallel, and the capacitor array $C_{1i}$ corresponds to the first analog signal $Vin_i$ of the i-th channel. In a single-ended system, the first conversion switch $S_{1i}$ may selectively connect the capacitor array $C_{1i}$ to the comparator 402 for controlling the order of analog-to-digital conversions of N channels, where N represents the total number of channels and i represents a channel number (where i is in a range from 1 to N).

In a possible implementation, taking the second channel as an example, one terminal of the capacitor array $C_{12}$ may be connected to the comparator 402, and may also be connected to a ground (GND), a device voltage (VDD), or other preset DC potentials (e.g., connected to VDD/2). The other terminal of the capacitor array $C_{12}$ may be connected respectively to the first analog signal $Vin_2$ via a corresponding plurality of sets of first hold switches $S_{321}$-$S_{32U}$, and may also be connected to the GND, the VDD, or the other preset DC potentials (e.g., connected to VDD/2), where U represents the total number of capacitors in the capacitor array $C_{12}$. The sampling and conversion module 4012 may also receive a feedback from the control module 403, and adjust the capacitor voltage according to the feedback to output different second analog signals.

In a possible implementation, when the first conversion switch $S_{12}$ is closed, the capacitor array $C_{12}$ also functions as a DAC in the SAR ADC. One terminal of the capacitor array $C_{12}$ may be connected to the comparator 402, and the other terminal of the capacitor array $C_{12}$ may be connected to the input signal $Vin_2$, respectively. At this time, the first analog signal $Vin_2$ of the corresponding channel is input at the first input terminal, the first control signal is input at the second input terminal, and the first control signal controls the sampling and conversion module 4012 to complete a digital-to-analog conversion, to output the second analog signal. The capacitor array $C_{12}$ may be in a binary configuration, or may be in other configurations, such as adding some redundancy. The present disclosure does not limit the way of configuration of the capacitor array $C_{12}$.

In a possible implementation, the comparator 402 may include a comparator, of which a positive input terminal (i.e., the first input terminal) may be connected to the capacitor array $C_{12}$ via a corresponding first conversion switch $S_{12}$. When there is a signal output at the output terminal of the sampling and conversion module 4012, the output second analog signal is input to the comparator 402 to be compared with a reference signal $V_{REF}$ (e.g., a reference voltage) input at a negative input terminal (i.e., the second input terminal) of the comparator 402, to output a first comparison signal. The first comparison signal is a one-bit digital output code having two numerical values of 0 and 1, respectively. When the first comparison signal is 1, it indicates that the input signal at the positive input terminal is larger, and when the first comparison signal is 0, it indicates that the input signal at the negative input terminal is larger.

In a possible implementation, the comparison signal output by the comparator 402 is input to the input terminal of the control module 403, and the control module 403 may output a first control signal to the input terminal of the sampling and conversion module 4012 according to the input first comparison signal, so that the sampling and conversion module 4012 controls the DC potential connected to the other terminal of the sampling capacitor based on the first control signal, thereby adjusting the second analog signal output to the comparator 402 in performing the next comparison.

In a possible implementation, the comparison signal output by the comparator 402 may be input to the control module 403 and then stored in the control module 403. At the end of a plurality of analog-to-digital conversions in the second conversion cycle, the control module 403 may determine a final first digital signal $Dout_2$ according to the stored plurality of comparison signals. The analog-to-digital conversion circuit may include N conversion cycles, and the control module 403 may, immediately after determining a first digital signal, output it to the external circuit, or may, after obtaining N first digital signals $Dout_1$-$Dout_N$, output them to the external circuit together. After all the N first digital signals $Dout_1$-$Dout_N$ are output, the synchronous sampling and analog-to-digital conversion of the first analog signals $Vin_1$-$Vin_N$ of N channels are finally completed.

In this way, the analog-to-digital conversion of N input channels can be achieved.

In a possible implementation, the controlling the N sampling and conversion modules to simultaneously sample and hold the input first analog signals of N channels in the sample-and-hold phase includes:

controlling the first conversion switches of the N sampling and conversion modules to open; and controlling opened/closed states of the U sets of first hold switches of each of the sampling and conversion modules, so that the other terminal of the U first sampling capacitors of the sampling and conversion module is connected to a first analog signal corresponding to the sampling and conversion module.

For example, the capacitor arrays $C_{11}$-$C_{1N}$ may simultaneously sample and store the first analog signals of N channels, and the sampled signals may be stored in the sampling capacitor array $C_{11}$-$C_{1N}$ in the form of charges.

In a possible implementation, the input analog input signals of N channels may be simultaneously sampled and held. One terminal of the capacitor arrays $C_{11}$-$C_{1N}$ may be disconnected from the comparator via the first conversion switches $S_{11}$-$S_{1N}$ so that the N sampling and conversion modules may be independent of other modules. One terminal of the N capacitor arrays may be grounded, and the U first hold switches connected to the first analog signal of each of the channels in the U sets of first hold switches for each of the capacitor arrays may be closed such that the analog input signals of N channels are simultaneously input to the other terminal of the N capacitor arrays $C_{11}$-$C_{1N}$. Alternatively, before the first analog signal is input at one terminal of the capacitor array, the same preset DC voltage (GND, VDD, or other DC voltages) may be connected at both terminals of the capacitor at the same time, so that the same voltage difference as the analog input voltage may be formed across the capacitor array after the first analog signal is input to one terminal of the capacitor array, and the first analog signals of N channels are stored in the form of storing charges in the capacitors. At the end of the sample-and-hold phase, both terminals of each of the capacitor arrays need to be disconnected from all the connected DC voltages, so that the amount of charges on the N capacitor arrays no longer changes, thereby holding the sampled voltage values in preparation for the next analog-to-digital conversion.

In this way, the sampling and holding processes of the first analog signals of N channels can be implemented simultaneously.

In a possible implementation, in the i-th conversion cycle of the analog-to-digital conversion phase, the first conversion switch of the i-th sampling and conversion module is closed so that the analog-to-digital conversion circuit performs U times of analog-to-digital conversions on the first analog signal of the i-th channel in a successive approximation manner. That is, the i-th sampling and conversion module 401i may include U sampling capacitors $C_{1i1}$-$C_{1iU}$ connected in parallel (not shown), and may include U times of analog-to-digital conversions when performing analog-to-digital conversion on the first analog signal $Vin_i$ of the i-th channel.

In a possible implementation, the sampling capacitor arrays $C_{11}$-$C_{1N}$ of N channels may be connected to the comparator 402 through the first conversion switches $S_{11}$-$S_{1N}$ in turn to sequentially complete the analog-to-digital conversion of N channels.

Figure 12:
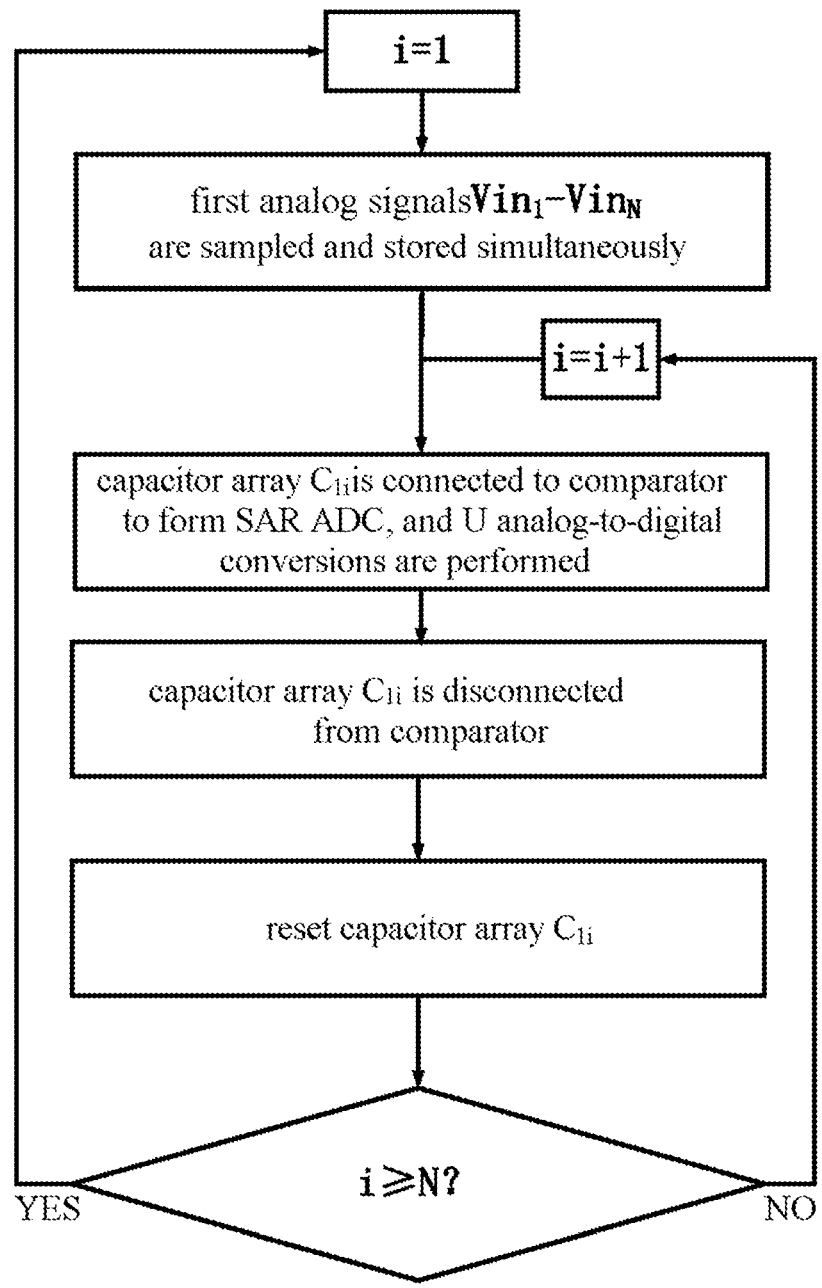
FIG. 12 shows a flowchart of an analog-to-digital conversion performed by an analog-to-digital conversion circuit according to an embodiment of the present disclosure.

FIG. 12 shows a flowchart of an analog-to-digital conversion performed by an analog-to-digital conversion circuit according to an embodiment of the present disclosure. As shown in FIG. 12, after the sample-and-hold phase is ended, the analog-to-digital conversion may be started from the first channel. The first conversion switch $S_{11}$ of the first channel may be closed, and the comparator 402 may start a comparison to obtain a first comparison signal. The first comparison signal may be input to the control module 403 and stored in the control module 403. The control module 403 may judge whether a plurality of analog-to-digital conversions in the first conversion cycle are completed or not according to the number of the stored first comparison signals. When the control module stores U first comparison signals, the quantization accuracy of the sampling and conversion module may be considered to have reached the maximum, and the first conversion switch $S_{11}$ of the first sampling and conversion module 4011 may be controlled to open. The control module 403 may calculate a final first digital signal $Dout_1$ of the first channel in accordance with a weighted value configured by the capacitor array $C_{11}$ and U first comparison signals, and the first conversion cycle then ends.

In a possible implementation, after the first conversion cycle ends, the second conversion cycle starts, and the control module 403 may close the first conversion switch $S_{12}$ of the second channel to control the first analog signal of the second channel to perform a plurality of analog-to-digital conversions of the second conversion cycle. The conversion steps thereof are the same as those in the above first conversion cycle. For brevity, details are not described herein. By analogy, the control module 403 may sequentially perform analog-to-digital conversion on the first analog signals $Vin_1$-$Vin_N$ of N channels by controlling in turn N first conversion switches $S_{11}$-$S_{1N}$ corresponding to the sampling and conversion modules 4011-401N of N channels, to obtain the final first digital signals $Dout_1$-$Dout_N$ of N channels.

In a possible implementation, at the end of analog-to-digital conversion of each of the channels, charges in the sampling and conversion module of the channel may be cleared immediately, or may be cleared after the completion of analog-to-digital conversion of N channels, which is not limited by the present disclosure.

In this way, an analog-to-digital conversion on the analog input signals of N channels can be completed sequentially.

In a possible implementation, at the beginning of the i-th conversion cycle, the i-th sampling and conversion module outputs an initial second analog signal based on the first analog signal of the i-th channel;

the comparator compares the initial second analog signal with the reference signal to output an initial first comparison signal; and the control module outputs the $1^{st}$ first control signal according to the initial first comparison signal, the $1^{st}$ first control signal being the first control signal that is output for the first time.

For example, each of the conversion cycles may be accomplished by a sampling and conversion module of a corresponding channel, a comparator, and a control module. For example, at the beginning of the second conversion cycle, the control module 403 does not output the first control signal to the sampling and conversion module 4012 until the sampling and conversion module 4012 outputs the second analog signal for the first time. At this time, the first analog-to-digital conversion step of the second conversion cycle has not yet been performed, and the comparator 402 needs to compare an initial second analog signal of the sampling and conversion module 4012 to obtain a comparison result once.

In a possible implementation, when a reference voltage $V_{REF}$ is input at the negative input terminal of the comparator, the comparison result on the initial second analog signal and the reference voltage by the comparator may be an initial first comparison signal, and the control module 403 may output the $1^{st}$ first control signal according to the initial first comparison signal. The sampling and conversion module 4012 may output the $1^{st}$ second analog signal according to the $1^{st}$ first control signal, so that the analog-to-digital conversion circuit can perform the first analog-to-digital conversion on the $1^{st}$ second analog signal of the second conversion cycle.

In this way, the range of the analog signal can be preliminarily judged before the start of conversion, and the fed back control signal is generated by the control module to adjust the output of the sampling and conversion module, thereby improving conversion accuracy.

In a possible implementation, for the u-th analog-to-digital conversion of the i-th conversion cycle, the i-th sampling and conversion module outputs the u-th second analog signal based on the first analog signal of the i-th channel and the u-th first control signal, where $1 \leq u \leq U$ and u is an integer;
  the comparator compares the u-th second analog signal with the reference signal to output the first comparison signal of the u-th comparison;
  based on u<U, the control module outputs the (u+1)-th first control signal based on the first comparison signal of the u-th comparison; and
  based on u=U, the control module outputs a first digital signal corresponding to the first analog signal of the i-th channel based on the first comparison signal of the U-th comparison.

For example, in the first and subsequent analog-to-digital conversions of each of the conversion cycles, the analog signal of each of the analog-to-digital conversions needs to be adjusted by the latest outputted first control signal fed back by the control module 403 at the start of each of the analog-to-digital conversions, and then input to the comparator 402 for the analog-to-digital conversion. A first comparison signal, after obtained by the comparator 402, may be input to the control module 403 and stored by the control module 403. The control module 403 may further output a first control signal for the next analog-to-digital conversion according to the received first comparison signal.

In a possible implementation, taking the second conversion cycle as an example, when $1 \leq u \leq U$, after the (u−1)-th comparison in the U analog-to-digital conversions is completed, the control module 403 may output the u-th first control signal according to the (u−1)-th first comparison signal, and the (u−1)-th analog-to-digital conversion is completed. The analog-to-digital conversion circuit starts the u-th analog-to-digital conversion.

In a possible implementation, the sampling and conversion module 4012 may output the u-th second analog signal according to the u-th first control signal. The comparator 402 may compare the u-th second analog signal with the reference voltage $V_{REF}$ to output the u-th first comparison signal. The control module may output the (u+1)-th first control signal according to the u-th first comparison signal, and the u-th analog-to-digital conversion is completed.

In a possible implementation, after a plurality of analog-to-digital conversions in the second conversion cycle are completed, the comparator 402 completes a total of U comparisons, and outputs U first comparison signals to the control module 403. The control module 403 may calculate a final first digital signal $Vout_2$ from the U first comparison signals and output it to the external circuit, and thus the second conversion cycle ends.

In this way, a successive approximation on the first analog signal can be achieved by U analog-to-digital conversions, thereby improving conversion accuracy.

In a possible implementation, the i-th sampling and conversion module outputting the u-th second analog signal based on the first analog signal of the i-th channel and the u-th first control signal includes:
  based on u>1, controlling opened/closed states of a set of first hold switches connected to the u-th first sampling capacitor according to the u-th first control signal, so that the other terminal of the u-th first sampling capacitor is connected to the device voltage VDD or the ground GND, and one terminal of the u-th first sampling capacitor outputs the u-th second analog signal.

For example, in each of the conversion cycles, in the process of the $1^{st}$ to U-th analog-to-digital conversion, a second analog signal for this analog-to-digital conversion needs to be obtained by the first control signal output by the control module in the previous analog-to-digital conversion. Taking the second analog-to-digital conversion (u=2) in the second conversion cycle as an example, at the start of the second analog-to-digital conversion, the sampling and conversion module 4012 inputs the 2nd first control signal output by the first analog-to-digital conversion. The 2nd first control signal may include information for controlling the DC potential connected at the other terminal of the second sampling capacitor, which controls the other terminal of the second sampling capacitor to connect to the ground GND or the device voltage VDD.

In this case, a 2nd second analog signal is output at one terminal of the 2nd first sampling capacitor; the 2nd second analog signal is input to the comparator 402 and is then compared with the reference voltage to output a first comparison signal of the 2nd comparison; the first comparison signal of the 2nd comparison is input to the control module, which may output a next (i.e., a 3rd) first control signal according to the 2nd first comparison signal, and thus the 2nd analog-to-digital conversion is ended.

In this way, the capacitor array of the sampling and conversion module can be controlled by the control signal fed back by the control module to perform a conversion on the first analog signal, thereby achieving successive approximation on the analog signal and improving conversion efficiency and conversion accuracy.

In a possible implementation, the control module outputting the (u+1)-th first control signal based on the first comparison signal of the u-th comparison includes:
  in response to the first comparison signal of the u-th comparison being 1, outputting the (u+1)-th first control signal to connect the other terminal of the (u+1)-th first sampling capacitor in the i-th sampling and conversion module to the ground GND in the (u+1)-th analog-to-digital conversion; and in response to the first comparison signal of the u-th comparison being 0, outputting the (u+1)-th first control signal to connect the other terminal of the (u+1)-th first sampling capacitor in the i-th sampling and conversion module to the device voltage VDD in the (u+1)-th analog-to-digital conversion.

Taking the second conversion cycle as an example, in the first to U-th analog-to-digital conversions, the control module 403 may output a first control signal based on the first comparison signal output each time by the comparator 402, and the first control signal may be used to control DC voltages connected at the other terminal of the U first sampling capacitors.

In a possible implementation, taking the first analog-to-digital conversion of the second conversion cycle as an example, in the first analog-to-digital conversion, the comparator 402 performs the first comparison to obtain a $1^{st}$ first comparison signal. The control module may output a 2nd first control signal according to the $1^{st}$ first comparison signal, where the 2nd first control signal is used to connect the other terminal of the second first sampling capacitor $C_{122}$ of the capacitor array $C_{12}$ to the device voltage VDD or the ground GND in the second analog-to-digital conversion.

In a possible implementation, when the first comparison signal of the first comparison is 1, the 2nd first control signal may connect the other terminal of the 2nd first sampling capacitor of the U first sampling capacitors to the ground GND. When the first comparison signal of the first comparison is 0, the 2nd first control signal may connect the other terminal of the 2nd first sampling capacitor of the U first sampling capacitors to the device voltage VDD. By analogy, when the first comparison signal of the u-th comparison is 1, the control module 403 may output the (u+1)-th first control signal, and may control the other terminal of the (u+1)-th first sampling capacitor of the sampling and conversion module 4012 to be connected to the ground GND according to the (u+1)-th first control signal, so that the output u-th second analog signal is increased. When the first comparison signal of the u-th comparison is 0, the control module 403 may output the (u+1)-th first control signal, and may control the other terminal of the (u+1)-th first sampling capacitor of the second sampling and conversion module 4012 to be connected to the ground VDD according to the (u+1)-th first control signal, so that the output u-th second analog signal may be reduced.

In this way, a second analog signal output in the next conversion by the sampling and conversion module can be adjusted by the control signal generated by the control module in this analog-digital conversion, thereby realizing successive approximation on the analog signal.

In a possible implementation, the control module outputting the first digital signal corresponding to the first analog signal of the i-th channel based on the first comparison signal of the U-th comparison includes:

calculating a weighted sum of the first comparison signals of the U comparisons according to weighted values of the U first sampling capacitors in the i-th sampling and conversion module, to obtain the first digital signal corresponding to the first analog signal of the i-th channel.

For example, the control module 403 may output a corresponding digital signal according to the U first comparison signals output in each of the conversion cycles. Taking the second conversion cycle as an example, the U first comparison signals output in the second conversion cycle may determine a first digital signal $Dout_2$, i.e., a digital output signal corresponding to the first analog signal $Vin_2$ of the second channel. U weighted values (e.g., $a_1$–$a_U$) may be set for the U first comparison signals (e.g., $D_1$–$D_U$), and a value ($a_1*D_1+a_2*D_2 \ldots +a_U*D_U$) obtained by adding U products of the u-th first comparison signal multiplied by the u-th weighted value is the output first digital signal $Dout_2$.

In this way, a digital signal corresponding to the first analog signal of the i-th channel can be obtained, thereby completing the analog-to-digital conversion process of the i-th conversion cycle.

In a possible implementation, the control module is further configured to:

at the end of the i-th conversion cycle of the analog-to-digital conversion phase, control opened/closed states of the U sets of first hold switches and the first conversion switch of the i-th sampling and conversion module, to clear charge values on the U first sampling capacitors of the i-th sampling and conversion module.

For example, after the capacitor array completes the analog-to-digital conversion of one conversion cycle, charges may be stored on capacitor plates. A reset operation is required to clear the charges that may exist on the capacitor plates to facilitate the next sampling on the input signal.

In a possible implementation, the reset operation may be performed at the end of the conversion cycle of the corresponding channel. Taking the second channel as an example, the first conversion switch of the second sampling and conversion module may be controlled to be opened, and the charges stored on the capacitor array $C_{12}$ are cleared by controlling the switches connected at both terminals of the capacitor array of the second sampling and conversion module such that both terminals of the U sampling capacitors are connected to GND, VDD or other DC voltages at the same time, thereby completing the reset operation once.

In a possible implementation, the step of clearing charges may also be performed after all the input first analog signals of N channels are subjected to analog-to-digital conversion to obtain N digital outputs. Those skilled in the art should understand that, the present disclosure does not limit the specific way of resetting, just make sure that all the charges on the N sampling capacitor arrays are cleared before the next synchronous sampling.

In this way, the resetting of the capacitor array can be realized to sample and hold the next input first analog signals of N channels at the next analog-to-digital conversion, thereby improving sampling accuracy of the first analog signals.

Figure 7:
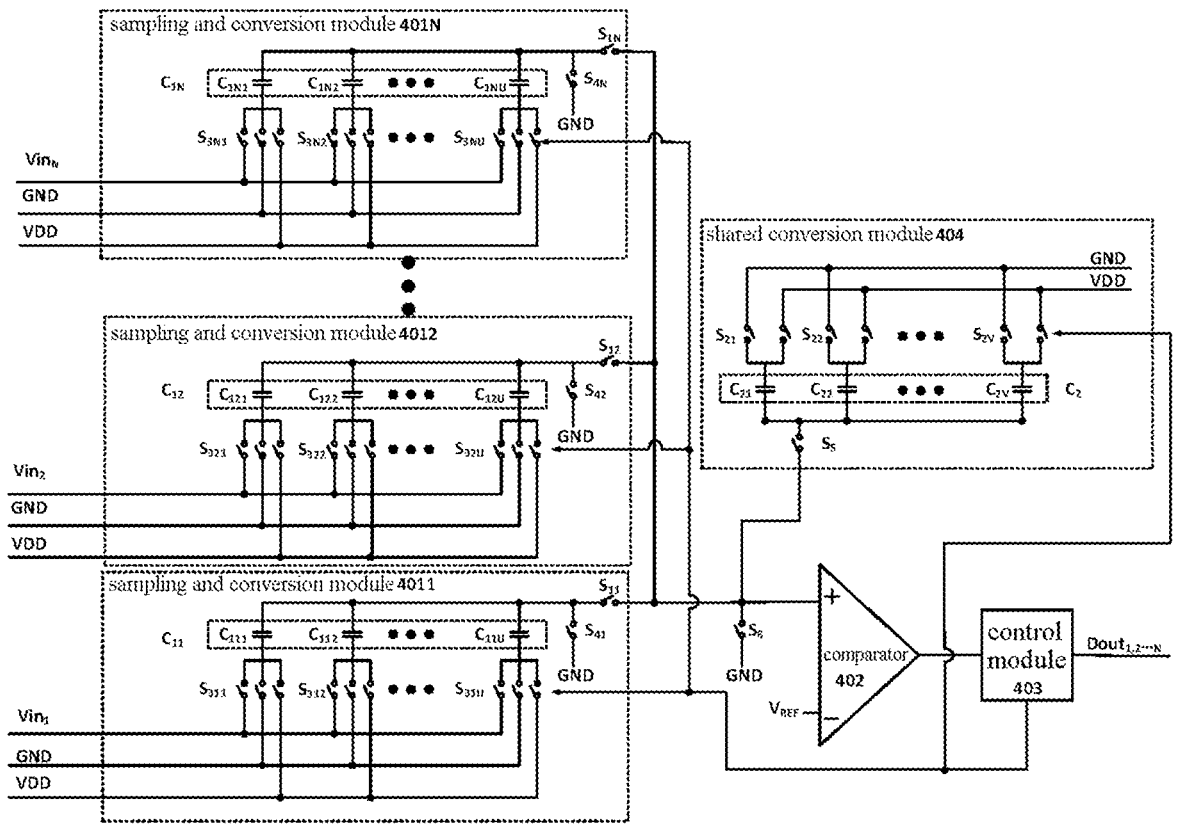
FIG. 7 shows a schematic diagram of an analog-to-digital conversion circuit according to an embodiment of the present disclosure.

FIG. 7 shows a schematic diagram of an analog-to-digital conversion circuit according to an embodiment of the present disclosure. As shown in FIG. 7, the analog-to-digital conversion circuit further includes a shared conversion module configured to convert quantized margin signals of the first analog signals of N channels, the shared conversion module includes V first shared capacitors connected in parallel, V sets of first shared switches, and a second conversion switch, and the shared conversion module is connected respectively to the N sampling and conversion modules and the comparator through the second conversion switch, where V is an integer greater than or equal to 1, where the control module is further configured to control the second conversion switch to open during the first U (times of) analog-to-digital conversions in the i-th conversion cycle of the analog-to-digital conversion phase, and control the second conversion switch to close after the U-th analog-to-digital conversion is completed, and the control module outputs the $1^{st}$ second control signal based on the first comparison signal of the U-th comparison; taking the U-th second analog signal as a quantized margin signal, the analog-to-digital conversion circuit performs V (times of) analog-to-digital conversions on the quantized margin signal in a successive approximation manner.

For example, after U analog-to-digital conversions on the sampling and conversion module of any one of the channels end, the resulting second analog voltage still needs to be further quantized. In this case, a shared conversion module may be added in the analog-to-digital conversion circuit. The shared conversion module 404 may include a capacitor array $C_2$ of V first shared capacitors $C_{21}$-$C_{2V}$ connected in parallel, and may include V analog-to-digital conversions when performing analog-to-digital conversion on a quantized margin signal of a first analog signal of any channel. One terminal of the capacitor array $C_2$ may be connected to the comparator 402 and may also be connected to the ground (GND), device voltage (VDD), or other preset DC potentials (e.g., connected to VDD/2). The other terminal of the capacitor array $C_2$ may be connected to GND or VDD via a corresponding V sets of first shared switches $S_{21}$-$S_{2V}$, respectively, and may also be connected to other preset DC potentials (e.g., connected to VDD/2), where V represents the total number of capacitors in the capacitor array $C_2$. The shared conversion module 404 may also receive feedback from the control module 403, and adjust the voltage connected to the capacitor plate according to the feedback to output different second analog signals.

In a possible implementation, when the second conversion switch $S_5$ is closed, the capacitor array $C_2$ also functions as a DAC in the SAR ADC. One terminal of the capacitor array $C_2$ may be connected to the comparator 402, and the other terminal of the capacitor array $C_2$ may be connected to VDD via a corresponding set of shared switches $S_{21}$-$S_{2V}$, respectively. At this time, a second control signal is input at the input terminal of the shared conversion module, which controls the shared conversion module 404 to complete a digital-to-analog conversion and output a second analog signal. The capacitor array $C_2$ may be in a binary configuration, or may be in other configurations, for example, adding some redundancy. The present disclosure does not limit the way of configuration of the capacitor array $C_2$.

In a possible implementation, in the U-th analog-to-digital conversion, the comparator outputs the first comparison signal of the U-th comparison, in which case the second conversion switch S5 may be closed, so that the control module may output a $1^{st}$ second control signal based on the first comparison signal of the U-th comparison to control the analog-to-digital conversion circuit to perform the (U+1)-th analog-to-digital conversion.

In a possible implementation, a positive input terminal (i.e., a first input terminal) of a comparator in the comparator 402 may be connected to the capacitor array $C_2$ via the second conversion switch $S_5$. When there is a signal output at the output terminal of the shared conversion module 404, the output second analog signal is input to the comparator 402 to be compared with the reference voltage input at a negative input terminal (i.e., a second input terminal) of the comparator 402 to output the first comparison signal. The first comparison signal is a one-bit digital output code having two numeral values of 0 and 1, respectively. When the first comparison signal is 1, it indicates that the input signal at the positive input terminal is larger, and when the first comparison signal is 0, it indicates that the input signal at the negative input terminal is larger.

In a possible implementation, the comparison signal output by the comparator 402 is input to the input terminal of the control module 403, and the control module 403 may output a second control signal to the input terminal of the shared conversion module 404 according to the input first comparison signal, so that the shared conversion module 404 controls the DC potential connected to the other terminal of the first shared capacitor based on the second control signal, thereby adjusting the second analog signal output to the comparator 402 in performing the next comparison.

In a possible implementation, the comparison signal output by the comparator 402 may be stored in the control module 403 after being input to the control module 403. At the end of a plurality of analog-to-digital conversions in each of the conversion cycles, the control module 403 may determine a final first digital signal according to the stored plurality of comparison signals. Taking the second conversion cycle as an example, the plurality of analog-to-digital conversions include not only analog-to-digital conversions performed when the sampling and conversion module 4012 is connected to both the comparator 402 and the control module 403, but also analog-to-digital conversions performed when the shared conversion module 404 is connected to the sampling and conversion module 4012, the comparator 402, and the control module 403. The analog-to-digital conversion circuit may include N conversion cycles, and the control module 403 may, immediately after determining a first digital signal, output it to the external circuit or may, after obtaining N first digital signals $Dout_1$-$Dout_N$, output them to the external circuit together. After all the N first digital signals are output, synchronous sampling and analog-to-digital conversion of the first analog signals $Vin_1$-$Vin_N$ of N channels are finally completed.

In this way, conversion accuracy of analog-to-digital conversion can be further improved.

In a possible implementation, a second control signal is output at a third output terminal of the control module,
for the (U+v)-th analog-to-digital conversion of the i-th conversion cycle, the shared conversion module outputs the (U+v)-th second analog signal according to the quantized margin signal and the v-th second control signal, where 1≤v≤V and v is an integer;
the comparator compares the (U+v)-th second analog signal with the reference signal to output a first comparison signal of the (U+v)-th comparison;
based on v<V, the control module outputs the (v+1)-th second control signal based on the first comparison signal of the (U+v)-th comparison; and
based on v=V, the control module outputs the first digital signal corresponding to the first analog signal of the i-th channel based on the first comparison signal of the (U+V)-th comparison.

For example, (U+V) analog-to-digital conversions are performed in each of the conversion cycles. In the (U+1)-th and subsequent analog-to-digital conversions of each of the conversion cycles, the analog signal for each analog-to-digital conversion needs to be controlled by the second control signal most recently outputted by the control module 403 at the start of the analog-to-digital conversion, and then input to the comparator 402 for analog-to-digital conversion. The (U+1)-th first comparison signal, after obtained by the comparator 402, may be input to the control module 403 and stored by the control module 403. The control module 403 may further output a second control signal for the next analog-to-digital conversion according to the received first comparison signal.

Figure 13:
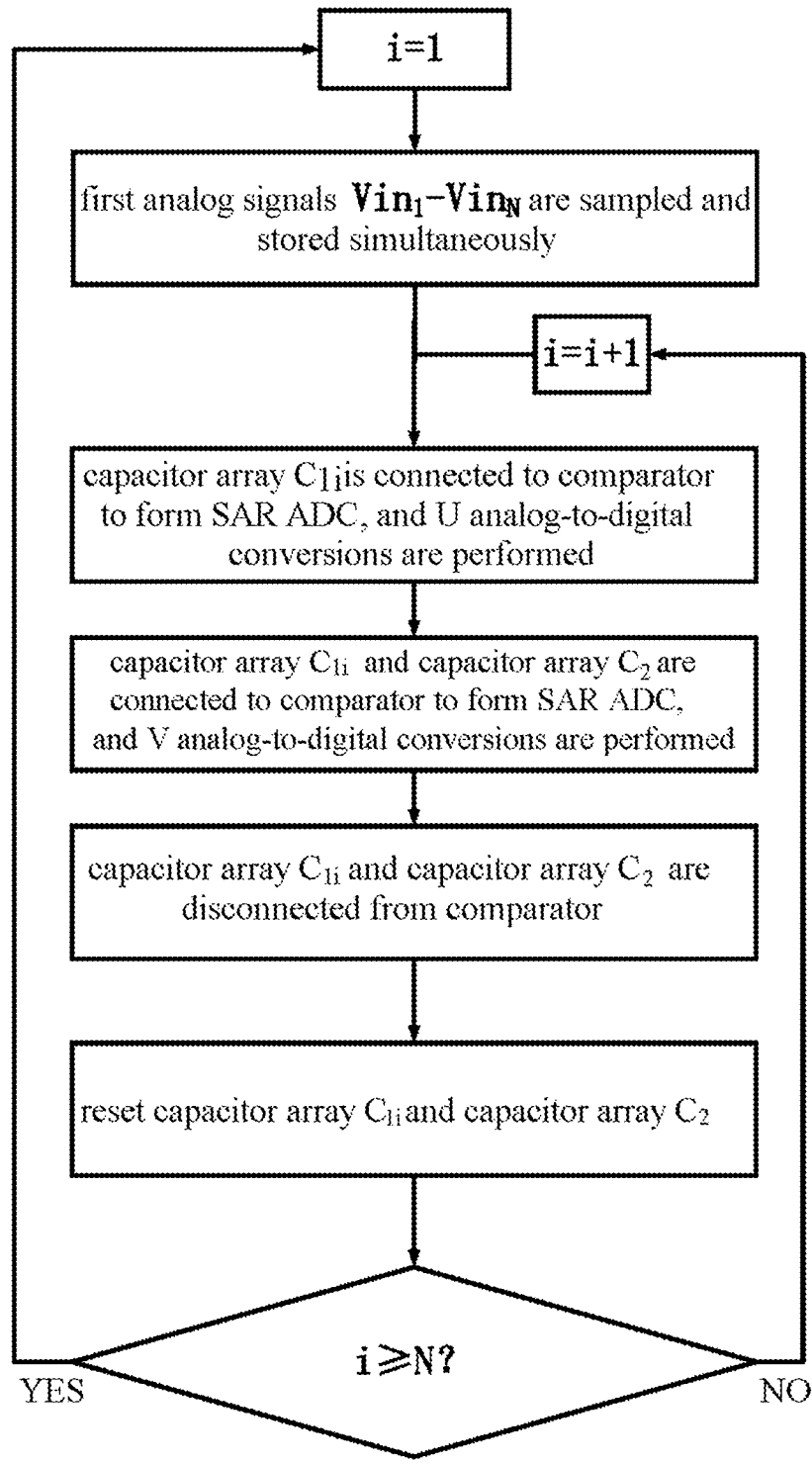
FIG. 13 shows a flowchart of an analog-to-digital conversion performed by an analog-to-digital conversion circuit according to an embodiment of the present disclosure.

FIG. 13 shows a flowchart of analog-to-digital conversion performed by an analog-to-digital conversion circuit according to an embodiment of the present disclosure. As shown in FIG. 13, after the sample-and-hold phase is ended, analog-to-digital conversion may be started from the first channel. The first conversion switch Sit of the first channel may be closed, and the comparator 402 starts a comparison to obtain a first comparison signal. The first comparison signal may be input to the control module 403 and stored in the control module 403. The control module 403 may judge the number of completed analog-to-digital conversions in the first conversion cycle according to the number of the stored first comparison signals. When the control module stores U first comparison signals, the quantization accuracy of the sampling and conversion module may be considered to have reached the maximum, and the second conversion switch of the shared conversion module may be controlled to be closed for further quantization. The comparator 402 continues the comparison to obtain the (U+1)-th to (U+V)-th first comparison signals.

In a possible implementation, taking the second conversion cycle as an example, when 1≤v≤V, after the (U+v−1)-th comparison in the (U+V) analog-to-digital conversions is completed, the control module 403 may output the (U+v)-th second control signal according to the (U+v−1)-th first comparison signal, and the (U+v−1)-th analog-to-digital conversion is then completed. The analog-to-digital conversion circuit starts the (U+v)-th analog-to-digital conversion.

In a possible implementation, the shared conversion module 404 may output the (U+v)-th second analog signal according to the (U+v)-th second control signal. The comparator 402 may compare the (U+v)-th second analog signal with the reference voltage to output the (U+v)-th first comparison signal. The control module may output the (U+v−1)-th second control signal according to the (U+v)-th first comparison signal, and the (U+v−1)-th analog-to-digital conversion is then completed.

In a possible implementation, after a plurality of analog-to-digital conversions in the second conversion cycle are completed, the comparator 402 completes a total of (U+V) comparisons to output (U+V) first comparison signals to the control module 403. The control module 403 may calculate a final first digital signal according to the (U+V) first comparison signals and output it to the external circuit. The second conversion cycle thus ends.

In this way, it is possible to realize successive approximation on the quantized margin signal by the V analog-to-digital conversions, and realize (U+V) conversions on the first analog signal, thereby further improving conversion accuracy.

In a possible implementation, the conversion cycle is determined by the order of the channels. That is, after the first conversion cycle ends, the second conversion cycle starts, and so on. The control module 403 may perform analog-to-digital conversion on the first analog signals $Vin_1$-$Vin_N$ of N channels sequentially by controlling in turn N first conversion switches corresponding to the sampling and analog-to-digital conversion module 4011-401N of N channels and the second conversion switches corresponding to the shared conversion module, to obtain final first digital signals $Dout_1$-$Dout_N$ of N channels.

In a possible implementation, at the end of analog-to-digital conversion of each of the channels, charges on the shared conversion module need to be cleared immediately in order to perform an analog-to-digital conversion of the next channel. Charges on the sampling and conversion module of this channel may be cleared together with the shared conversion module, or may be cleared after the analog-to-digital conversion of N channels is completed, which is not limited by the present disclosure.

In this way, the analog-to-digital conversion on the analog input signals of N channels can be completed sequentially.

In a possible implementation, one terminal of each of the first shared capacitors of the shared conversion module is connected to the second conversion switch, the other terminal each of the first shared capacitors is connected to one terminal of a set of first shared switches, and the other terminal of the set of first shared switches is connected respectively to one of the device voltage VDD, the ground GND, or the preset DC voltage, where the shared conversion module outputting the (U+v)-th second analog signal according to the quantized margin signal and the v-th second control signal includes:

controlling opened/closed states of a set of first shared switches connected to a v-th first shared capacitor according to the v-th second control signal, so that the other terminal of the v-th first shared capacitor is connected to the device voltage VDD or the ground GND, and the (U+v)-th second analog signal is output at one terminal of the v-th first shared capacitor.

For example, in each of the conversion cycles, in the process of the (U+1)-th to (U+V)-th analog-to-digital conversions, the second analog signal for this analog-to-digital conversion needs to be obtained by the second control signal output by the control module 404 in the previous analog-to-digital conversion. Taking the (U+2)-th analog-to-digital conversion in the second conversion cycle as an example, at the start of the (U+2)-th analog-to-digital conversion, the shared conversion module 404 inputs the 2nd second control signal output by the (U+1)-th analog-to-digital conversion. The (U+2)-th second control signal may include information for controlling the DC potential connected to the other terminal of the 2nd first shared capacitor, where if the (U+1)-th first comparison signal output by the comparator 402 in the (U+1)-th analog-to-digital conversion is 0, the 2nd second control signal controls the other terminal of the 2nd first shared capacitor to be connected to the ground GND, and if the (U+1)-th first comparison signal output by the comparator 402 in the (U+1)-th analog-to-digital conversion is 1, the 2nd second control signal controls the other terminal of the 2nd first shared capacitor to be connected to the device voltage VDD. After the 2nd second control signal is output, the (U+2)-th analog-to-digital conversion ends.

In this way, the capacitor array of the shared conversion module can be controlled by the control signal fed back by the control module to convert the quantized margin signal, thereby realizing successive approximation on the quantized margin signal.

In a possible implementation, the control module outputting the (v+1)-th second control signal based on the first comparison signal of the (U+v)-th comparison includes:

in response to the first comparison signal of the (U+v)-th comparison being 1, outputting the (v+1)-th second control signal, so that the other terminal of the (v+1)-th first shared capacitor in the shared conversion module is connected to the ground GND in the (U+v+1)-th analog-to-digital conversion, and in response to the first comparison signal of the (U+v)-th comparison being 0, outputting the (v+1)-th second control signal, so that the other terminal of the (v+1)-th first shared capacitor in the shared conversion module is connected to the device voltage VDD in the (U+v+1)-th analog-to-digital conversion.

For example, in the (U+1)-th to (U+V)-th analog-to-digital conversions of each of the conversion cycles, the control module 403 may output a second control signal based on the first comparison signal output by the comparator 402 each time, and the second control signal may be used to control the DC voltages connected to the other terminals of the V first shared capacitors.

In a possible implementation, taking the (U+1)-th analog-to-digital conversion of the second conversion cycle as an example, the comparator 402 performs the (U+1)-th comparison in the (U+1)-th analog-to-digital conversion to obtain the (U+1)-th first comparison signal. The control module may output a 2nd second control signal according to the (U+1)-th first comparison signal, where the 2nd second control signal is used to connect the other terminal of the 2nd first shared capacitor of the capacitor array $C_2$ to the device voltage VDD or the ground GND in the second analog-to-digital conversion.

In a possible implementation, when the first comparison signal of the (U+1)-th comparison is 1, the 2nd second control signal may connect the other terminal of the second first shared capacitor of the V first shared capacitors to the ground GND. When the first comparison signal of the (U+1)-th comparison is 0, the 2nd second control signal may connect the other terminal of the second first shared capacitor of the V first shared capacitors to the device voltage VDD. By analogy, when the first comparison signal of the (U+v)-th comparison is 1, the control module 403 may output the (v+1)-th second control signal, which may control the other terminal of the (v+1)-th first shared capacitor of the shared conversion module to be connected to the ground GND so that the output (U+v+1)-th second analog signal is increased. When the first comparison signal of the (U+v)-th comparison is 0, the control module 403 may output the (v+1)-th second control signal, which may control the other terminal of the (v+1)-th first shared capacitor of the shared conversion module to be connected to the device voltage VDD so that the output (U+v+1)-th second analog signal is reduced.

In this way, the signal output by the shared conversion module in the next conversion can be adjusted by the control signal generated by the control module in this analog-to-digital conversion, thereby realizing successive approximation on the quantized margin signal.

In a possible implementation, the control module outputting the first digital signal corresponding to the first analog signal of the i-th channel based on the first comparison signal of the (U+V)-th comparison includes:

calculating a weighted sum of the first comparison signals of the (U+V) comparisons according to weighted values of the U first sampling capacitors in the i-th sampling and conversion module and weighted values of the V first shared capacitors in the shared conversion module, to obtain the first digital signal corresponding to the first analog signal of the i-th channel.

For example, the control module 403 may, according to the (U+V) first comparison signals output in each of the conversion cycles, determine a first digital signal, i.e., a digital output signal corresponding to the first analog signal of each of the channels. Taking the second conversion cycle as an example, U weighted values (e.g., $a_1$-$a_U$) may be set for the 1st to U-th first comparison signals (e.g., $D_1$-$D_U$), V weighted values (e.g., $a_{U+1}$-$a_{U+V}$) may be set for the (U+1)-th to (U+V)-th first comparison signals (e.g., $D_{U+1}$-$D_{U+V}$), and a value $(a_1*D_1+a_2*D_2 \ldots +a_{U+V}*D_{U+V})$ obtained by adding (U+V) products of each of the first comparison signals multiplied by a corresponding weighted value is the output first digital signal.

In this way, a digital signal corresponding to the first analog signal of the i-th channel can be obtained, thereby completing the process of an analog-to-digital conversion of the i-th conversion cycle.

In a possible implementation, the control module is further configured to:

at an end of the i-th conversion cycle of the analog-to-digital conversion phase, control opened/closed states of the V sets of first shared switches and the second conversion switch in the shared conversion module, to clear charge values on the V first shared capacitors.

For example, after the capacitor array $C_2$ completes the analog-to-digital conversion of one conversion cycle, there may be charges stored on capacitor plates. A reset operation is required to clear the charges that may exist on the capacitor plates, so as to facilitate the analog-to-digital conversion on the quantized margin signal of the first analog signal of another channel by connecting another sampling and conversion module next time. The reset operation may be performed at the end of each of the conversion cycles. The charges stored on the capacitor array $C_2$ are cleared by controlling switches connected at both terminals of the capacitor array of the shared conversion module such that both terminals of the U shared capacitors are connected to GND, VDD or other DC voltages at the same time, thereby completing the reset operation once.

In this way, capacitor array can be reset in order to sample the quantized margin signal in the next conversion cycle and improve sampling accuracy of the quantized margin signal.

Figure 8:
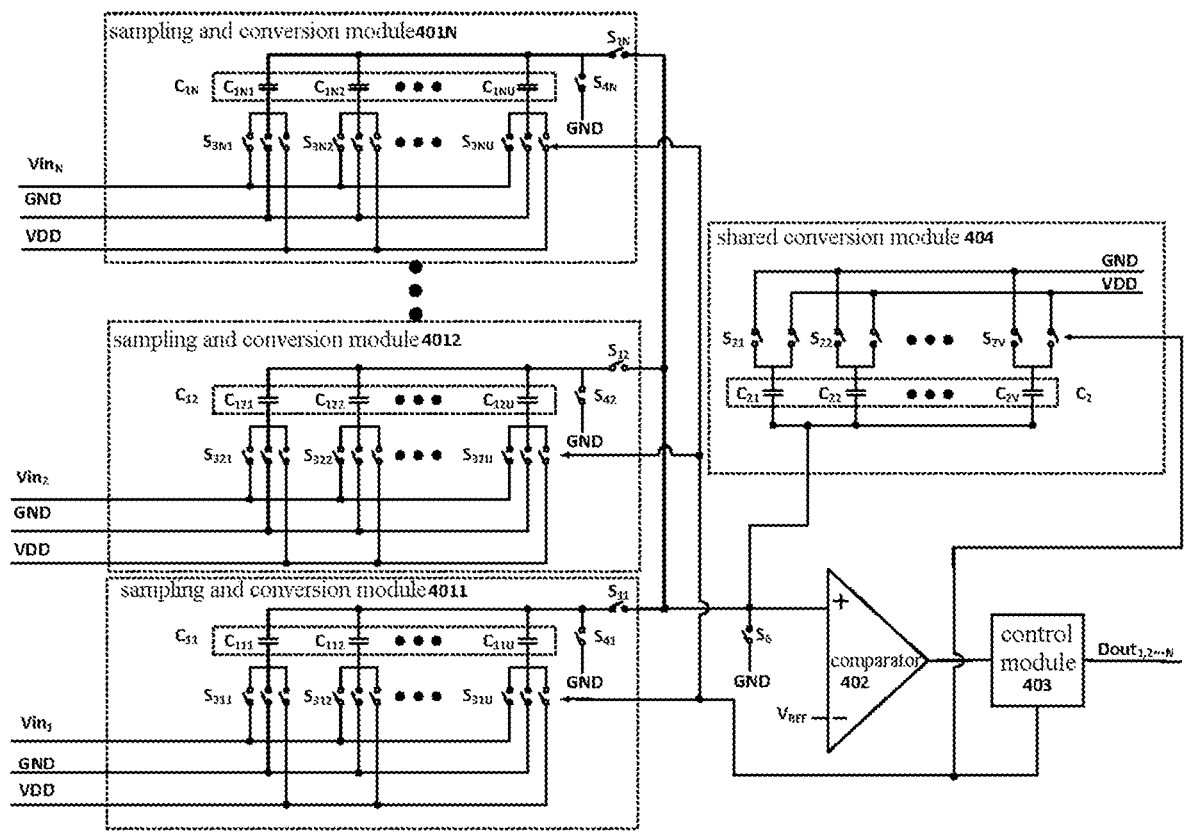
FIG. 8 shows a schematic diagram of an analog-to-digital conversion circuit according to an embodiment of the present disclosure.

FIG. 8 shows a schematic diagram of an analog-to-digital conversion circuit according to an embodiment of the present disclosure. As shown in FIG. 8, the analog-to-digital conversion circuit further includes a shared conversion module configured to convert quantized margin signals of the first analog signals of N channels, the shared conversion module includes V first shared capacitors and V sets of first shared switches, and the shared conversion module is connected respectively to the N sampling and conversion modules and the comparator, where V is an integer greater than or equal to 1, where the control module is further configured to: take the U-th second analog signal as a quantized margin signal; and during the (U+1)-th to (U+V)-th analog-to-digital conversions in the i-th conversion cycle of the analog-to-digital conversion phase, control opened/closed states of the V sets of first shared switch in the shared conversion module, to perform V analog-to-digital conversions on the quantized margin signal of the i-th channel in a successive approximation manner.

For example, after U analog-to-digital conversions of the sampling and conversion module of each of the channels end, the resulting second analog signal still needs to be further quantized. In this case, a shared conversion module may be added in the analog-to-digital conversion circuit.

In a possible implementation, the shared conversion module 404 includes a capacitor array $C_2$ of V capacitors connected in parallel, and may include V analog-to-digital conversions when performing analog-to-digital conversions on the quantized margin signal of each of the channels.

One terminal of the capacitor array $C_2$ may be connected to the comparator 402, and may also be connected to ground (GND), device supply (VDD), or other preset DC potentials (e.g., connected to VDD/2). The other terminal of the capacitor array $C_2$ may be connected respectively to GND or VDD via a corresponding V sets of shared switches $S_{21}$-$S_{2V}$, and may also be connected to other preset DC potentials (e.g., connected to VDD/2), where V represents the total number of capacitors in the capacitor array $C_2$. The shared conversion module 404 may also receive feedback from the control module 403 and adjust the voltage connected to the capacitor plate according to the feedback to output different second analog signals.

In a possible implementation, the capacitor array $C_2$ also functions as a DAC in the SAR ADC. One terminal of the capacitor array $C_2$ may be connected to the comparator 402, and the other terminals of the capacitor array $C_2$ may be connected to VDD via a corresponding set of shared switches $S_{21}$-$S_{2V}$, respectively. At this time, a second control signal is input at an input terminal of the shared conversion module, and the second control signal controls the shared conversion module 404 to complete a digital-to-analog conversion to output a second analog signal. The capacitor array $C_2$ may be configured in a binary configuration, or may be in other configurations, for example, adding some redundancy. The present disclosure does not limit the way of configuration of the capacitor array $C_2$.

In a possible implementation, a positive input terminal (i.e., a first input terminal) of the comparator in the comparator 402 may be connected to the capacitor array $C_2$, and when there is a signal output at an output terminal of the shared conversion module 404, the output second analog signal is input to the comparator 402 to be compared with a reference voltage input at a negative input terminal (i.e., a second input terminal) of the comparator 402 to output the first comparison signal. The first comparison signal is a one-bit digital output code having two numerical values of 0 and 1, respectively. When the first comparison signal is 1, it indicates that the input signal at the positive input terminal is larger, and when the first comparison signal is 0, it indicates that the input signal at the negative input terminal is larger.

In a possible implementation, the comparison signal output by the comparator 402 is input to the input terminal of the control module 403, and the control module 403 may output a second control signal to the input terminal of the shared conversion module 404 according to the input first comparison signal, so that the shared conversion module 404 controls the DC potential connected to the other terminal of the shared capacitor based on the second control signal, thereby adjusting the second analog signal output to the comparator 402 in performing the next comparison.

In a possible implementation, the comparison signal output by the comparator 402 may be input to the control module 403 and then stored in the control module 403. At the end of (U+V) analog-to-digital conversions in each of the conversion cycles, the control module 403 may determine a final first digital signal according to the stored (U+V) comparison signals. Taking the second conversion cycle as an example, the (U+V) analog-to-digital conversions include not only U analog-to-digital conversions performed when the sampling and conversion module 4012 is connected to the comparator 402 and the control module 403, but also V analog-to-digital conversions performed when the shared conversion module 404 is connected to the sampling and conversion module 4012, the comparator 402 and the control module 403. The analog-to-digital conversion circuit may include N conversion cycles, and the control module 403 may, immediately after determining a first digital signal, output it to the external circuit or may, after obtaining N first digital signals $Dout_1$-$Dout_N$, output them to the external circuit together. After all the N first digital signals are output, synchronous sampling and analog-to-digital conversion of the first analog signals $Vin_1$-$Vin_N$ of N channels are finally completed.

In this way, conversion accuracy of analog-to-digital conversion can be further improved.

In a possible implementation, a second control signal is output at a third output terminal of the control module, at an end of the U-th analog-to-digital conversion of the i-th conversion cycle, the i-th sampling and conversion module outputs the U-th second analog signal;
  the shared conversion module charges the V first shared capacitors according to the U-th second analog signal;
  the comparator outputs the U-th first comparison signal; and
  the control module outputs the 1st second control signal according to the U-th first comparison signal.

For example, in the first U conversion processes of each of the conversion cycles, V sets of first shared switches in the shared conversion module are opened, and the first control signal output by the control module does not control the opened/closed state of the first shared switch, and thus the shared conversion module does not participate in the first U analog-to-digital conversions. The shared conversion module is directly connected to the comparator, and the sampling and conversion module is also connected to the comparator through the first conversion switch. Therefore, the shared conversion module can acquire charges on the sampling capacitors of the sampling and conversion module, and charge the V first shared capacitors. At the end of the U-th analog-to-digital conversion, the charge acquired by the shared conversion module is the quantized margin signal of the first analog signal of the corresponding channel.

In a possible implementation, the control module 403 may output the 1st second control signal according to a result (i.e., the U-th first comparison signal) of, by the comparator, comparing comparator the U-th second analog signal with the reference voltage $V_{REF}$, so that the shared conversion module 404 may output the (U+1)-th second analog signal according to the 1st second control signal, and perform the (U+1)-th analog-to-digital conversion on the (U+1)-th second analog signal.

In this way, conversion accuracy of analog-to-digital conversion can be further improved.

In a possible implementation, during the (U+1)-th to (U+V)-th analog-to-digital conversion of the i-th conversion cycle in the analog-to-digital conversion phase, a second control signal is output to control the opened/closed states of the V sets of first shared switches in the shared conversion module so that V analog-to-digital conversions are performed on the quantized margin signal of the i-th channel in a successive approximation manner.

For example, V capacitors of the capacitor array $C_2$ may be used to successively approximate the voltage input to the positive input terminal of the comparator to the reference voltage. Taking the second conversion cycle corresponding to the second channel as an example, when the second sampling and conversion module is connected to the comparator, the other terminal of the V sampling capacitors in the capacitor array $C_2$ may be connected to VDD by closing V switches connected to VDD in the V sets of the first shared switches. In a process of outputting the U-th second analog signal from the sampling and conversion module to the end of the (U+V)-th analog-to-digital conversion, the control module outputs a total of V first control signals, and the (U+v)-th output first control signal may control the DC voltage connected to one terminal of the v-th sampling capacitor, so that the voltage input to the positive input terminal of the comparator successively approximates the reference voltage by performing a plurality of analog-to-digital conversions in one conversion cycle.

In this way, the analog-to-digital conversion circuit may perform an analog-to-digital conversion on the quantized margin signal in a successive approximation manner.

In a possible implementation, for the (U+v)-th analog-to-digital conversion of the i-th conversion cycle, the shared conversion module outputs the (U+v)-th second analog signal according to the quantized margin signal and the v-th second control signal, where $1 \leq v \leq V$ and v is an integer;

the comparator compares the (U+v)-th second analog signal with the reference signal to output a first comparison signal of the (U+v)-th comparison;

based on $v < V$, the control module outputs the (v+1)-th second control signal based on the first comparison signal of the (U+v)-th comparison; and based on $v = V$, the control module outputs the first digital signal corresponding to the first analog signal of the i-th channel based on the first comparison signal of the (U+V)-th comparison.

For example, (U+V) analog-to-digital conversions are performed in each of the conversion cycles. In the (U+1)-th and subsequent analog-to-digital conversions in each of the conversion cycles, the analog signal for each of the analog-to-digital conversions needs to be controlled by the second control signal most recently outputted by the control module 403 at the start of each of the analog-to-digital conversions, and then input to the comparator 402 for the analog-to-digital conversion. The (U+1)-th first comparison signal, after being obtained by the comparator 40, may be input to the control module 403, and stored by the control module 403. The control module 403 may further output a second control signal for the next analog-to-digital conversion according to the received first comparison signal.

Figure 14:
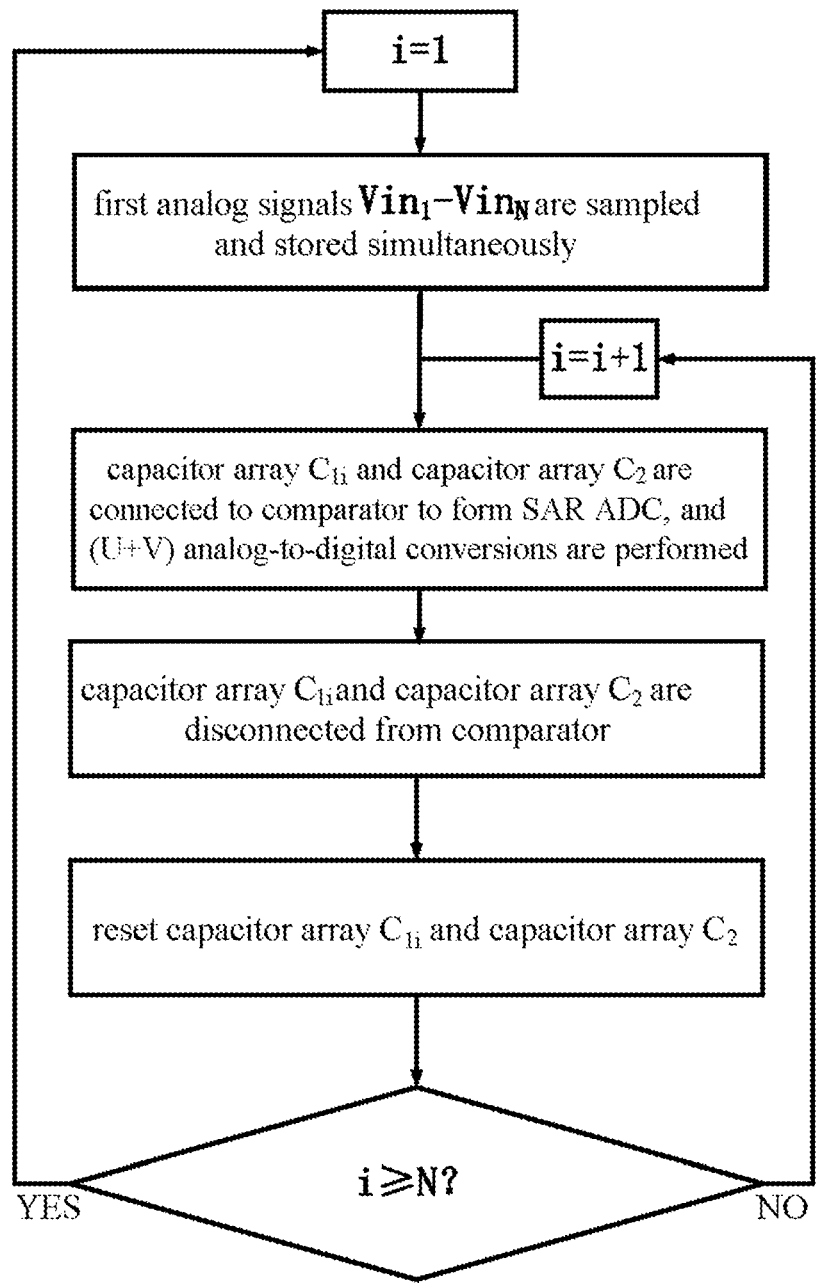
FIG. 14 shows a flowchart of an analog-to-digital conversion performed by an analog-to-digital conversion circuit according to an embodiment of the present disclosure.

FIG. 14 shows a flowchart of an analog-to-digital conversion performed by an analog-to-digital conversion circuit according to an embodiment of the present disclosure. As shown in FIG. 14, after the sample-and-hold phase ends, an analog-to-digital conversion may be started from the first channel. The first conversion switch $S_{11}$ of the first channel may be closed, and the comparator 402 starts a comparison to obtain a first comparison signal. The first comparison signal may be input to the control module 403 and stored in the control module 403. The control module 403 may judge the number of completed analog-to-digital conversions in the first conversion cycle according to the number of stored first comparison signals. When the control module stores U first comparison signals, the quantization accuracy of the sampling and conversion module may be considered to have reached the maximum, and the shared conversion module may be controlled to perform further quantization. The comparator 402 may continue the comparison to obtain the (U+1)-th to (U+V)-th first comparison signals.

In a possible implementation, taking the second conversion cycle as an example, when $1 \leq v \leq V$, after the (U+v−1)-th comparison in the (U+V) analog-to-digital conversions is completed, the control module 403 may output the (U+v)-th second control signal according to the (U+v−1)-th first comparison signal, and thus the (U+v−1)-th analog-to-digital conversion is completed. The analog-to-digital conversion circuit starts the (U+v)-th analog-to-digital conversion.

In a possible implementation, the shared conversion module 404 may output the (U+v)-th second analog signal according to the (U+v)-th second control signal, to perform the (U+v)-th analog-to-digital conversion on the (U+v)-th second analog signal. The comparator 402 may compare the (U+v)-th second analog signal with the reference voltage to output the (U+v)-th first comparison signal, and the control module may output the (U+v+1)-th first control signal according to the (U+v)-th first comparison signal, and thus the (U+v)-th analog-to-digital conversion is completed.

In a possible implementation, after a plurality of analog-to-digital conversions in the second conversion cycle are completed, the comparator 402 completes a total of (U+V) comparisons to output (U+V) first comparison signals to the control module 403. The control module 403 may calculate a final first digital signal from the (U+V) first comparison signals and output it to the external circuit, and then the second conversion cycle ends.

In this way, a successive approximation on the quantized margin signal can be realized by the V analog-to-digital conversions, and (U+V) conversions on the first analog signal can be realized, thereby further improving conversion accuracy.

In a possible implementation, the conversion cycle is determined by the order of the channels. That is, after the first conversion cycle ends, the second conversion cycle starts, and so on. The control module 403 may perform an analog-to-digital conversion on the first analog signals $Vin_1$-$Vin_N$ of N channels sequentially by controlling in turn N first conversion switches corresponding to the sampling and analog-to-digital conversion module 4011-401N of N channels, to obtain final first digital signals $Dout_1$-$Dout_N$ of N channels.

In a possible implementation, at the end of an analog-to-digital conversion of each of the channels, charges on the shared conversion module needed to be cleared immediately in order to perform an analog-to-digital conversion of the next channel. Charges on the sampling and conversion module of this channel may be cleared together with the shared conversion module, or may be cleared after the analog-to-digital conversion of N channels is completed, which is not limited by the present disclosure.

In this way, the analog-to-digital conversions on the analog input signals of N channels can be completed sequentially.

Figure 9:
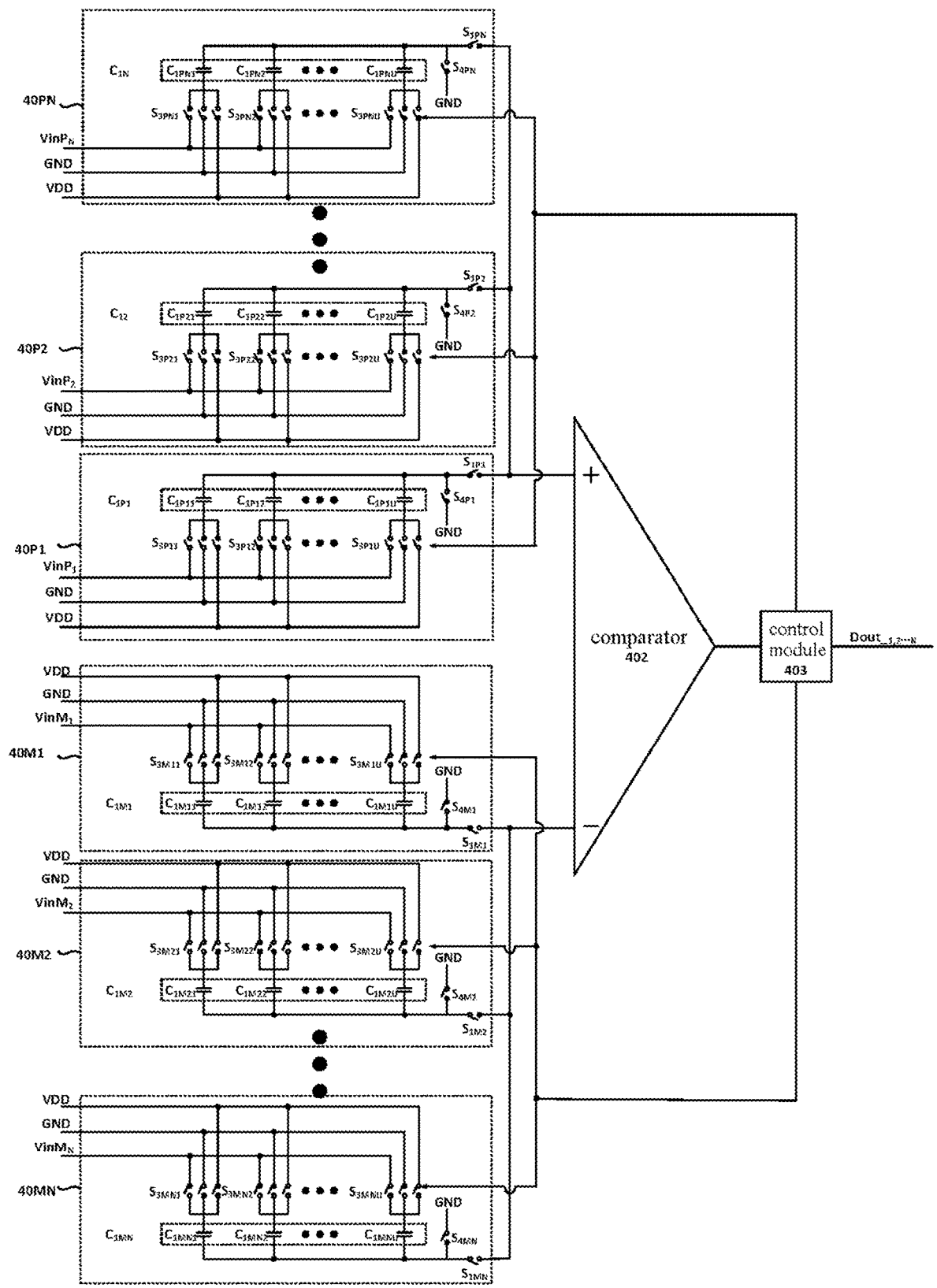
FIG. 9 shows a schematic diagram of an analog-to-digital conversion circuit according to an embodiment of the present disclosure.

FIG. 9 shows a schematic diagram of an analog-to-digital conversion circuit according to an embodiment of the present disclosure. As shown in FIG. 9, in response to the first analog signals of N channels including differential signals, each of the sampling and conversion modules includes a positive sampling and conversion unit and a negative sampling and conversion unit, the positive sampling and conversion unit including U second sampling capacitors connected in parallel, U sets of second hold switches, and a third conversion switch, and the negative sampling and conversion unit including U third sampling capacitors connected in parallel, U sets of third hold switches, and a fourth conversion switches, where U is an integer greater than or equal to 1, a positive first analog signal of a channel corresponding to the positive sampling and conversion unit is input at a first input terminal of the positive sampling and conversion unit, a positive first control signal is input at a second input terminal thereof, and a positive second analog signal is output to the comparator in response to the third conversion switch being closed, a negative first analog signal of a channel correspond to the negative sampling and conversion unit is input at a first input terminal of the negative sampling and conversion unit, a negative first control signal is input at a second input terminal thereof, and a negative second analog signal is output to the comparator in response to the fourth conversion switch being closed, a positive second analog signal is input at a first input terminal of the comparator, a negative second analog signal is input at a second input terminal thereof, and a second comparison signal is output at an output terminal thereof, the second comparison signal is input at an input terminal of the control module, a converted second digital signal is output at a first output terminal thereof, a positive first control signal is output at a second output terminal thereof, and a negative first control signal is output at a third output terminal thereof, where one terminal of each of the second sampling capacitors in the positive sampling and conversion unit is connected to the third conversion switch, the other terminal thereof is connected to one terminal of a set of second hold switches, and the other terminal of the set of second hold switches is connected respectively to one of the positive first analog signal, a device voltage VDD, a ground GND, or a preset DC voltage, and one terminal of each of the third sampling capacitors in the negative sampling and conversion unit is connected to the fourth conversion switch, the other terminal thereof is connected to one terminal of a set of third hold switches, the other terminal of the set of third hold switches is connected to one of the negative first analog signal, the device voltage VDD, the ground GND, or the preset DC voltage, respectively.

For example, any one of the sampling and conversion modules may be composed of two sampling and conversion units, respectively, for sampling the differential signal of the corresponding input channel. Taking the second channel as an example, the second channel may correspond to a positive sampling and conversion unit 40P2 and a negative sampling and conversion unit 40M2 in the second sampling and conversion module 4012, where the position sampling and conversion unit may include a capacitor array $C_{1P2}$ of U second sampling capacitors $C_{1P21}$-$C_{1P2U}$ connected in parallel, the negative sampling and conversion unit may include a capacitor array $C_{1M2}$ of U second sampling capacitors $C_{1M21}$-$C_{1M2U}$ connected in parallel, and the capacitor array $C_{1P2}$ and the capacitor array $C_{1M2}$ correspond to a positive first analog signal $VinM_2$ and a negative first analog signal $VinP_2$ of the second channel, respectively. The positive first analog signal and the negative first analog signal are analog input signals in a differential form. In a differential system, a third conversion switch $S_{1P2}$ may selectively connect the capacitor array $C_{1P2}$ to the comparator 402, and a fourth conversion switch $S_{1M2}$ may selectively connect the capacitor array $C_{1M2}$ to the comparator 402, where N represents the total number of channels.

In a possible implementation, one terminals of the capacitor array $C_{1P2}$ and the capacitor array $C_{1M2}$ may be connected to the comparator 402, and may also be connected to ground (GND), device supply (VDD), or other preset DC potentials (e.g., connected to VDD/2). The other terminal of the capacitor array $C_{1P2}$ may be connected respectively to a positive first analog signal via a corresponding plurality of sets of second hold switches $S_{3P21}$-$S_{3P2U}$, and may also be connected to GND, VDD, or other preset DC potentials (e.g., connected to VDD/2). The other terminal of the capacitor array $C_{1M2}$ may be connected respectively to a negative first analog signal via a corresponding plurality of sets of third hold switches $S_{3M21}$-$S_{3M2U}$, and may also be connected to GND, VDD, or other preset DC potentials (e.g., connected to VDD/2), where the total number of second sampling capacitors in the capacitor array $C_{1P2}$ is the same as the total number of third sampling capacitors in the capacitor array $C_{1M2}$, and may be indicated by U. The positive sampling and conversion unit and the negative sampling and conversion unit may further receive feedback from the control module 403, and adjust the voltage connected to the capacitor according to the feedback to output different positive second analog signal and negative second analog signal. The positive second analog signal and the negative second analog signal are signals received respectively at the positive and negative input terminals of the comparator.

In a possible implementation, when the third conversion switch $S_{1P2}$ is closed, the capacitor array $C_{1P2}$ also functions as a DAC in the SAR ADC. One terminal of the capacitor array $C_{1P2}$ may be connected to the comparator 402, and the other terminal of the capacitor array $C_{1P2}$ may be connected respectively to the input signal $VinP_2$ via the corresponding hold switches $S_{3P21}$-$S_{3P2U}$. At this time, a positive first analog signal $VinP_2$ of a corresponding channel is input at the first input terminal, and a positive first control signal is input at the second input terminal, and the positive first control signal controls the positive sampling and conversion unit to complete a digital-to-analog conversion, to output a positive second analog signal. The capacitor array $C_{1P2}$ may be in a binary configuration, or may be in other configurations, such as adding some redundancy. The present disclosure does not limit the specific way of configuration of the capacitor array $C_{1P1}$.

In a possible implementation, when the fourth conversion switch $S_{1M2}$ is closed, the capacitor array $C_{1M2}$ also functions as a DAC in the SAR ADC. One terminal of the capacitor array $C_{1M2}$ may be connected to the comparator 402, and the other terminal of the capacitor array $C_{1M2}$ may be connected respectively to the input signal $VinM_2$ via the corresponding hold switches $S_{3M21}$-$S_{3M2U}$. At this time, a negative first analog signal $VinM_2$ of a corresponding channel is input at the first input terminal, and a negative first control signal is input at the second input terminal, and the negative first control signal controls the negative sampling and conversion unit to complete a digital-to-analog conversion, to output a negative second analog signal. The capacitor array $C_{1M2}$ may be in the same configuration as that of the capacitor array $C_{1P2}$. The present disclosure does not limit the specific way of configuration of the capacitor array $C_{1M2}$.

In a possible implementation, the comparator 402 may include a comparator. Taking the second channel as an example, a positive input terminal (i.e., a first input terminal) of the comparator may be connected to the capacitor array $C_{1P2}$ through the third conversion switch $S_{1P2}$ of the second channel, and the output positive second analog signal is input to the comparator 402 when there is a signal output at an output terminal of the positive sampling and conversion unit. A negative input terminal (i.e., a second input terminal) of the comparator may be connected respectively to the capacitor array $C_{1M2}$ via the fourth conversion switch $S_{1M2}$ of the second channel, and the output negative second analog signal is input to the comparator 402 when there is a signal output at the output terminal of the negative sampling and conversion unit. The positive second analog signal is compared with the negative second analog signal to output a second comparison signal. The second comparison signal is a one-bit digital output code having two numerical values of 0 and 1, respectively. When the second comparison signal is 1, it indicates that the input signal at the positive input terminal is larger, and when the second comparison signal is 0, it indicates that the input signal at the negative input terminal is larger.

In a possible implementation, the comparison signal output by the comparator 402 is input to the input terminal of the control module 403. The control module 403 may, according to the input second comparison signal, output a positive first control signal to the input terminal of the positive sampling and conversion unit, so that the positive sampling and conversion unit controls the DC potential connected to the other terminal of the second sampling capacitor based on the positive first control signal; at the same time, output a negative first control signal to the input terminal of the negative sampling and conversion unit, so that the negative sampling and conversion unit controls the DC potential connected to the other terminal of the third sampling capacitor based on the negative first control signal, thereby adjusting the positive second analog signal and the negative second analog signal output to the comparator 402 in performing the next comparison.

In a possible implementation, the comparison signal output by the comparator 402 may be stored in the control module 403 after being input to the control module 403, and the control module 403 may determine a final second digital signal Dout 2 based on the stored plurality of comparison signals at the end of the plurality of analog-to-digital conversions of the second conversion cycle. The analog-to-digital conversion circuit may include N conversion cycles, and the control module 403 may, immediately after determining a second digital signal, output it to the external circuit, or may, after obtaining N second digital signals $Dout_{\_1}$-$Dout_{\_N}$, output them to the external circuit together. After all the N second digital signals are output, synchronous sampling and analog-to-digital conversion of the positive second analog signal and the negative second analog signal of the N channels are finally completed.

In this way, the analog-to-digital conversion of N input channels can be achieved by a differential structure.

In a possible implementation, the controlling the N sampling and conversion modules to simultaneously sample and hold the input first analog signals of N channels in the sample-and-hold phase includes:

controlling the third conversion switches of the N positive sampling and conversion units and the fourth conversion switches of the N negative sampling and conversion unit to open;

controlling opened/closed states of U sets of second conversion switches in each of the positive sampling and conversion units, so that the other end of the U second sampling capacitors in the positive sampling and conversion unit is connected to the corresponding positive first analog signal; and controlling opened/closed states of the U sets of third conversion switches in each of the negative sampling and conversion units, so that the other terminal of the U second sampling capacitors in the negative sampling and conversion unit is connected to the corresponding negative first analog signal.

For example, the capacitor arrays $C_{1P1}$-$C_{1PN}$ of the N positive sampling and conversion units and the capacitor arrays $C_{1M1}$-$C_{1MN}$ of the N negative sampling and conversion units may simultaneously sample and store the positive first analog signals and the negative first analog signals of N channels, and the sampled signals may be stored in the capacitor arrays $C_{1P1}$-$C_{1PN}$ and the capacitor arrays $C_{1M1}$-$C_{1MN}$ in the form of charges.

In a possible implementation, the positive analog input signal and the negative analog input signal of N channels may be simultaneously sampled and held. One terminals of the capacitor array $C_{1P1}$-$C_{1PN}$ and the capacitor array $C_{1M1}$-$C_{1MN}$ may be disconnected from the comparator through a third conversion switch and a fourth conversion switch, so that the N sampling and analog-to-digital conversion modules are independent of the other modules. One terminal of each capacitor array may be grounded and one of the second hold switch and third hold switch connected to the positive or negative first analog signal may be closed, such that the positive and negative analog input signals of N channels are simultaneously input to the other terminals of the capacitor array of the N sampling and conversion modules. Alternatively, before the positive and negative first analog signals are connected to one terminal of the capacitor array, both terminals of the capacitor array may be connected to the same DC voltage at the same time, so that the same voltage difference as the first analog signal can be formed across the capacitor array after the first analog signal is input to one terminal of the capacitor array, and the first analog signals of N channels are stored in the form of storing the charges in the capacitor. At the end of the sample-and-hold phase, both terminals of each capacitor array need to be disconnected from all the DC potentials connected, so that the amount of charge on the capacitor arrays of the N sampling and conversion modules does not change any more, thereby holding the sampled voltage value in preparation for the next analog-to-digital conversion.

In this way, the sampling and holding processes of the positive first analog signal and the negative first analog signal of N channels can be simultaneously realized.

In a possible implementation, in the i-th conversion cycle of the analog-to-digital conversion phase, the third conversion switch of the i-th positive sampling and conversion unit and the fourth conversion switch of the i-th negative sampling and conversion unit are closed, and the analog-to-digital conversion circuit performs U analog-to-digital conversions on the first analog signal of the i-th channel in a successive approximation manner. That is, the i-th positive sampling and conversion unit may include U sampling capacitors $C_{1Pi1}$-$C_{1PiU}$ (not shown) connected in parallel, the i-th negative sampling and conversion unit may include U sampling capacitors $C_{1Mi1}$-$C_{1MiU}$ (not shown) connected in parallel, and when an analog-to-digital conversion is performed on the positive first analog signal and the negative first analog signal of the i-th channel, U analog-to-digital conversions may be included.

In a possible implementation, the capacitor arrays $C_{1P1}$-$C_{1PN}$ and the capacitor arrays $C_{1M1}$-$C_{1MN}$ of N channels may be connected to the comparator 402 through the third conversion switch $S_{1P1}$-$S_{1PN}$ and the fourth conversion switch $S_{1M1}$-$S_{1MN}$ in turn to complete the analog-to-digital conversion of N channels sequentially.

Figure 15:
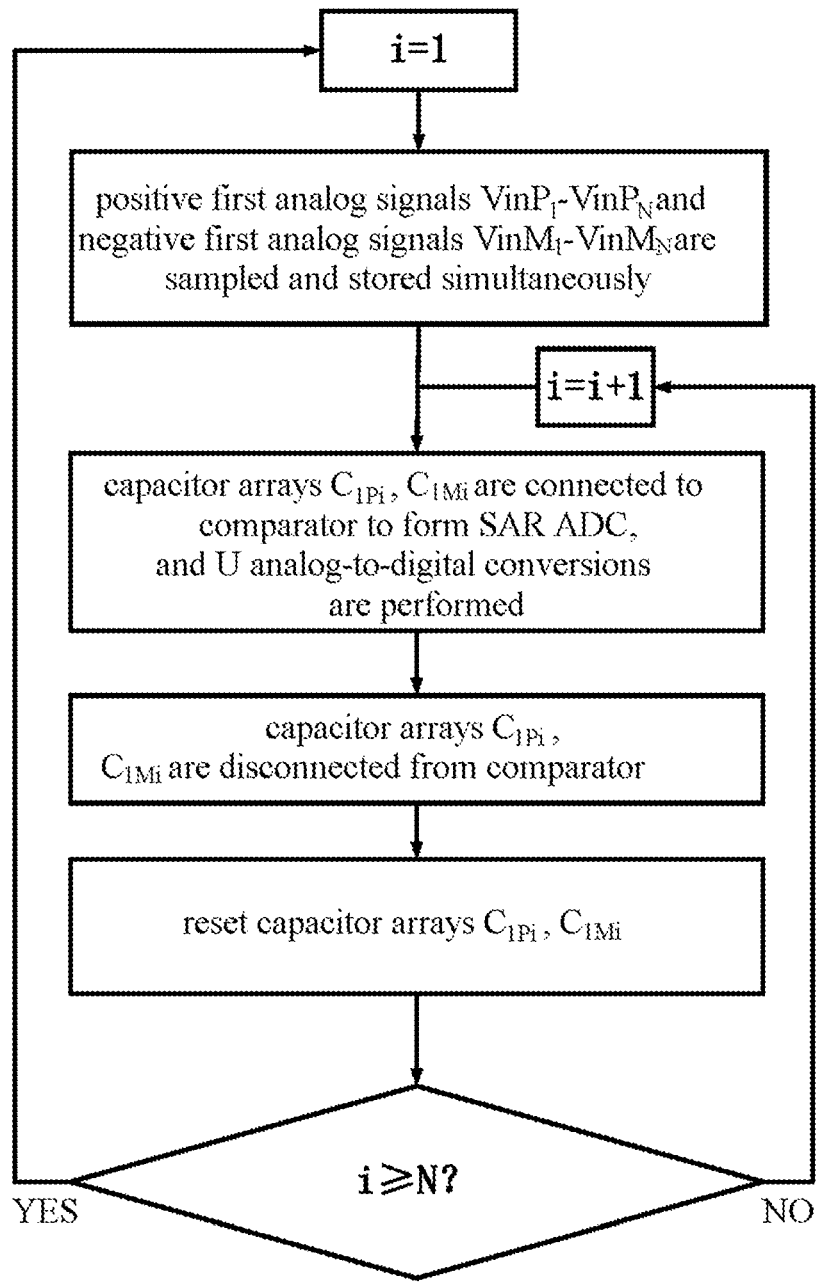
FIG. 15 shows a flowchart of an analog-to-digital conversion performed by an analog-to-digital conversion circuit according to an embodiment of the present disclosure.

FIG. 15 shows a flowchart of an analog-to-digital conversion performed by an analog-to-digital conversion circuit according to an embodiment of the present disclosure. As shown in FIG. 15, after the sample-and-hold phase is ended, the analog-to-digital conversion may be started from the first channel. The third conversion switch $S_{1P1}$ and the fourth conversion switch $S_{1M1}$ of the first channel may be closed, and the comparator 402 starts a comparison to obtain a second comparison signal. The second comparison signal may be input to the control module 403 and stored in the control module 403. The control module 403 may judge whether a plurality of analog-to-digital conversions in the first conversion cycle are completed or not according to the number of the stored second comparison signals. When U second comparison signals are stored in the control module, the quantization accuracy of the sampling and conversion module may be considered to have reached the maximum. The third conversion switch $S_{1P1}$ of the first positive sampling and conversion module unit and the fourth conversion switch $S_{1M1}$ of the first negative sampling and conversion module unit may be controlled to be opened. The control module 403 may calculate a final second digital signal of the first channel according to the weighted values configured by the capacitor arrays $C_{1P1}$-$C_{1PN}$ and the capacitor arrays $C_{1M1}$-$C_{1MN}$ and the U second comparison signals. The first conversion cycle is thus ended.

In a possible implementation, after the first conversion cycle ends, the second conversion cycle starts, the control module 403 may close the third conversion switch $S_{1P2}$ and the fourth conversion switch $S_{1M2}$ of the second channel to control the positive first analog signal and the negative first analog signal of the second channel to perform a plurality of analog-to-digital conversions of the second conversion cycle. The conversion steps thereof are the same as those of the first conversion cycle. For brevity, details are not described herein. By analogy, the control module 403 may perform analog-to-digital conversions on the positive first analog signals and the negative first analog signals of N channels sequentially by controlling in turn N third conversion switches corresponding to the positive sampling and conversion units of N channels and N fourth conversion switches corresponding to the negative sampling and conversion units of N channels, to obtain final second digital signals of N channels.

In a possible implementation, at the end of the analog-to-digital conversion of each of the channels, the charges on the sampling and conversion module of the channel may be cleared immediately, or may be cleared after the completion of analog-to-digital conversions of the N channels, which is not limited by the present disclosure.

In this way, analog-to-digital conversion on the differential analog input signals of N channels can be completed sequentially.

In a possible implementation, at the start of the i-th conversion cycle, the i-th positive sampling and conversion unit outputs an initial positive second analog signal according to the positive first analog signal of the i-th channel, and the i-th negative sampling and conversion unit outputs an initial negative second analog signal according to the negative first analog signal of the i-th channel;

the comparator compares the initial positive second analog signal with the initial negative second analog signal to output an initial second comparison signal;

the control module outputs the 1st positive first control signal and the 1st negative first control signal according to the initial second comparison signal.

For example, each of the conversion cycles is accomplished by the sampling and conversion module of a corresponding channel, the comparator, and the control module. For example, at the start of the second conversion cycle, the control module 403 does not output the positive first control signal and the negative first control signal to the sampling and conversion module 4012 until the positive sampling and conversion unit of the sampling and conversion module 4012 outputs the positive second analog signal for the first time and the negative sampling and conversion unit outputs the negative second analog signal for the first time. At this time, the step of a first analog-to-digital conversion in the second conversion cycle has not yet been performed, and the comparator 402 needs to compare the initial positive second analog signal and the initial negative second analog signal of the sampling and conversion module 4012 to obtain a comparison result once.

In a possible implementation, the result, by the comparator, of comparing the initial positive second analog signal with the initial negative second analog signal comparator may be the initial second comparison signal, and according to the initial second comparison signal, the control module 403 may output the first positive first control signal and the first negative first control signal. The positive sampling and conversion unit may output the first positive second analog signal based on the first positive first control signal, and the negative sampling and conversion unit may output the first negative second analog signal based on the first negative first control signal, so that the analog-to-digital conversion circuit can perform the first analog-to-digital conversion on the first positive second analog signal and the first negative second analog signal of the second conversion cycle.

In this way, the range of the analog signal can be preliminarily judged before the start of a conversion, and the output of the sampling and conversion module can be adjusted by the fed back control signal generated by the control module, thereby improving the conversion accuracy.

In a possible implementation, for the u-th analog-to-digital conversion of the i-th conversion cycle, the i-th positive sampling and conversion unit outputs the u-th positive second analog signal according to the positive first analog signal of the i-th channel and the u-th positive first control signal, where $1 \leq u \leq U$ and u is an integer;

the i-th negative sampling and conversion unit outputs the u-th negative second analog signal according to the negative first analog signal of the i-th channel and the u-th negative first control signal;

the comparator compares the u-th positive second analog signal with the u-th negative second analog signal to output a second comparison signal of the u-th comparison, based on u<U, the control module outputs the (u+1)-th positive first control signal and the (u+1)-th negative first control signal according to the second comparison signal of the u-th comparison; and based on u=U, the control module outputs a second digital signal corresponding to the first analog signal of the i-th channel according to the second comparison signals of U comparisons.

For example, in the first and subsequent analog-to-digital conversions of each of the conversion cycles, the analog signal of each of the analog-to-digital conversions needs to be adjusted by the most recently output positive first control signal and the negative first control signal fed back by the control module 403 at the start of each analog-to-digital conversion, and is then input to the comparator 402 for analog-to-digital conversion. A second comparison signal, after being obtained by the comparator 402, may be input to the control module 403, and stored by the control module 403. The control module 403 may further output a positive first control signal and a negative first control signal for the next analog-to-digital conversion according to the received second comparison signal.

In a possible implementation, taking the second conversion cycle as an example, when $1 \leq u \leq U$, after the (u−1)-th comparison in the U analog-to-digital conversions is completed, the control module 403 may output the u-th positive first control signal and the u-th negative first control signal according to the (u−1)-th second comparison signal, and the (u−1)-th analog-to-digital conversion is then completed. The analog-to-digital conversion circuit starts the u-th analog-to-digital conversion.

In a possible implementation, the positive sampling and conversion unit may output the u-th positive second analog signal according to the u-th positive first control signal, and the negative sampling and conversion unit may output the u-th negative second analog signal according to the u-th negative first control signal. The comparator 402 may compare the u-th positive second analog signal with the u-th negative second analog signal to output the u-th second comparison signal. The control module may output the (u+1)-th positive first control signal and the (u+1)-th negative first control signal according to the u-th second comparison signal, and the u-th analog-to-digital conversion is then completed.

In a possible implementation, after a plurality of analog-to-digital conversions in the second conversion cycle are completed, the comparator 402 completes a total of U comparisons, and outputs U second comparison signals to the control module 403. The control module 403 may calculate a final second digital signal according to the U second comparison signals and output it to the external circuit, and the second conversion cycle ends.

In this way, a successive approximation on the differential first analog signal can be achieved by U analog-to-digital conversions, thereby improving the conversion accuracy.

Figure 10:
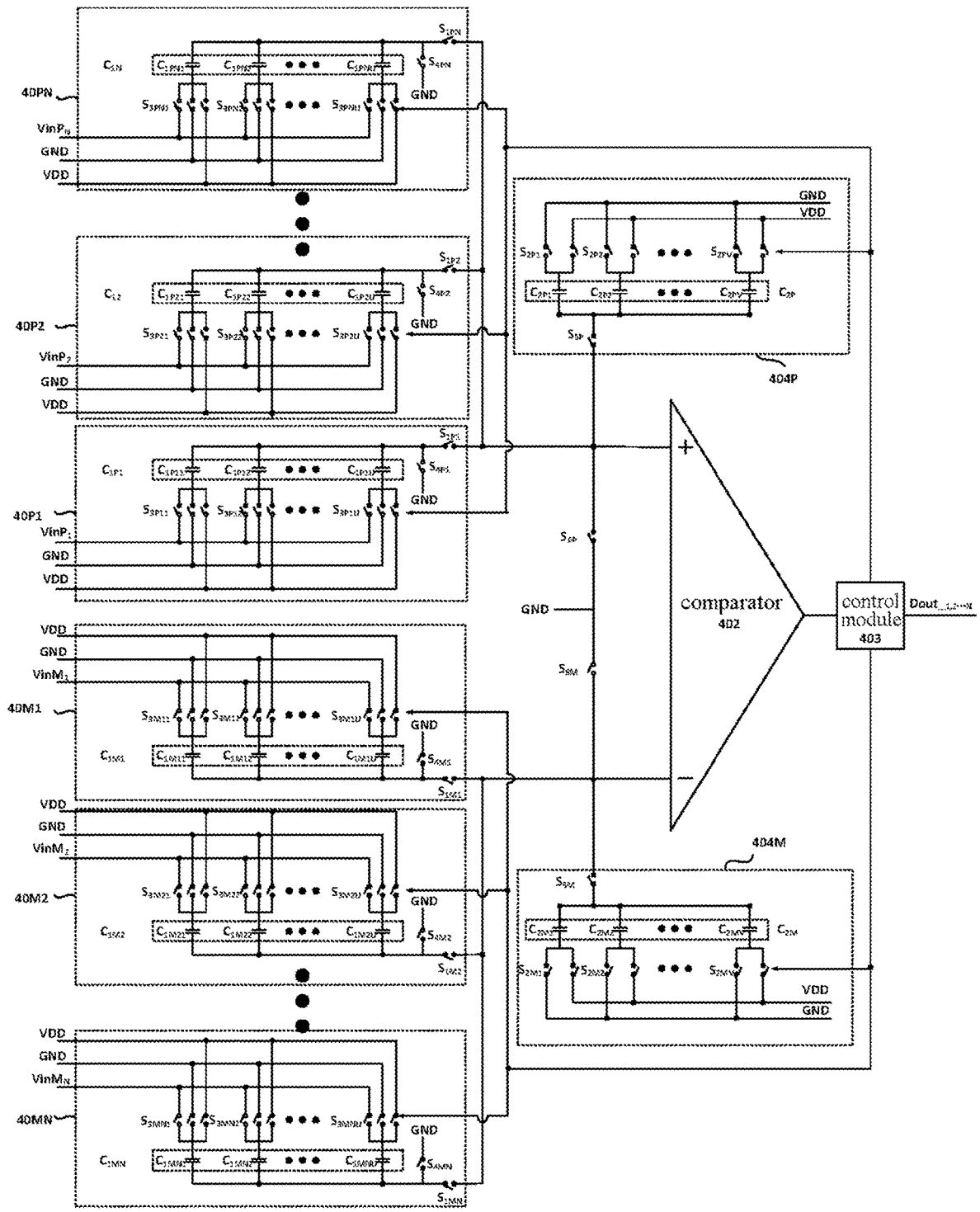
FIG. 10 shows a schematic diagram of an analog-to-digital conversion circuit according to an embodiment of the present disclosure.

FIG. 10 shows a schematic diagram of an analog-to-digital conversion circuit according to an embodiment of the present disclosure. As shown in FIG. 10, the analog-to-digital conversion circuit further includes a shared conversion module configured to convert quantized margin signals of the first analog signals of N channels, the shared conversion module includes a positive shared conversion unit and a negative shared conversion unit, the positive shared conversion unit including V second shared capacitors connected in parallel, V sets of second shared switches, and a fifth conversion switch, and the negative shared conversion unit including V third shared capacitors connected in parallel, V sets of third shared switches, and a sixth conversion switch, where V is an integer greater than or equal to 1, the positive shared conversion unit is connected respectively to the N positive sampling and conversion units and the first input terminal of the comparator through the fifth conversion switch, and the negative shared conversion unit is connected respectively to the N negative sampling and conversion units and the second input terminal of the comparator through the sixth conversion switch, where the control module is further configured to:

control the fifth conversion switch and the sixth conversion switch to open during the first U analog-to-digital conversions in the i-th conversion cycle of the analog-to-digital conversion phase; and control the fifth conversion switch and the sixth conversion switch to close after the U-th analog-to-digital conversion is completed; and the control module outputs the 1st positive second control signal and the 1st negative second control signal according to the second comparison signals of the U comparisons; and take the U-th positive second analog signal as a positive quantized margin signal and take the U-th negative second analog signal as a negative quantized margin signal, the analog-to-digital conversion circuit performs V analog-to-digital conversions on the positive quantized margin signal and the negative quantized margin signal in a successive approximation manner.

For example, after U analog-to-digital conversions of the sampling and conversion module of any one of the channels end, the resulting second analog voltage still needs to be further quantized. In this case, a shared conversion module may be added in the analog-to-digital conversion circuit. The shared conversion module 404 may include a positive shared conversion unit 404P and a negative shared conversion unit 404M, which may include a capacitor array $C_{2P}$ of V second shared capacitors $C_{2P1}$-$C_{2PV}$ connected in parallel and a capacitor array $C_{2M}$ of V third shared capacitors $C_{2M1}$-$C_{2MV}$ connected in parallel, respectively, and may include V analog-to-digital conversions when performing analog-to-digital conversion on a positive quantized margin signal and a negative quantized margin signal of the first analog signal of the i-th channel.

One terminals of the capacitor array $C_{2P}$ and the capacitor array $C_{2M}$ may be connected to the comparator 402, and may also be connected to ground (GND), device supply (VDD), or other preset DC potentials (e.g., connected to VDD/2). The other terminals of the capacitor array $C_{2P}$ and the capacitor array $C_{2M}$ may be connected respectively to GND or VDD via a corresponding V sets of second shared switches $S_{2P1}$-$S_{2PV}$ and third shared switches $S_{2M1}$-$S_{2MV}$, and may also be connected to other preset DC potentials (e.g., connected to VDD/2), where the total number of capacitors in the capacitor array $C_{2P}$ and the capacitor array $C_{2M}$ are the same, which is denoted by V. The positive shared conversion unit and the negative shared conversion unit may further receive feedback from the control module 403, and adjust the voltage connected to the capacitor plate according to the feedback to output different positive second analog signal and negative second analog signal.

In a possible implementation, when the fifth conversion switch $S_{5P}$ and the sixth conversion switch $S_{5M}$ are closed, the capacitor arrays $C_{2P}$ and $C_{2M}$ also function as DACs in the SAR ADC. The positive and negative second control signals are input respectively at input terminals of the positive shared conversion unit and the negative shared conversion unit, to control the positive shared conversion unit and the negative shared conversion unit to output the positive and negative second analog signals. The capacitor arrays $C_{2P}$ and $C_{2M}$ may be in a binary configuration, or may be in other configurations, such as adding some redundancy. The present disclosure does not limit the way of configuration of capacitor arrays $C_{2P}$ and $C_{2M}$.

In a possible implementation, in the U-th analog-to-digital conversion, the comparator outputs the second comparison signal of the U-th comparison, in which case the fifth conversion switch $S_{5P}$ and the sixth conversion switch $S_{5M}$ may be closed, so that the control module may output the $1^{st}$ positive and negative second control signals according to the second comparison signal of the U-th comparison, where the positive and negative second control signals are signals input respectively to the positive and negative shared conversion units to control the analog-to-digital conversion circuit to perform the (U+1)-th analog-to-digital conversion.

In a possible implementation, the positive and negative second analog signals output from the output terminals of the positive shared conversion unit and the negative shared conversion unit are simultaneously input to the comparator 402 for comparison to output a second comparison signal. The second comparison signal is a one-bit digital output code having two numeral values of 0 and 1, respectively. When the second comparison signal is 1, it indicates that the input signal at the positive input terminal is larger, and when the second comparison signal is 0, it indicates that the input signal at the negative input terminal is larger.

In a possible implementation, the control module 403 may output a positive second control signal to the input terminal of the positive shared conversion unit according to the input second comparison signal, and output a negative second control signal to the input terminal of the negative shared conversion unit at the same time, so that the positive shared conversion unit and the negative shared conversion unit respectively control the DC potential connected to the other terminal of the respective shared capacitor based on the positive second control signal and the negative second control signal, thereby adjusting the positive second analog signal and the negative second analog signal output to the comparator 402 in performing the next comparison.

In a possible implementation, the comparison signal output by the comparator 402 may be stored in the control module 403 after being input to the control module 403. At the end of (U+V) analog-to-digital conversions in each of the conversion cycles, the control module 403 may determine a final second digital signal according to the stored (U+V) comparison signals. Taking the second conversion cycle as an example, the (U+V) analog-to-digital conversions include not only U analog-to-digital conversions performed when both the positive sampling and conversion unit and the negative sampling and conversion unit are connected to both the comparator 402 and the control module 403, but also V analog-to-digital conversions performed when both the positive shared conversion unit and the negative shared conversion unit are connected to the positive sampling and conversion unit and the negative sampling and conversion unit, the comparator 402, and the control module 403. The analog-to-digital conversion circuit may include N conversion cycles, and the control module 403 may, immediately after determining a second digital signal, output it to the external circuit, or may, after obtaining N second digital signals, output them to the external circuit together. After all the N second digital signals are output, synchronous sampling and analog-to-digital conversion of the first analog signals of the N channels are finally completed.

In this way, conversion accuracy of analog-to-digital conversion can be further improved.

In a possible implementation, for the (U+v)-th analog-to-digital conversion of the i-th conversion cycle, the positive shared conversion unit outputs the (U+v)-th positive second analog signal according to the positive quantized margin signal and the v-th positive second control signal, where 1 V and v is an integer;

the negative shared conversion unit outputs the (U+v)-th negative second analog signal according to the negative quantized margin signal and the v-th negative second control signal;

the comparator compares the (U+v)-th positive second analog signal with the (U+v)-th negative second analog signal to output a second comparison signal of the (U+v)-th comparison;

based on v<V, the control module outputs a (v+1)th positive second control signal and a (v+1)th negative second control signal according to the second comparison signal of the (U+v)-th comparison; and based on v=V, the control module outputs the second digital signal corresponding to the first analog signal of the i-th channel according to the second comparison signal of the (U+v)-th comparison.

For example, (U+V) analog-to-digital conversions are performed in each of the conversion cycles. In the (U+1)-th and subsequent analog-to-digital conversions in each of the conversion cycles, the positive and negative second analog signals of each of the analog-to-digital conversions need to be controlled at the start of each of the analog-to-digital conversions by the positive and negative second control signals most recently output by the control module 403, and then input to the comparator 402 for an analog-to-digital conversion. The (U+1)-th second comparison signal, after obtained by the comparator 402, may be input to the control module 403, and stored by the control module 403. The control module 403 may further output positive and negative second control signals for the next analog-to-digital conversion according to the received second comparison signal.

Figure 16:
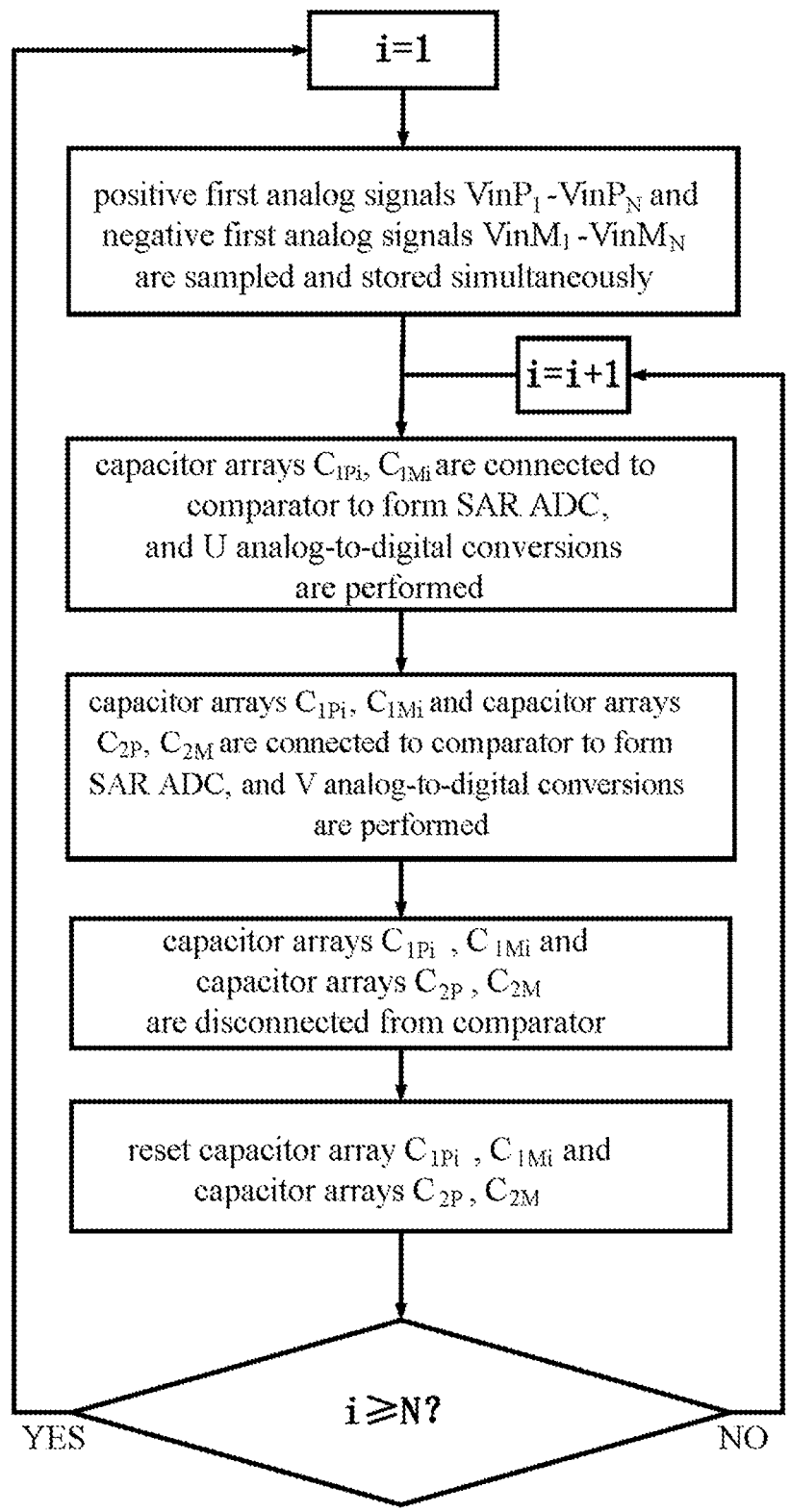
FIG. 16 shows a flowchart of an analog-to-digital conversion performed by an analog-to-digital conversion circuit according to an embodiment of the present disclosure.

FIG. 16 shows a flowchart of analog-to-digital conversion performed by an analog-to-digital conversion circuit according to an embodiment of the present disclosure. As shown in FIG. 16, after the sample-and-hold phase is ended, analog-to-digital conversion may be started from the first channel. The third conversion switch $S_{1P1}$ and the fourth conversion switch $S_{1M1}$ of the first channel may be closed, and the comparator 402 starts the comparison and obtains a second comparison signal. The second comparison signal may be input to the control module 403 and stored in the control module 403. The control module 403 may judge whether a plurality of analog-to-digital conversions in the first conversion cycle are completed or not according to the number of the stored second comparison signals. When U second comparison signals are stored in the control module, the quantization accuracy of the sampling and conversion module may be considered to have reached the maximum. The fifth conversion switch and the sixth conversion switch of the shared conversion module may be controlled to be closed for further quantization, and the comparator 402 may continue the comparison to obtain the (U+1)-th to (U+V)-th second comparison signals.

In a possible implementation, taking the second conversion cycle as an example, when 1≤v≤V, after the (U+v−1)-th comparison in the (U+V) analog-to-digital conversions is completed, the control module 403 may output the (U+v)-th positive and negative second control signals according to the (U+v−1)-th second comparison signal, and the (U+v−1)-th analog-to-digital conversion is then completed. The analog-to-digital conversion circuit then starts the (U+v)-th analog-to-digital conversion.

In a possible implementation, the shared conversion module 404 may output the (U+v)-th positive and negative quantized margin signals according to the (U+v)-th positive and negative second control signals. The comparator 402 may compare the (U+v)-th positive and negative quantized margin signals to output the (U+v)-th second comparison signal. The control module may output the (U+v−1)-th positive and negative second control signals according to the (U+v)-th second comparison signal, and the (U+v)-th analog-to-digital conversion is then completed.

In a possible implementation, after a plurality of analog-to-digital conversions in the second conversion cycle are completed, the comparator 402 completes a total of (U+V) comparisons, and outputs (U+V) second comparison signals to the control module 403. The control module 403 may calculate a final second digital signal from the (U+V) second comparison signals and output it to the external circuit, and the second conversion cycle ends.

In this way, a successive approximation on the quantized margin signal can be realized by V analog-to-digital conversions, and (U+V) conversions on the first analog signal can be realized, thereby further improving conversion accuracy.

In a possible implementation, the conversion cycle is determined by the order of channels, that is, after the first conversion cycle ends, the second conversion cycle starts, and so on. The control module 403 may perform an analog-to-digital conversion on the first analog signals $Vin_1$-$Vin_N$ of N channels sequentially by controlling in turn N third conversion switches and fourth conversion switches corresponding to the sampling and analog-to-digital conversion modules 4011-401N of N channels and the fifth conversion switch and the six conversion switch of the shared conversion module, to obtain final second digital signals $Dout_{\_1}$-$Dout_{\_N}$ of N channels.

In a possible implementation, at the end of an analog-to-digital conversion of each of the channels, charges on the shared conversion module needed to be cleared immediately in order to perform an analog-to-digital conversion of the next channel. Charges on the sampling and conversion module of this channel may be cleared together with the shared conversion module, or may be cleared after the analog-to-digital conversions of N channels are completed, which is not limited by the present disclosure.

In this way, analog-to-digital conversions of the analog input signals of N channels can be completed sequentially.

Figure 11:
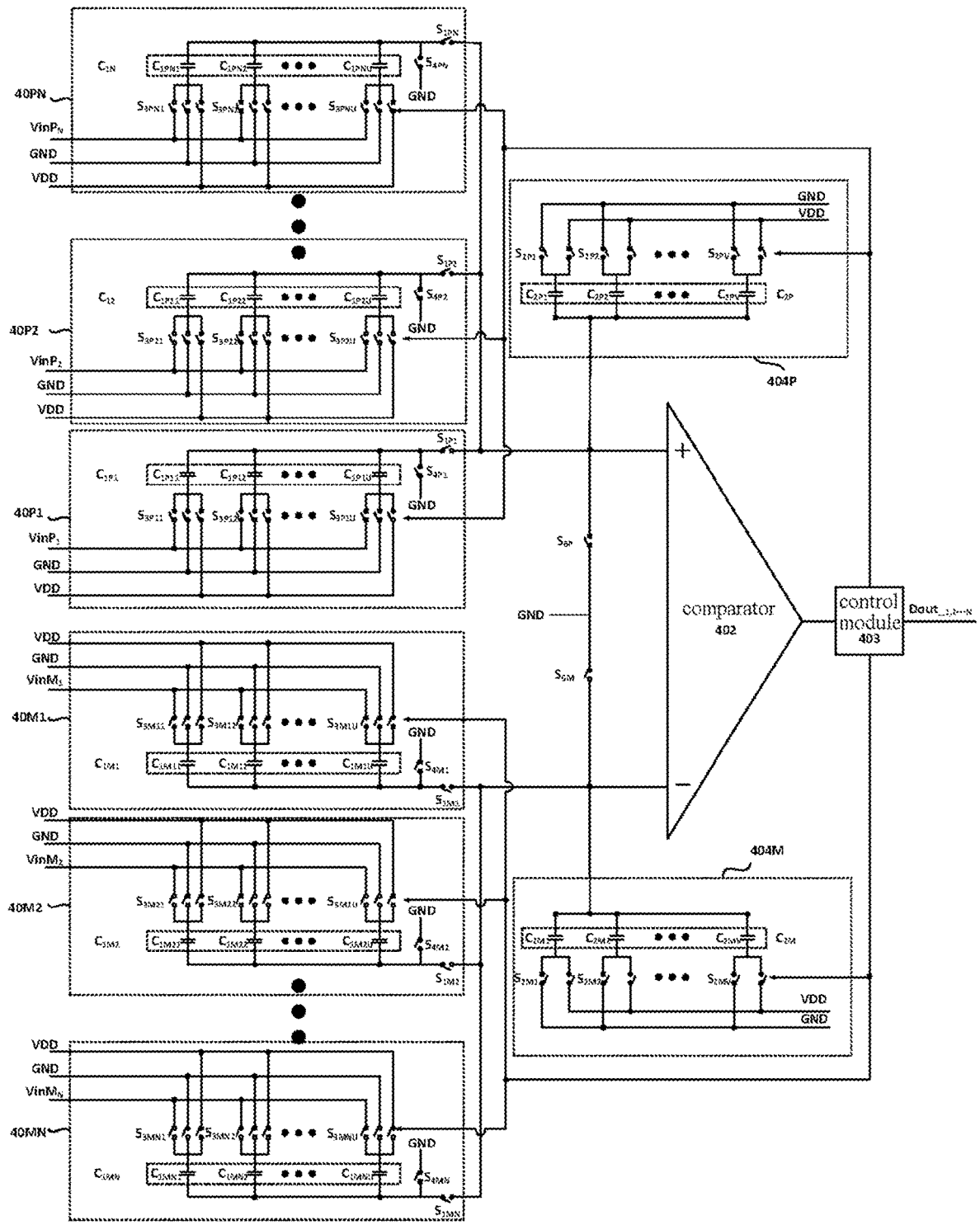
FIG. 11 shows a schematic diagram of an analog-to-digital conversion circuit according to an embodiment of the present disclosure.

FIG. 11 shows a schematic diagram of an analog-to-digital conversion circuit according to an embodiment of the present disclosure. As shown in FIG. 11, the analog-to-digital conversion circuit further includes a shared conversion module configured to convert quantized margin signals of the first analog signals of N channels, the shared conversion module includes a positive shared conversion unit and a negative shared conversion unit, the positive shared conversion unit including V second shared capacitors connected in parallel and V sets of second shared switches, and the negative shared conversion unit including V third shared capacitors connected in parallel and V sets of third shared switches, where V is an integer greater than or equal to 1, the positive shared conversion unit is connected respectively to the N positive sampling and conversion units and the first input terminal of the comparator, and the negative shared conversion unit is connected respectively to the N negative sampling and conversion units and the second input end of the comparator, where the control module is further configured to:

output the $1^{st}$ positive second control signal and the $1^{st}$ negative second control signal according to the second comparison signals of the U comparisons after the U-th analog-to-digital conversion is completed;

the positive shared conversion unit takes the U-th positive second analog signal as a positive quantized margin signal, and the negative shared conversion unit takes the U-th negative second analog signal as a negative quantized margin signal; and during the (U+1)-th to (U+V)-th analog-to-digital conversions in the i-th conversion cycle of the analog-to-digital conversion phase, output a second control signal to control opened/closed states of the V sets of second shared switches in the positive shared conversion unit and the V sets of third shared switches in the negative shared conversion unit, to perform V analog-to-digital conversions on the positive quantized margin signal and the negative quantized margin signal in a successive approximation manner.

For example, after U analog-to-digital conversions of the sampling and conversion module of any one of the channels end, the resulting second analog signal still needs to be further quantized. In this case, a shared conversion module may be added in the analog-to-digital conversion circuit. The shared conversion module 404 may include a positive shared conversion unit 404P and a negative shared conversion unit 404M, which may include a capacitor array $C_{2P}$ and $C_{2M}$ of V capacitors connected in parallel respectively, and may include V analog-to-digital conversions when performing analog-to-digital conversion on a positive quantized margin signal and a negative quantized margin signal of each of the channels.

One terminals of the capacitor arrays $C_{2P}$ and $C_{2M}$ may be connected to the comparator 402, and may also be connected to ground (GND), device supply (VDD), or other preset DC potentials (e.g., connected to VDD/2). The other terminals of the capacitor arrays $C_{2P}$ and $C_{2M}$ may be connected respectively to GND or VDD via a corresponding V sets of shared switches $S_{2P1}$-$S_{2PV}$ and $S_{2M1}$-$S_{2MV}$, and may also be connected to other preset DC potentials (e.g., connected to VDD/2), where the total number of capacitors in the capacitor array $C_{2P}$ and the capacitor array $C_{2M}$ are the same, which is denoted by V. The positive shared conversion unit and the negative shared conversion unit may further receive feedback from the control module 403, and adjust the voltage connected to the capacitor plate according to the feedback to output different positive second analog signal and negative second analog signal.

In a possible implementation, the capacitor arrays $C_{2P}$ and $C_{2M}$ also function as DACs in the SAR ADC. The positive and negative second control signals are input respectively at input terminals of the positive shared conversion unit and the negative shared conversion unit, to control the positive shared conversion unit and the negative shared conversion unit to output the positive and negative second analog signals. The capacitor arrays $C_{2P}$ and $C_{2M}$ may be in a binary configuration, or may be in other configurations, such as adding some redundancy. The present disclosure does not limit the way of configuration of capacitor arrays $C_{2P}$ and $C_{2M}$.

In a possible implementation, the positive and negative second analog signals output from the positive shared conversion unit and the negative shared conversion unit are simultaneously input to the comparator 402 for comparison to output a second comparison signal. The second comparison signal is a one-bit digital output code having two numeral values of 0 and 1, respectively. When the second comparison signal is 1, it indicates that the input signal at the positive input terminal is larger, and when the second comparison signal is 0, it indicates that the input signal at the negative input terminal is larger.

In a possible implementation, the control module 403 may output a positive second control signal to the input terminal of the positive shared conversion unit according to the input second comparison signal, and output a negative second control signal to the input terminal of the negative shared conversion unit at the same time, so that the positive shared conversion unit and the negative shared conversion unit control respectively the DC potential connected to the other terminal of the respective shared capacitor based on the positive second control signal and the negative second control signal, thereby adjusting the positive second analog signal and the negative second analog signal output to the comparator 402 in performing the next comparison.

In a possible implementation, the comparison signal output by the comparator 402 may be stored in the control module 403 after being input to the control module 403. At the end of (U+V) analog-to-digital conversions in each of the conversion cycles, the control module 403 may determine a final second digital signal according to the stored (U+V) comparison signals. Taking the second conversion cycle as an example, the (U+V) analog-to-digital conversions include not only U analog-to-digital conversions performed when both the positive sampling and conversion unit and the negative sampling and conversion unit are connected to both the comparator 402 and the control module 403, but also V analog-to-digital conversions performed when both the positive shared conversion unit and the negative shared conversion unit are connected to the positive sampling and conversion unit and the negative sampling and conversion unit, the comparator 402, and the control module 403. The analog-to-digital conversion circuit may include N conversion cycles, and the control module 403 may, immediately after determining a second digital signal, output it to the external circuit, or may, after obtaining N second digital signals, output them to the external circuit together. After all the N second digital signals are output, synchronous sampling and analog-to-digital conversion of the first analog signals of the N channels are finally completed.

In this way, conversion accuracy of analog-to-digital conversion can be further improved.

In a possible implementation, for the (U+v)-th analog-to-digital conversion of the i-th conversion cycle, the positive shared conversion unit outputs the (U+v)-th positive second analog signal according to the positive quantized margin signal and the v-th positive second control signal, where $1 \leq v \leq V$ and v is an integer, the negative shared conversion unit outputs the (U+v)-th negative second analog signal according to the negative quantized margin signal and the v-th negative second control signal, the comparator compares the (U+v)-th positive second analog signal with the (U+v)-th negative second analog signal to output a second comparison signal of the (U+v)-th comparison, based on v<V, the control module outputs a (v+1)th positive second control signal and a (v+1)th negative second control signal based on the second comparison signal of the (U+v)-th comparison, and based on v=V, the control module outputs the second digital signal corresponding to the first analog signal of the i-th channel according to the second comparison signal of the (U+v)-th comparison.

For example, (U+V) analog-to-digital conversions are performed in each of the conversion cycles. In the (U+1)-th and subsequent analog-to-digital conversions in each of the conversion cycles, the positive and negative second analog signals of each of the analog-to-digital conversions need to be controlled at the start of each of the analog-to-digital conversions by the positive and negative second control signals most recently output by the control module 403, and then input to the comparator 402 for an analog-to-digital conversion. The (U+1)-th second comparison signal, after obtained by the comparator 402, may be input to the control module 403, and stored by the control module 403. The control module 403 may further output positive and negative second control signals for the next analog-to-digital conversion according to the (U+1)-th received second comparison signal.

Figure 17:
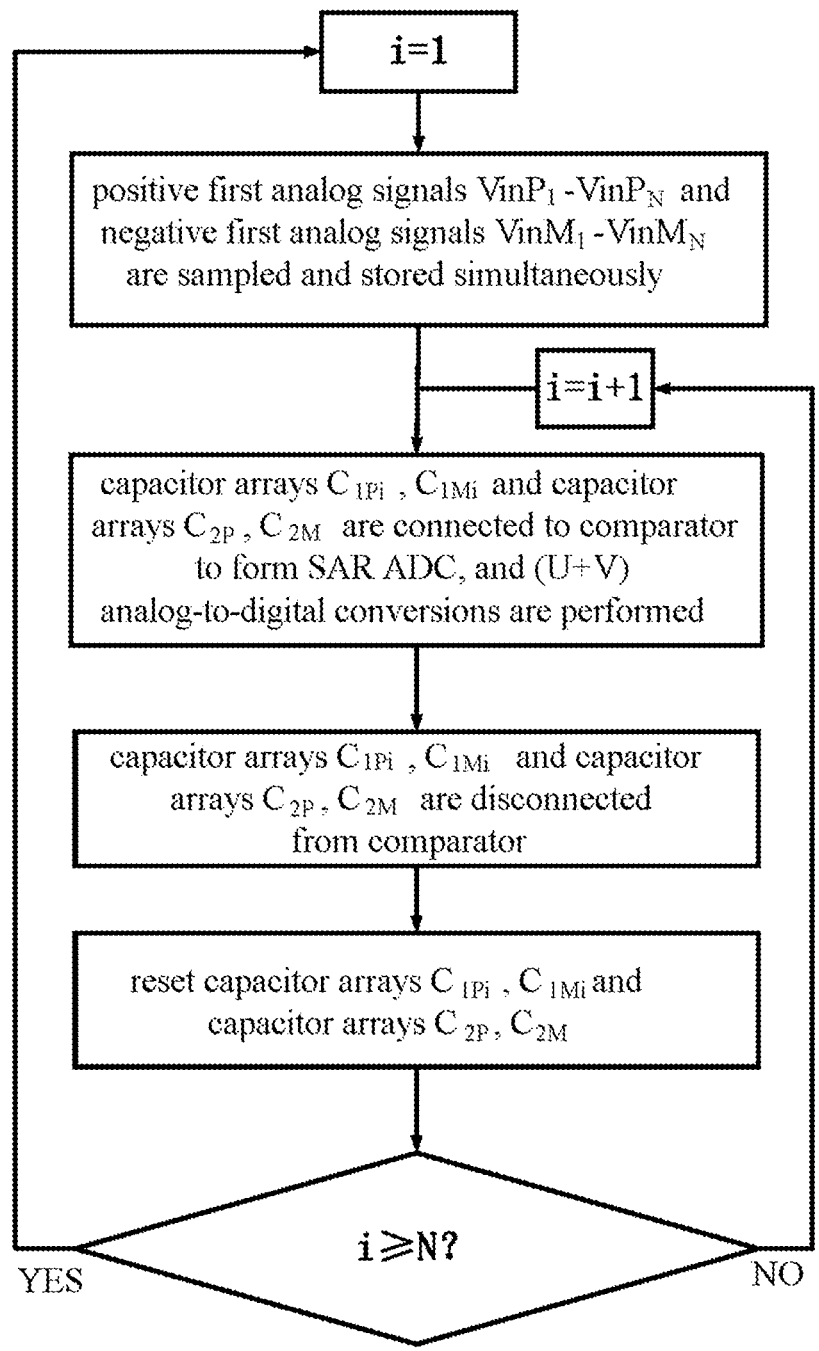
FIG. 17 shows a flowchart of an analog-to-digital conversion performed by an analog-to-digital conversion circuit according to an embodiment of the present disclosure.

FIG. 17 shows a flowchart of an analog-to-digital conversion performed by an analog-to-digital conversion circuit according to an embodiment of the present disclosure. As shown in FIG. 17 after the sample-and-hold phase is ended, an analog-to-digital conversion may be started from the first channel. The third conversion switch $S_{1P1}$ and the fourth conversion switch $S_{1M1}$ of the first channel may be closed, and the comparator 402 starts the comparison to obtain a second comparison signal. The second comparison signal may be input to the control module 403 and stored in the control module 403. The control module 403 may judge whether a plurality of analog-to-digital conversions in the first conversion cycle are completed or not according to the number of the stored second comparison signals. When U second comparison signals are stored in the control module, the quantization accuracy of the sampling and conversion module may be considered to have reached the maximum. The shared conversion module may be controlled for further quantization, and the comparator 402 may continue the comparison to obtain the (U+1)-th to (U+V)-th second comparison signals.

In a possible implementation, taking the second conversion cycle as an example, when $1 \leq v \leq V$, after the (U+v−1)-th comparison in the (U+V) analog-to-digital conversions is completed, the control module 403 may output the (U+v)-th positive and negative second control signals according to the (U+v−1)-th second comparison signal, and the (U+v−1)-th analog-to-digital conversion is then completed. The analog-to-digital conversion circuit then starts the (U+v)-th analog-to-digital conversion.

In a possible implementation, the shared conversion module 404 may output the (U+v)-th positive and negative second analog signals according to the (U+v)-th positive and negative second control signals. The comparator 402 may compare the (U+v)-th positive and negative second analog signals to output the (U+v)-th second comparison signal. The control module may output the (U+v−1)-th positive and negative second control signals according to the (U+v)-th second comparison signal, and the (U+v)-th analog-to-digital conversion is then completed.

In a possible implementation, after a plurality of analog-to-digital conversions in the second conversion cycle are completed, the comparator 402 completes a total of (U+V) comparisons, and outputs (U+V) second comparison signals to the control module 403. The control module 403 may calculate a final second digital signal from the (U+V) second comparison signals and output it to the external circuit, and the second conversion cycle ends.

In this way, a successive approximation on the quantized margin signal can be realized by V analog-to-digital conversions, and (U+V) conversions on the first analog signal can be realized, thereby further improving conversion accuracy.

In a possible implementation, the conversion cycle is determined by the order of channels, that is, after the first conversion cycle ends, the second conversion cycle starts, and so on. The control module 403 may perform analog-to-digital conversions on the first analog signals $Vin_1$-$Vin_N$ of N channels sequentially by controlling in turn N third conversion switches and fourth conversion switches corresponding to the sampling and analog-to-digital conversion modules 4011-401N of N channels, to obtain final second digital signals $Dout\_1$-$Dout\_N$ of N channels.

In a possible implementation, at the end of an analog-to-digital conversion of each of the channels, charges on the shared conversion module needed to be cleared immediately in order to perform an analog-to-digital conversion of the next channel. Charges on the sampling and conversion module of this channel may be cleared together with the shared conversion module, or may be cleared after analog-to-digital conversion of N channels is completed, which is not limited by the present disclosure.

In this way, the analog-to-digital conversions on the analog input signals of N channels can be completed sequentially.

According to the analog-to-digital conversion circuit of the present disclosure, by providing a sampling and conversion module including a plurality of sampling capacitors, such that in addition to that the sampling capacitors realize the function of multi-channel synchronous sampling, a successive approximation conversion function can be directly accomplished on the sampling capacitors by control signals output from the receiving circuit, it is possible to reduce charge loss of the sampling and conversion module, thereby improving energy efficiency of the analog-to-digital conversion circuit at a smaller circuit cost.

Although the embodiments of the present disclosure have been described above, it will be appreciated that the above descriptions are merely exemplary, but not exhaustive; and that the disclosed embodiments are not limiting. A number of variations and modifications may occur to one skilled in the art without departing from the scopes and spirits of the described embodiments. The terms in the present disclosure are selected to provide the best explanation on the principles and practical applications of the embodiments and the technical improvements to the arts on market, or to make the embodiments described herein understandable to one skilled in the art.

What is claimed is:

1. An analog-to-digital conversion circuit comprising:
   N sampling and conversion modules connected in parallel, configured to simultaneously sample and sequentially convert first analog signals of N channels to output second analog signals, wherein each of the sampling and conversion modules includes a plurality of sampling capacitors connected in parallel, wherein N is an integer greater than 1;
   a comparator connected to the N sampling and conversion modules, configured to compare the second analog signals respectively to obtain comparison signals; and
   a control module connected to the N sampling and conversion modules and the comparator, the control module configured to control the N sampling and conversion modules to output converted digital signals based on the comparison signals;
   wherein each of the sampling and conversion modules further includes a conversion switch that includes a first terminal connected to the plurality of sampling capacitors and a second terminal connected to the comparator;
   wherein the control module is configured to:
      in a sample-and-hold phase, control the N sampling and conversion modules to simultaneously sample and hold the first analog signals of N channels; and
      in an analog-to-digital conversion phase, control the conversion switches of the N sampling and conversion modules to close in turn so that the analog-to-digital conversion circuit performs analog-to-digital conversion on the first analog signals of N channels sequentially.

2. The analog-to-digital conversion circuit according to claim 1, wherein the analog-to-digital conversion phase includes N conversion cycles,
   wherein in an i-th conversion cycle of the analog-to-digital conversion phase, the control module controls the conversion switch of an i-th sampling and conversion module to close, and the analog-to-digital conversion circuit performs a plurality of analog-to-digital conversions on a first analog signal of an i-th channel in a successive approximation manner, to obtain a digital signal corresponding to the first analog signal of the i-th channel, wherein $1 \leq i \leq N$ and i is an integer.

3. The analog-to-digital conversion circuit according to claim 2, wherein a first analog signal of a channel corresponding to each sampling and conversion module is input at a first input terminal of the sampling and conversion module, a first control signal is input at a second input terminal of the module, and a second analog signal is output in response to the first conversion switch being closed,
   each sampling and conversion module includes U first sampling capacitors, U sets of first hold switches, and a first conversion switch, U being an integer greater than or equal to 1, one terminal of each of the first sampling capacitors is connected to the first conversion switch, the other terminal of the capacitors is connected to one terminal of a set of first hold switches, and the other terminal of the set of first hold switches is respectively connected to one of the first analog signal, a device voltage VDD, a ground GND, or a preset direct current voltage,
   the second analog signal is input at a first input terminal of the comparator, a reference signal is input at a second input terminal of the comparator, and a first comparison signal is input at an output terminal of the comparator, and
   the first comparison signal is input at an input terminal of the control module, a converted first digital signal is output at a first output terminal of the control module, and the first control signal is output at a second output terminal of the control module.

4. The analog-to-digital conversion circuit according to claim 3, wherein said controlling the N sampling and conversion modules to simultaneously sample and hold the input first analog signals of N channels in the sample-and-hold phase comprises:
   controlling the first conversion switches of the N sampling and conversion modules to open; and
   controlling opened/closed states of the U sets of first hold switches of each of the sampling and conversion modules, so that the other terminal of the U first sampling capacitors of the sampling and conversion module is connected to a first analog signal corresponding to the sampling and conversion module.

5. The analog-to-digital conversion circuit according to claim 3, wherein in the i-th conversion cycle of the analog-to-digital conversion phase, the first conversion switch of the i-th sampling and conversion module is closed, and the analog-to-digital conversion circuit performs U analog-to-digital conversions on the first analog signal of the i-th channel in a successive approximation manner,
   for a u-th analog-to-digital conversion of the i-th conversion cycle, the i-th sampling and conversion module outputs a u-th second analog signal based on the first analog signal of the i-th channel and a u-th first control signal, wherein $1 \leq u \leq U$ and u is an integer,
   the comparator compares the u-th second analog signal with the reference signal to output the first comparison signal of a u-th comparison,
   based on u<U, the control module outputs the (u+1)-th first control signal based on the first comparison signal of the u-th comparison, and
   based on u=U, the control module outputs a first digital signal corresponding to the first analog signal of the i-th channel based on the first comparison signal of the U-th comparison.

6. The analog-to-digital conversion circuit according to claim 5, wherein at a beginning of the i-th conversion cycle, the i-th sampling and conversion module outputs an initial second analog signal based on the first analog signal of the i-th channel, the comparator compares the initial second analog signal with the reference signal to output an initial first comparison signal, and the control module outputs a $1^{st}$ first control signal based on the initial first comparison signal, the $1^{st}$ first control signal being the first control signal output for a first time.

7. The analog-to-digital conversion circuit according to claim 5, wherein the i-th sampling and conversion module outputting the u-th second analog signal based on the first analog signal of the i-th channel and the u-th first control signal comprises:

based on u>1, controlling opened/closed states of a set of first hold switches connected to the u-th first sampling capacitor based on the u-th first control signal, so that the other terminal of the u-th first sampling capacitor is connected to the device voltage VDD or the ground GND, and the one terminal of the u-th first sampling capacitor outputs the u-th second analog signal.

8. The analog-to-digital conversion circuit according to claim 5, wherein the control module outputting the (u+1)-th first control signal based on the first comparison signal of the u-th comparison comprises:

in response to the first comparison signal of the u-th comparison being 1, outputting the (u+1)-th first control signal to connect the other terminal of the (u+1)-th first sampling capacitor in the i-th sampling and conversion module to the ground GND in the (u+1)-th analog-to-digital conversion, and in response to the first comparison signal of the u-th comparison being 0, outputting the (u+1)-th first control signal to connect the other terminal of the (u+1)-th first sampling capacitor in the i-th sampling and conversion module to the device voltage VDD in the (u+1)-th analog-to-digital conversion.

9. The analog-to-digital conversion circuit according to claim 5, wherein the control module outputting the first digital signal corresponding to the first analog signal of the i-th channel based on the first comparison signal of the U-th comparison comprises:

calculating a weighted sum of the first comparison signals of the U comparisons based on weighted values of the U first sampling capacitors in the i-th sampling and conversion module, to obtain the first digital signal corresponding to the first analog signal of the i-th channel.

10. The analog-to-digital conversion circuit according to claim 5, wherein the analog-to-digital conversion circuit further comprises a shared conversion module configured to convert quantized margin signals of the first analog signals of N channels, the shared conversion module includes V first shared capacitors connected in parallel, V sets of first shared switches, and a second conversion switch, and the shared conversion module is connected respectively to the N sampling and conversion modules and the comparator through the second conversion switch, wherein V is an integer greater than or equal to 1, wherein the control module is further configured to control the second conversion switch to open during a first U times of analog-to-digital conversions in the i-th conversion cycle of the analog-to-digital conversion phase, and control the second conversion switch to close after the U-th analog-to-digital conversion is completed, and the control module outputs a $1^{st}$ second control signal based on the first comparison signal of the U-th comparison, taking the U-th second analog signal as a quantized margin signal, the analog-to-digital conversion circuit performs V analog-to-digital conversions on the quantized margin signal in a successive approximation manner.

11. The analog-to-digital conversion circuit according to claim 10, wherein a second control signal is output at a third output terminal of the control module, for the (U+v)-th analog-to-digital conversion of the i-th conversion cycle, the shared conversion module outputs the (U+v)-th second analog signal based on the quantized margin signal and a v-th second control signal, wherein $1 \leq v \leq V$ and v is an integer, the comparator compares the (U+v)-th second analog signal with the reference signal to output a first comparison signal of the (U+v)-th comparison, based on v<V, the control module outputs the (v+1)-th second control signal based on the first comparison signal of the (U+v)-th comparison, and based on v=V, the control module outputs the first digital signal corresponding to the first analog signal of the i-th channel based on the first comparison signal of the (U+V)-th comparison.

12. The analog-to-digital conversion circuit according to claim 11, wherein one terminal of each of the first shared capacitors of the shared conversion module is connected to the second conversion switch, the other terminal of the each of the capacitors is connected to one terminal of a set of first shared switches, and the other terminal of the set of first shared switches is respectively connected to one of the device voltage VDD, the ground GND, or a preset DC voltage, wherein the shared conversion module outputting the (U+v)-th second analog signal based on the quantized margin signal and the v-th second control signal comprises:

controlling opened/closed states of a set of first shared switches connected to a v-th first shared capacitor based on the v-th second control signal, so that the other terminal of the v-th first shared capacitor is connected to the device voltage VDD or the ground GND, and the (U+v)-th second analog signal is output at one terminal of a v-th first shared capacitor.

13. The analog-to-digital conversion circuit according to claim 12, wherein the control module outputting the (v+1)-th second control signal based on the first comparison signal of the (U+v)-th comparison comprises:

in response to the first comparison signal of the (U+v)-th comparison being 1, outputting the (v+1)-th second control signal, so that the other terminal of the (v+1)-th first shared capacitor in the shared conversion module is connected to the ground GND in the (U+v+1)-th analog-to-digital conversion, and in response to the first comparison signal of the (U+v)-th comparison being 0, outputting the (v+1)-th second control signal, so that the other terminal of the (v+1)-th first shared capacitor in the shared conversion module is connected to the device voltage VDD in the (U+v+1)-th analog-to-digital conversion.

14. The analog-to-digital conversion circuit according to claim 11, wherein the control module outputting the first digital signal corresponding to the first analog signal of the i-th channel based on the first comparison signal of the (U+V)-th comparison comprises:
    calculating a weighted sum of the first comparison signals of the (U+V) comparisons based on weighted values of the U first sampling capacitors in the i-th sampling and conversion module and weighted values of the V first shared capacitors in the shared conversion module, to obtain the first digital signal corresponding to the first analog signal of the i-th channel.

15. The analog-to-digital conversion circuit of claim 10, wherein the control module is further configured to:
    at an end of the i-th conversion cycle of the analog-to-digital conversion phase, control opened/closed states of the V sets of first shared switches and the second conversion switch in the shared conversion module to clear charge values on the V first shared capacitors.

16. The analog-to-digital conversion circuit according to claim 10, wherein the analog-to-digital conversion circuit further comprises a shared conversion module configured to convert quantized margin signals of the first analog signals of N channels,
    the shared conversion module includes V first shared capacitors and V sets of first shared switches, and the shared conversion module is connected to the N sampling and conversion modules and the comparator, respectively, wherein V is an integer greater than or equal to 1,
    wherein the control module is further configured to:
    take the U-th second analog signal as a quantized margin signal; and
    during the (U+1)-th to (U+V)-th analog-to-digital conversions in the i-th conversion cycle of the analog-to-digital conversion phase, control opened/closed states of the V sets of first shared switch in the shared conversion module to perform V analog-to-digital conversions on the quantized margin signal of the i-th channel in a successive approximation manner.

17. The analog-to-digital conversion circuit according to claim 16, wherein a second control signal is output at a third output terminal of the control module,
    at an end of the U-th analog-to-digital conversion of the i-th conversion cycle, the i-th sampling and conversion module outputs the U-th second analog signal,
    the shared conversion module charges the V first shared capacitors based on the U-th second analog signal,
    the comparator outputs the U-th first comparison signal, and
    the control module outputs the $1^{st}$ second control signal based on the U-th first comparison signal.

18. The analog-to-digital conversion circuit according to claim 17, wherein
    for the (U+v)-th analog-to-digital conversion of the i-th conversion cycle, the shared conversion module outputs the (U+v)-th second analog signal based on the quantized margin signal and a v-th second control signal, wherein $1 \leq v \leq V$ and v is an integer,
    the comparator compares the (U+v)-th second analog signal with the reference signal to output a first comparison signal of the (U+v)-th comparison,
    based on v<V, the control module outputs the (v+1)-th second control signal based on the first comparison signal of the (U+v)-th comparison, and
    based on v=V, the control module outputs the first digital signal corresponding to the first analog signal of the i-th channel based on the first comparison signal of the (U+V)-th comparison.

19. The analog-to-digital conversion circuit of claim 3, wherein the control module is further configured to:
    at an end of the i-th conversion cycle of the analog-to-digital conversion phase, control opened/closed states of the U sets of first hold switches and the first conversion switch of the i-th sampling and conversion module, to clear charge values on the U first sampling capacitors of the i-th sampling and conversion module.

20. The analog-to-digital conversion circuit according to claim 2, wherein in response to the first analog signals of N channels including differential signals, each of the sampling and conversion modules comprises a positive sampling and conversion unit and a negative sampling and conversion unit, the positive sampling and conversion unit including U second sampling capacitors connected in parallel, U sets of second hold switches, and a third conversion switch, and the negative sampling and conversion unit including U third sampling capacitors connected in parallel, U sets of third hold switches, and a fourth conversion switches, wherein U is an integer greater than or equal to 1,
    a positive first analog signal of a channel corresponding to the positive sampling and conversion unit is input at a first input terminal of the positive sampling and conversion unit, a positive first control signal is input at a second input terminal thereof, and a positive second analog signal is output to the comparator in response to the third conversion switch being closed,
    a negative first analog signal of a channel correspond to the negative sampling and conversion unit is input at a first input terminal of the negative sampling and conversion unit, a negative first control signal is input at a second input terminal thereof, and a negative second analog signal is output to the comparator in response to the fourth conversion switch being closed,
    a positive second analog signal is input at a first input terminal of the comparator, a negative second analog signal is input at a second input terminal thereof, and a second comparison signal is output at an output terminal thereof,
    the second comparison signal is input at an input terminal of the control module, a converted second digital signal is output at a first output terminal thereof, a positive first control signal is output at a second output terminal thereof, and a negative first control signal is output at a third output terminal thereof,
    wherein one terminal of each of the second sampling capacitors in the positive sampling and conversion unit is connected to the third conversion switch, the other terminal thereof is connected to one terminal of a set of second hold switches, and the other terminal of the set of second hold switches is respectively connected to one of the positive first analog signal, a device voltage VDD, a ground GND, or a preset DC voltage, and
    one terminal of each of the third sampling capacitors in the negative sampling and conversion unit is connected to the fourth conversion switch, the other terminal thereof is connected to one terminal of a set of third hold switches, the other terminal of the set of third hold switches is connected to one of the negative first analog signal, the device voltage VDD, the ground GND, or the preset DC voltage, respectively.

21. The analog-to-digital conversion circuit according to claim 20, wherein said controlling the N sampling and conversion modules to simultaneously sample and hold the input first analog signals of N channels in the sample-and-hold phase comprises:

controlling the third conversion switches of the N positive sampling and conversion units and the fourth conversion switches of the N negative sampling and conversion unit to open;

controlling opened/closed states of U sets of second conversion switches in each of the positive sampling and conversion units, so that the other terminal of the U second sampling capacitors in the positive sampling and conversion unit is connected to the corresponding positive first analog signal; and controlling opened/closed states of the U sets of third conversion switches in each of the negative sampling and conversion units, so that the other terminal of the U second sampling capacitors in the negative sampling and conversion unit is connected to the corresponding negative first analog signal.

22. The analog-to-digital conversion circuit according to claim 20, wherein in the i-th conversion cycle of the analog-to-digital conversion phase, the third conversion switch of the i-th positive sampling and conversion unit and the fourth conversion switch of the i-th negative sampling and conversion unit are closed, and the analog-to-digital conversion circuit performs U analog-to-digital conversions on the first analog signal of the i-th channel in a successive approximation manner, for the u-th analog-to-digital conversion of the i-th conversion cycle, the i-th positive sampling and conversion unit outputs the u-th positive second analog signal based on the positive first analog signal of the i-th channel and the u-th positive first control signal, wherein $1 \leq u \leq U$ and u is an integer, the i-th negative sampling and conversion unit outputs the u-th negative second analog signal based on the negative first analog signal of the i-th channel and the u-th negative first control signal, the comparator compares the u-th positive second analog signal with the u-th negative second analog signal to output a second comparison signal of the u-th comparison, based on u<U, the control module outputs the (u+1)-th positive first control signal and the (u+1)-th negative first control signal based on the second comparison signal of the u-th comparison, and based on u=U, the control module outputs a second digital signal corresponding to the first analog signal of the i-th channel based on the second comparison signals of U comparisons.

23. The analog-to-digital conversion circuit according to claim 22, wherein the analog-to-digital conversion circuit further comprises a shared conversion module configured to convert quantized margin signals of the first analog signals of N channels, the shared conversion module includes a positive shared conversion unit and a negative shared conversion unit, the positive shared conversion unit including V second shared capacitors connected in parallel, V sets of second shared switches, and a fifth conversion switch, and the negative shared conversion unit including V third shared capacitors connected in parallel, V sets of third shared switches, and a sixth conversion switch, wherein V is an integer greater than or equal to 1, the positive shared conversion unit is respectively connected to the N positive sampling and conversion units and the first input terminal of the comparator through the fifth conversion switch, and the negative shared conversion unit is respectively connected to the N negative sampling and conversion units and the second input terminal of the comparator through the sixth conversion switch, wherein the control module is further configured to:

control the fifth conversion switch and the sixth conversion switch to open during the first U analog-to-digital conversions in the i-th conversion cycle of the analog-to-digital conversion phase; and control the fifth conversion switch and the sixth conversion switch to close after the U-th analog-to-digital conversion is completed; and the control module outputs the $1^{st}$ positive second control signal and the $1^{st}$ negative second control signal based on the second comparison signals of the U comparisons; and take the U-th positive second analog signal as a positive quantized margin signal and take the U-th negative second analog signal as a negative quantized margin signal, the analog-to-digital conversion circuit performs V analog-to-digital conversions on the positive quantized margin signal and the negative quantized margin signal in a successive approximation manner.

24. The analog-to-digital conversion circuit according to claim 23, wherein for the (U+v)-th analog-to-digital conversion of the i-th conversion cycle, the positive shared conversion unit outputs the (U+v)-th positive second analog signal based on the positive quantized margin signal and the v-th positive second control signal, wherein $1 \leq v \leq V$ and v is an integer, the negative shared conversion unit outputs the (U+v)-th negative second analog signal based on the negative quantized margin signal and the v-th negative second control signal, the comparator compares the (U+v)-th positive second analog signal with the (U+v)-th negative second analog signal to output a second comparison signal of the (U+v)-th comparison, based on v<V, the control module outputs a (v+1)-th positive second control signal and a (v+1)-th negative second control signal based on the second comparison signal of the (U+v)-th comparison, and based on v=V, the control module outputs the second digital signal corresponding to the first analog signal of the i-th channel based on the second comparison signal of the (U+v)-th comparison.

25. The analog-to-digital conversion circuit according to claim 22, wherein the analog-to-digital conversion circuit further comprises a shared conversion module configured to convert quantized margin signals of the first analog signals of N channels, the shared conversion module includes a positive shared conversion unit and a negative shared conversion unit, the positive shared conversion unit including V second shared capacitors connected in parallel and V sets of second shared switches, and the negative shared conversion unit including V third shared capacitors connected in parallel and V sets of third shared switches, wherein V is an integer greater than or equal to 1, the positive shared conversion unit is connected to the N positive sampling and conversion units and the first input terminal of the comparator respectively, and the negative shared conversion unit is connected to the N negative sampling and conversion units and the second input terminal of the comparator respectively, wherein the control module is further configured to:

output the 1st positive second control signal and the 1st negative second control signal based on the second comparison signals of the U comparisons after the U-th analog-to-digital conversion is completed;

the positive shared conversion unit takes the U-th positive second analog signal as a positive quantized margin signal, and the negative shared conversion unit takes the U-th negative second analog signal as a negative quantized margin signal; and during the (U+1)-th to (U+V)-th analog-to-digital conversions in the i-th conversion cycle of the analog-to-digital conversion phase, output a second control signal to control opened/closed states of the V sets of second shared switches in the positive shared conversion unit and the V sets of third shared switches in the negative shared conversion unit, to perform V analog-to-digital conversions on the positive quantized margin signal and the negative quantized margin signal in a successive approximation manner.

26. The analog-to-digital conversion circuit according to claim 25, wherein for the (U+v)-th analog-to-digital conversion of the i-th conversion cycle, the positive shared conversion unit outputs the (U+v)-th positive second analog signal based on the positive quantized margin signal and the v-th positive second control signal, wherein $1 \leq v \leq V$ and v is an integer, the negative shared conversion unit outputs the (U+v)-th negative second analog signal based on the negative quantized margin signal and the v-th negative second control signal, the comparator compares the (U+v)-th positive second analog signal with the (U+v)-th negative second analog signal to output a second comparison signal of the (U+v)-th comparison, based on $v<V$, the control module outputs a (v+1)-th positive second control signal and a (v+1)-th negative second control signal based on the second comparison signal of the (U+v)-th comparison, and based on $v=V$, the control module outputs the second digital signal corresponding to the first analog signal of the i-th channel based on the second comparison signal of the (U+v)-th comparison.

27. The analog-to-digital conversion circuit according to claim 1, wherein the first analog signals of N channels include single-ended signals or differential signals.

28. An analog-to-digital conversion circuit comprising:

N sampling and conversion modules connected in parallel, configured to simultaneously sample and sequentially convert first analog signals of N channels to output second analog signals, wherein each of the sampling and conversion modules includes a plurality of sampling capacitors connected in parallel, wherein N is an integer greater than 1;

a comparator connected to the N sampling and conversion modules, configured to compare the second analog signals respectively to obtain comparison signals; and a control module connected to the N sampling and conversion modules and the comparator, configured to control the N sampling and conversion modules to output converted digital signals based on the comparison signals; wherein the analog-to-digital conversion circuit further comprises a shared conversion module including a plurality of shared capacitors connected in parallel, the module being configured to convert quantized margin signals of the first analog signals of the N channels.

* * * * *